US009355719B2

(12) United States Patent
Miura et al.

(10) Patent No.: US 9,355,719 B2
(45) Date of Patent: May 31, 2016

(54) SEMICONDUCTOR DEVICE

(75) Inventors: Seiji Miura, Tokyo (JP); Hiroshi Uchigaito, Tokyo (JP); Kenzo Kurotsuchi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/415,706

(22) PCT Filed: Jul. 19, 2012

(86) PCT No.: PCT/JP2012/068368
§ 371 (c)(1),
(2), (4) Date: Mar. 19, 2015

(87) PCT Pub. No.: WO2014/013595
PCT Pub. Date: Jan. 23, 2014

(65) Prior Publication Data
US 2015/0213889 A1 Jul. 30, 2015

(51) Int. Cl.
*G11C 8/00* (2006.01)
*G11C 13/00* (2006.01)
(Continued)

(52) U.S. Cl.
CPC ........ *G11C 13/0069* (2013.01); *G06F 12/0246* (2013.01); *G11C 13/0004* (2013.01);
(Continued)

(58) Field of Classification Search
CPC .......... G11C 13/0069; G11C 13/0004; G11C 13/004; G11C 13/0061; G11C 16/0483; G11C 29/24; G11C 2029/0411; G11C 2213/72; G11C 2213/74; G11C 2213/75; G06F 12/0246; G06F 2212/1008

USPC ............... 365/163, 189.011, 189.16, 230.01, 365/230.03, 230.04, 230.06, 230.09, 365/233.16, 239
See application file for complete search history.

(56) References Cited

U.S. PATENT DOCUMENTS 6,539,453 B1   3/2003  Guterman
8,891,298 B2*  11/2014 Rao ................... G11C 16/3495
                                                         365/148
(Continued)

FOREIGN PATENT DOCUMENTS

JP     7-153285 A    6/1995
JP   2004-240572 A   8/2004
(Continued)

OTHER PUBLICATIONS

Lee, et al., "A 90nm 1.8V 512Mb Diode Switch PRAM with 266MB/s Read Throughput", IEEE International Solid-State Circuits Conference, Digest of Technical Papers, USA, 2007, pp. 472-473.
(Continued)

*Primary Examiner* — Fernando Hidalgo
(74) *Attorney, Agent, or Firm* — Miles & Stockbridge P.C.

(57) ABSTRACT

A semiconductor device including a nonvolatile memory cell realizes enhancement of reliability and convenience. The semiconductor device includes a nonvolatile memory unit that includes plural overwritable memory cells (CL), and a control circuit that controls access to the nonvolatile memory unit. The control circuit allocates one physical address to a chain memory array CY in the nonvolatile memory unit, for example. The control circuit performs writing to a memory cell (for example, CL0) that is apart of the chain memory array CY according to a first write command with respect to the physical address, and performs writing to a memory cell (for example, CL1) that is another part thereof according to a second write command with respect to the physical address.

15 Claims, 37 Drawing Sheets

(51) Int. Cl.
*G06F 12/02* (2006.01)
*G11C 29/24* (2006.01)
*G11C 29/04* (2006.01)
*G11C 16/04* (2006.01)

(52) U.S. Cl.
CPC .......... *G11C13/004* (2013.01); *G11C 13/0061* (2013.01); *G06F 2212/1008* (2013.01); *G11C 16/0483* (2013.01); *G11C 29/24* (2013.01); *G11C 2029/0411* (2013.01); *G11C 2213/72* (2013.01); *G11C 2213/74* (2013.01); *G11C 2213/75* (2013.01)

(56) References Cited

U.S. PATENT DOCUMENTS

| | | |
|---|---|---|
| 2004/0151031 A1 | 8/2004 | Tanaka |
| 2011/0164444 A1 | 7/2011 | Fukano |
| 2013/0141968 A1 | 6/2013 | Sasago et al. |

FOREIGN PATENT DOCUMENTS

| | | |
|---|---|---|
| JP | 3926985 B2 | 6/2007 |
| JP | 2008-146255 A | 6/2008 |
| JP | 2011-142186 A | 7/2011 |
| WO | WO 2011/074545 A1 | 6/2011 |
| WO | WO 2011/114503 A1 | 9/2011 |
| WO | WO 2012/032730 A1 | 3/2012 |

OTHER PUBLICATIONS

Lai, et al., "OUM—A 180 nm Nonvolatile Memory Cell Element Technology for Stand Alone and Embedded Applications", IEEE International Electron Devices Meeting, Technical Digest, USA, 2001, pp. 803-806.

Cho, et al., A 0.18μm 3.0-V 64-Mb Nonvolatile Phase-Transition Random Access Memory (PRAM), IEEE Journal of Solid-State Circuits, vol. 40, No. 1, USA, 2005, pp. 293-300.

* cited by examiner

FIG. 9

| PADTBL | | | | | |
|---|---|---|---|---|---|
| PAD[31:0] | | PVLD | PERC | LYM | LYC |
| PAD [31:16] (SGAD) | PAD [15:0] (PPAD) | 0:invalid 1:valid | (Erase count) | (Layer mode) | (Layer count) |
| 0000 | 0000 | 0 | 400 | 1 | 0 |
| ⋮ | 0001 | 1 | 100 | 1 | 0 |
| | 0002 | 0 | 300 | 1 | 0 |
| | ⋮ | ⋮ | ⋮ | ⋮ | ⋮ |
| 0000 | FFFF | 0 | 200 | 1 | 0 |
| 0001 | 0000 | 0 | 10 | 1 | 1 |
| ⋮ | 0001 | 0 | 20 | 1 | 1 |
| | ⋮ | ⋮ | ⋮ | ⋮ | ⋮ |
| 0001 | FFFF | 0 | 100 | 1 | 1 |
| ⋮ | ⋮ | ⋮ | ⋮ | ⋮ | ⋮ |
| 027F | 0000 | 0 | 200 | 1 | 2 |
| ⋮ | 0001 | 1 | 150 | 1 | 2 |
| | ⋮ | ⋮ | ⋮ | ⋮ | ⋮ |
| 027F | FFFF | 0 | 200 | 1 | 2 |
| 0280 | 0000 | 0 | 210 | 0 | 0 |
| ⋮ | 0001 | 1 | 100 | 0 | 0 |
| | ⋮ | ⋮ | ⋮ | ⋮ | ⋮ |
| 0280 | FFFF | 0 | 210 | 0 | 0 |
| ⋮ | ⋮ | ⋮ | ⋮ | ⋮ | ⋮ |
| 07FF | 0000 | 0 | 30 | 0 | 0 |
| ⋮ | 0001 | 0 | 20 | 0 | 0 |
| | ⋮ | ⋮ | ⋮ | ⋮ | ⋮ |
| 07FF | FFFF | 0 | 10 | 0 | 0 |

PRNG1 spans from 0000 through 027F. PRNG2 spans from 0280 through 07FF.

FIG. 10A

| PSEGTBL1 (RELATING TO IPA) | | | | | |
|---|---|---|---|---|---|
| SGAD | TNIPA | MXIPAD | MXERC | MNIPAD | MNERC |
| 0 | 1000 | 255 | 150 | 81 | 120 |
| 1 | 3333 | 511 | 110 | 256 | 180 |
| 2 | 4444 | 63 | 160 | 32 | 130 |
| ⋮ | ⋮ | ⋮ | ⋮ | ⋮ | ⋮ |
| 2047 | 500 | 1023 | 120 | 512 | 90 |

FIG. 10B

| PSEGTBL2 (RELATING TO VPA) | | | | | |
|---|---|---|---|---|---|
| SGAD | TNVPA | MXVPAD | MXERC | MNVPAD | MNERC |
| 0 | N-1000 | 1000 | 50 | 1011 | 40 |
| 1 | N-3333 | 2000 | 10 | 2033 | 1 |
| 2 | N-4444 | 600 | 80 | 622 | 70 |
| ⋮ | ⋮ | ⋮ | ⋮ | ⋮ | ⋮ |
| 2047 | N-500 | 6000 | 30 | 6055 | 20 |

FIG. 11A

NXPADTBL

| ENUM | NXPAD [31:0] | NXPVLD 0:invalid 1:valid | NXPERC | NXLYM | NXLYC |
|---|---|---|---|---|---|
| 0 | 00000000 | 0 | 0 | 1 | 0 |
| 1 | 00000001 | 0 | 0 | 1 | 0 |
| ... | ... | ... | ... | ... | ... |
| (N/2)−1 | 0000000F | 0 | 0 | 1 | 0 |
| N/2 | 02800000 | 0 | 0 | 0 | 0 |
| ... | ... | ... | ... | ... | ... |
| N−2 | 0280000E | 0 | 0 | 0 | 0 |
| N−1 | 0280000F | 0 | 0 | 0 | 0 |

Rows 0 through (N/2)−1: NXPADTBL1
Rows N/2 through N−1: NXPADTBL2

FIG. 11B

NXPADTBL

| ENUM | NXPAD[31:0] | NXPVLD 0:invalid 1:valid | NXPERC | NXLYM | NXLYC | |
|---|---|---|---|---|---|---|
| 0 | 01000000 | 0 | 100 | 1 | 0 | ⎫ |
| 1 | 01000011 | 0 | 101 | 1 | 3 | ⎬ NXPADTBL1 |
| ... | ... | ... | ... | ... | ... | |
| (N/2)−1 | 01000378 | 0 | 110 | 1 | 4 | ⎭ |
| N/2 | 02900000 | 0 | 100 | 0 | 0 | ⎫ |
| ... | ... | ... | ... | ... | ... | ⎬ NXPADTBL2 |
| N−2 | 02900022 | 0 | 110 | 0 | 0 | |
| N−1 | 02900420 | 0 | 112 | 0 | 0 | ⎭ |

FIG. 12A

| LPTBL | | | |
|---|---|---|---|
| LAD | PAD | CPVLD | LYC |
| 0 | 0 | 0 | 0 |
| 1 | 0 | 0 | 0 |
| 2 | 0 | 0 | 0 |
| ⋮ | ⋮ | ⋮ | ⋮ |
| 5 | 0 | 0 | 0 |
| ⋮ | ⋮ | ⋮ | ⋮ |
| 037F_FFFF | 0 | 0 | 0 |

0: invalid
1: valid

FIG. 12B

NVM{NVM10~NVM17}

| PAD | DATA | LAD | DVF | LYC |
|---|---|---|---|---|
| 0 | 0 | 0 | 0 | 0 |
| 1 | 0 | 0 | 0 | 0 |
| 2 | 0 | 0 | 0 | 0 |
| 3 | 0 | 0 | 0 | 0 |
| ⋮ | ⋮ | ⋮ | ⋮ | ⋮ |
| 9 | 0 | 0 | 0 | 0 |
| ⋮ | ⋮ | ⋮ | ⋮ | ⋮ |
| 0000_FFFF | 0 | 0 | 0 | 0 |
| 1_0000 | 0 | 0 | 0 | 0 |
| ⋮ | ⋮ | ⋮ | ⋮ | ⋮ |
| 07FF_FFFF | 0 | 0 | 0 | 0 |

FIG. 13A

CASE1

| LRNG | CAP | CHN CELL | TEST MODE | NVM MODE | ERS SIZE | PRG SIZE | TEST CELL | ECC FLG | WRT FLG |
|---|---|---|---|---|---|---|---|---|---|
| LRNG1: 0000_0000 ~ 007F_FFFF | 4GB | 18 | 1 | 0 | 512 | 512 | 5 | 0 | 0 |
| LRNG2: 0080_0000 ~ 03FF_FFFF | 32GB | 88 | 1 | 0 | 512 | 512 | 5 | 0 | 0 |

FIG. 13B

CASE2

| LRNG | CAP | CHN CELL | TEST MODE | NVM MODE | ERS SIZE | PRG SIZE | TEST CELL | ECC FLG | WRT FLG |
|---|---|---|---|---|---|---|---|---|---|
| LRNG1: 0000_0000 ~ 007F_FFFF | 4GB | 18 | 1 | 0 | 512 | 512 | 5 | 0 | 0 |
| LRNG2: 0080_0000 ~ 03FF_FFFF | 32GB | 88 | 1 | 0 | 512 | 512 | 5 | 0 | 1 |

FIG. 13C

CASE3

| LRNG | CAP | CHN CELL | TEST MODE | NVM MODE | ERS SIZE | PRG SIZE | TEST CELL | ECC FLG | WRT FLG |
|---|---|---|---|---|---|---|---|---|---|
| LRNG1: 0000_0000 ~ 007F_FFFF | 4GB | 28 | 0 | 0 | 512 | 512 | 0 | 0 | 1 |
| LRNG2: 0080_0000 ~ 03FF_FFFF | 32GB | 88 | 0 | 1 | 512* 1024 | 4096 | 0 | 0 | 0 |

FIG. 14A
PGDAT
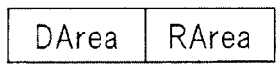
DArea
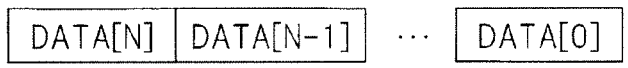
RArea
FIG. 14B
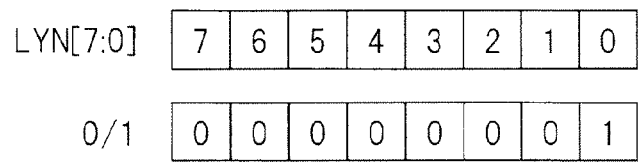
FIG. 14C
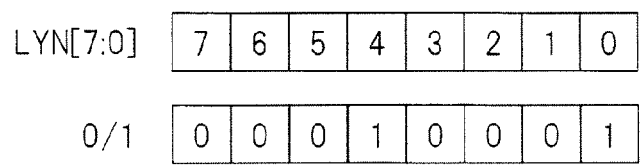

SEMICONDUCTOR DEVICE

TECHNICAL FIELD

The present invention relates to a semiconductor device, and for example, a technique of a semiconductor device including a nonvolatile memory device.

BACKGROUND ART

Recently, a solid state drive (SSD) configured to have plural NAND-type flash memories and a controller has been used for a server apparatus, a laptop PC, a net-book and the like. As the NAND-type flash memory, a memory having an upper limit in an erase count, in which a data write size and a data erase size are markedly different is widely known. Patent Literatures 1, 2, 3, and 4 disclose a control method of such an NAND-type flash memory. For example, Patent Literature 1 discloses a technique in which a write pointer that sequentially sets a write address while circulating through addresses of the flash memory in a predefined order is provided and wear leveling is performed using a correspondence relationship between the write pointer and a logical address or a circulation count of the write pointer. Further, Patent Literature 5 discloses a NAND-type flash memory of a three-dimensional structure.

In addition, as a technique reviewed by the inventors, there is a semiconductor device including a phase change memory, for example. Such a memory uses a chalcogenide material (or phase change material) such as a Ge—Sb—Te system including at least antimony (Sb) and tellurium (Te) or an Ag—In—Sb—Te system as a material of a recording layer. Further, a diode is used as a selection element thereof. Characteristics of such a phase change memory that uses the chalcogenide material and the diode are disclosed in Non-Patent Literature 1, for example.

FIG. 29 is a diagram illustrating a relationship between a pulse width and a temperature necessary for phase change of a resistance storage element using a phase change material. A vertical axis represents temperature, and a horizontal axis represents time. When storage information "0" is written to a storage element, as shown in FIG. 29, a reset pulse for heating the element at a melting point Ta of the chalcogenide material or higher and then cooling the element is applied. By shortening cooling time t1 (for example, by setting cooling time t1 to about 1 ns), the chalcogenide material is in a high resistance amorphous state.

In contrast, when storage information "1" is written, a set pulse for maintaining the storage element in a temperature area that is lower than the melting point Ta but is higher than a crystallization temperature Tx (which is equal to or higher than a glass transition point) is applied. Thus, the chalcogenide material is in a low resistance polycrystalline state. Time t2 necessary for crystallization varies according to the composition of the chalcogenide material. The temperature of the element shown in FIG. 29 depends on Joule heat emitted by the storage element itself and thermal diffusion to the surroundings.

Further, as disclosed in Non-Patent Literature 2, if the phase change memory has a small resistance element structure, power necessary for state change of a phase change film is reduced. Thus, the phase change memory is in principle suitable to miniaturization, prompting research to be actively conducted. Further, Non-Patent Literature 3 discloses a phase change memory in which a time of about 120 ns is necessary for decrease of resistance of the chalcogenide material and a time of about 50 ns is necessary for increase of the resistance.

Furthermore, Patent Literatures 6 and 7 disclose a nonvolatile memory of a three-dimensional structure. Patent Literature 6 discloses a configuration in which memory cells that are provided with a variable resistance element and a transistor connected in parallel to the variable resistance element are connected in series in a stacked direction. Patent Literature 7 discloses a configuration in which memory cells that are provided with a variable resistance element and a diode connected in series to the variable resistance element are connected in series in a stacked direction with a conductive line being interposed therebetween. In this configuration, for example, by assigning a potential difference between a conductive line between two memory cells and two conductive lines outside the two memory cells, a writing operation is collectively performed with respect to two memory cells.

CITATION LIST

Patent Literature

[PTL 1] JP-A-2008-146255
[PTL 2] JP-A-07-153285
[PTL 3] Japanese Patent No. 3926985
[PTL 4] JP-A-2004-240572
[PTL 5] Pamphlet of International Publication No. 2011/114503
[PTL 6] Pamphlet of International Publication No. 2011/074545
[PTL 7] JP-A-2011-142186

Non-Patent Literature

[NPL 1] IEEE International Solid-State Circuits Conference, Digest of Technical Papers, USA, 2007, pp. 472-473
[NPL 2] IEEE international Electron Devices meeting, TECHNICAL DIGEST, USA, 2001, pp. 803-806
[NPL 3] IEEE JOURNAL OF SOLID-STATE CIRCUIT, VOL. 40, No. 1, USA, 2005, pp. 293-300

SUMMARY OF INVENTION

Technical Problem

The inventors studied a control method of a NAND-type flash memory used for a storage device such as a solid state drive (SSD) or a memory card before this application. Further, the inventors studied characteristics of a resistance value of a phase change memory using a recording layer formed of a chalcogenide material and a diode. Hereinafter, the content of the study will be described.

<<Study for Control Method of NAND-Type Flash Memory>>

For example, a 4 Gbit NAND-type flash memory is configured to have a page formed of (2111=2048+64) bytes, a block (135168=131072+4096 bytes) formed of 64 pages, and a chip formed of 4096 blocks. An SSD is configured to have plural NAND-type flash memories, and a controller that controls the flash memories. A host controller and the SSD are connected to each other by a serial advanced technology attachment (SATA) interface, for example.

A writing operation when a data write command corresponding to 1 page is generated from the host controller to the SSD will be described. Data writing to the NAND-type flash memory is performed in a page unit, and is executed by the following procedure. First, the controller reads 1 block of data (135168 bytes) from the NAND-type flash memory. Then, data in a memory area where the 1 block of data (135168 bytes) is stored is erased. Thereafter, the controller newly writes 1 page of data (2112 bytes) into the memory area.

Here, the NAND-type flash memory has a maximum erasable count (ERASEmax). If an erase count exceeds the maximum erasable count (ERASEmax), the data stored in the NAND-type flash memory is not guaranteed, which means that a service life of the SSD expires. Accordingly, in order to lengthen the service life of the SSD, it is necessary to provide a data erase method with high efficiency.

However, the NAND-type flash memory is configured so that the data write unit and the data erase unit are markedly different from each other. In the NAND-type flash memory, when writing data (2112 bytes) corresponding to 1 page, it is necessary to erase 64 times of a data size (135168 bytes). That is, the data erase method is extremely inefficient. As a result, in the SSD using the NAND-type flash memory, the service life is easily reduced. Thus, for example, as disclosed in Patent Literature 1 to Patent Literature 4, various techniques for the enhancement of the service life are known, but in these cases, an effective write time may increase due to the complexity of control.

As described above, in the SSD using the NAND-type flash memory, the writing speed or the erasing speed of the NAND-type flash memory is low, and also, overhead due to such a complex control is applied, and thus, it is not easy to compatibly achieve prolonging of the service life and an increase of the speed. Further, when writing data (2112 bytes) corresponding to 1 page, it is necessary to read data corresponding to 1 block before erasing data (135168 bytes) corresponding to 1 block, and thus, the writing performance further deteriorates.

<<Study about Control Method of Resistance Change Nonvolatile Memory>>

As a resistance change memory, a phase change memory, a resistive random access memory (ReRAM) or the like has been proposed. With such a resistance change memory, it is possible to extremely improve the writing speed compared with a case where the NAND-type flash memory is used. Further, the resistance change memory is capable of data rewriting, and has a minimum unit of 1 byte. That is, it is possible to perform rewriting of only a necessary data size. Here, such a memory has an upper limit value in a write count, and on the basis of the upper limit value, the service life of the resistance change memory is determined. Thus, for example, if writing is concentrated on a specific memory cell, the service life may be reduced.

On the other hand, demanded performance (speed, service life, and capacity) for the nonvolatile memory may vary according to a system that uses the nonvolatile memory. As described above, in the resistance change memory, since the writing speed is fast and the minimum unit of rewriting is small compared with the NAND-type flash memory, a control method for securing performance such as speed, service life and capacity with an excellent balance using these characteristics is necessary.

Further, for example, as described in FIG. 29, the writing to the phase change memory is performed by controlling Joule heat generated by electric current to control a resistance value of the memory cell. Here, variations may occur in the resistance values after the rewriting operation due to a difference of electrical characteristics of the memory cells generated due to a thermal history due to the Joule heat. Specifically, for example, Joule heat generated in a certain memory cell may affect peripheral memory cells to cause variations in resistance values of the peripheral memory cells. In addition, the amount of variation of the resistance values of the memory cells may be changed depending on whether writing information or storage information on the peripheral memory cells is in a set state or in a reset state. For example, when a simple writing method as disclosed in Patent Literature 7 is used, such a problem of variation may occur, and thus, it is necessary to realize a control method for securing appropriate adjustment of the writing method and the above-described demanded performance of the nonvolatile memory.

The invention is made in consideration of these problems, and the above and other objects, and novel features of the invention will become apparent from the following description and accompanying drawings.

Solution to Problem

An outline of a representative embodiment of the invention will be described as follows.

A semiconductor according to an embodiment of the invention includes a nonvolatile memory unit that includes a plurality of memory cells and a control circuit that allocates a physical address to a logical address input from the outside to perform access to the physical address of the nonvolatile memory unit. The nonvolatile memory unit includes a plurality of first signal lines, a plurality of second signal lines that intersect the plurality of first signal lines, and a plurality of memory cell groups disposed at intersections of the plurality of first signal lines and the plurality of the second signal lines. Each of the plurality of memory cell groups includes first to N-th (N is an integer of 2 or greater) memory cells, and first to N-th memory cell selection lines that respectively select the first to N-th memory cells. Here, the control circuit writes data to a first portion that includes M (M<N) memory cells among the first to N-th memory cells according to a first write command to a first physical address, and writes data to a second portion that includes M memory cells excluding the first portion among the first to N-th memory cells according to a second write command to the first physical address generated after the first write command.

Advantageous Effects of Invention

According to the representative embodiment of the invention, it is possible to realize enhancement of reliability or the like in a semiconductor device including nonvolatile memory cells.

BRIEF DESCRIPTION OF DRAWINGS

FIG. 9 is a diagram illustrating a configuration example of a physical address table stored in a random access memory in FIG. 1.

FIG. 10A is a diagram illustrating a configuration example of a physical segment table stored in the random access memory in FIG. 1.

FIG. 10B is a diagram illustrating another configuration example of the physical segment table stored in the random access memory in FIG. 1.

FIG. 11A is a diagram illustrating a configuration example of a write physical address table stored in the control circuit in FIG. 2 or the random access memory in FIG. 1.

FIG. 11B is a diagram illustrating a configuration example of a write physical address table stored in the control circuit in FIG. 2 or the random access memory in FIG. 1.

FIG. 12A is a diagram illustrating a configuration example of an address conversion table stored in the random access memory in FIG. 1 and an example of the state after initial setting.

FIG. 12B is a diagram illustrating an example of the state after initial setting in the nonvolatile memory device in FIG. 1.

FIG. 13A is a diagram illustrating an example of SSD configuration information stored in a nonvolatile memory device for booting in FIG. 1.

FIG. 13B is a diagram illustrating another example of the SSD configuration information stored in the nonvolatile memory device for booting in FIG. 1.

FIG. 13C is a diagram illustrating still another example of the SSD configuration information stored in the nonvolatile memory device for booting in FIG. 1.

FIG. 14A is a diagram illustrating a configuration example of data to be written to the nonvolatile memory device from the control circuit in a memory module in FIG. 1.

FIG. 14B is a diagram illustrating a configuration example of data writing layer information in FIG. 14A.

FIG. 14C is a diagram illustrating a configuration example of data writing layer information in FIG. 14A.

FIG. 22A is a diagram illustrating an example of a correspondence relationship of a logical address, a physical address, and an in-chip address in a nonvolatile memory device allocated to a first physical address area in FIG. 15 or the like.

FIG. 22B is a diagram illustrating an example of a correspondence relationship of a logical address, a physical address, and an in-chip address in a nonvolatile memory device allocated to a second physical address area in FIG. 15 or the like.

DESCRIPTION OF EMBODIMENTS

In the following embodiments, for ease of description, description will be made using plural divided sections or embodiments. Unless there is a particularly explicit mention, these sections or embodiments are related to each other. For example, one section or embodiment has a relationship of a modification example, an application example, a detailed description, a supplementary description or the like with a part or all of another section or embodiment. Further, in the following embodiments, when a number or the like (number, numerical value, amount, range or the like) of an element is mentioned, the number or the like of the element is not limited to the specific number, and may be a number larger or smaller than the specific number unless there is a particularly explicit mention, unless a specific number is obviously defined in principle, or in similar cases.

Further, in the following embodiments, components (including element steps or the like) are not essential unless there is a particularly explicit mention, unless the components are considered as being obviously essential in principle, or in similar cases. Similarly, in the following embodiments, when shapes, positional relationships or the like of components are mentioned, the shapes or the like include shapes or the like substantially close to or similar to the shapes or the like unless there is a particularly explicit mention, unless such various shapes or the like are obviously excluded in principle, or in similar cases. This is similarly applied to the above-mentioned number or the like (number, numerical value, amount, range or the like).

Hereinafter, the embodiments of the invention will be described in detail with reference to the accompanying drawings. In all the drawings for description of the embodiments, the same or related signs are assigned to members having the same function, and the description will not be repeated. Further, in the following embodiments, description of the same or similar parts will not be repeated in principle unless the description is particularly necessary.

In the embodiments, although not particularly limited, a circuit element that forms each block is formed on a single semiconductor substrate such as a single crystal silicon substrate using an integrated circuit technology such as a known complementary metal oxide semiconductor (CMOS) transistor. Further, as a memory cell thereof, a resistance storage element such as a phase change memory or a resistive random access memory (ReRAM) is used.

<<Outline of Information Processing System>>

Figure 1:
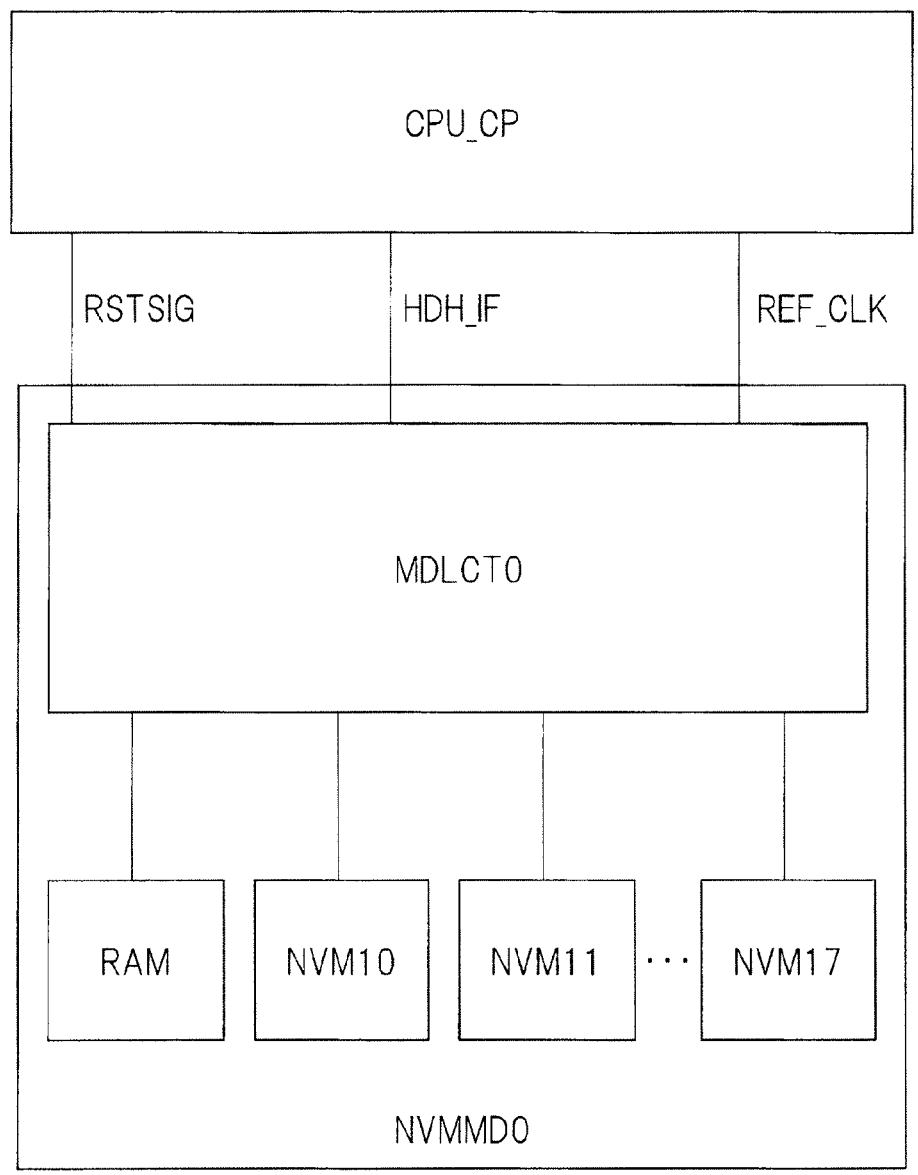
FIG. 1 is a block diagram schematically illustrating a configuration example of an information processing system to which a semiconductor device according to an embodiment of the invention is applied.

FIG. 1 is a block diagram schematically illustrating a configuration example of an information processing system to which a semiconductor device according to an embodiment of the invention is applied. The information processing system shown in FIG. 1 includes an information processor CPU_CP, and a memory module (semiconductor device) NVMMD0. The information processor CPU_CP is not particularly limited, but is a host controller that manages data stored in the memory module NVMMD0 by a logical address (LAD) of minimum 512-byte units. The information processor CPU_CP performs data reading or writing for the memory module NVMMD0 through an interface signal HDH_IF. The memory module NVMMD0 is not particularly limited, but corresponds to a solid state drive (SSD) or the like, for example.

A signaling scheme that connects the information processor CPU_CP to the memory module NVMMD0 includes a serial interface signaling scheme, a parallel interface signaling scheme, an optical interface signaling scheme, or the like. Further, other schemes may be used. A clocking scheme that operates the information processor CPU_CP and the memory module NVMMD0 includes a common clocking scheme and a source synchronous clocking scheme that use a reference clock signal REF_CLK, an embedded clocking scheme that embeds clock information in a data signal, or the like. Further, other clocking schemes may be used. In the present embodiment, it is assumed that the serial interface signal scheme and the embedded clocking scheme are used as an example. Hereinafter, an operation thereof will be described.

Clock information is embedded from the information processor CPU_CP, and a read request (RQ), a write request (WQ) or the like converted into serial data is input to the memory module NVMMD0 through the interface signal HDH_IF. The read request (RQ) includes a logical address (LAD), a data read command (RD), a sector count (SEC), and the like. Further, the write request (WQ) includes a logical address (LAD), a data write command (WRT), a sector count (SEC), write data (WDATA), and the like.

The memory module (semiconductor device) NVMMD0 includes nonvolatile memory devices NVM10 to NVM17, a random access memory RAM, and a control circuit MDLCT0 that controls the nonvolatile memory devices and the random access memory. The nonvolatile memory devices NVM10 to NVM17 have the same configuration and performance, for example. In the nonvolatile memory devices NVM10 to NVM17, data, OS, an application program, and SSD configuration information (SDCFG) are stored, and a boot program or the like of the information processor CPU_CP is also stored. The random access memory RAM is not particularly limited, but is for example, a DRAM or the like.

Immediately after power is supplied, the memory module NVMMD0 performs initialization (a so-called power-on reset) of the nonvolatile memory devices NVM10 to NVM17 inside thereof, the random access memory RAM, and the control circuit MDLCT0. Further, when receiving a reset signal RSTSIG from the information processor CPU_CP, the memory module NVMMD0 also performs the initialization of the nonvolatile memory devices NVM10 to NVM17 inside thereof, the random access memory RAM, and the control circuit MDLCT0.

Figure 2:
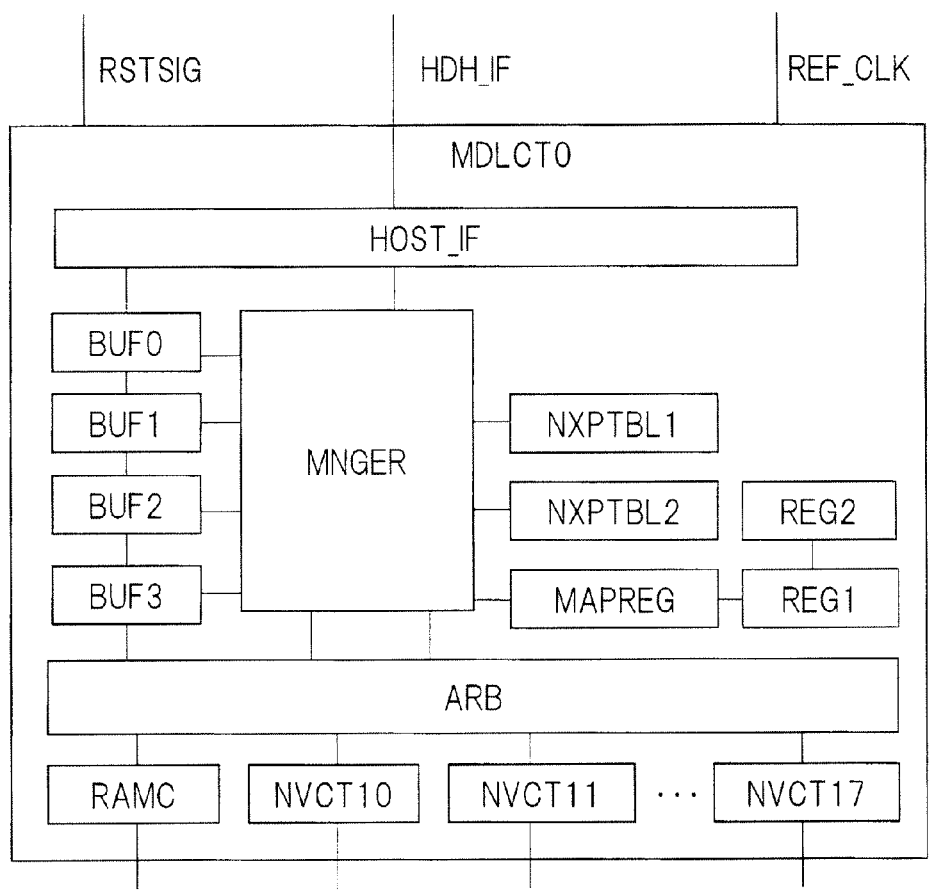
FIG. 2 is a block diagram illustrating a configuration example of a control circuit in FIG. 1.

FIG. 2 is a block diagram illustrating a configuration example of the control circuit in FIG. 1. The control circuit MDLCT0 shown in FIG. 2 includes an interface circuit HOST_IF, buffers BUF0 to BUF3, write physical address tables NXPTBL1 and NXPTBL2, an arbiter circuit ARB, an information processing circuit MNGER, memory control circuits RAMC, NVCT10 to NVCT17, a map register MAPREG, and registers REG1 and REG2. The memory control circuit RAMC directly controls the random access memory RAM in FIG. 1, and the memory control circuits NVCT10 to NVCT17 directly control the nonvolatile memory devices NVM10 to NVM17 in FIG. 1, respectively.

The buffers BUF0 to BUF3 temporarily store write data or read data of the nonvolatile memory devices NVM10 to NVM17. The write physical address tables NXPTBL1 and NXPTBL2 are tables that store, when receiving a write command having a logical address from the information processor CPU-CP, a physical address to be allocated to the logical address. The write physical address tables NXPTBL1 and NXPTBL2 are not particularly limited, but are realized by an SRAM, a register or the like. The write physical address tables NXPTBL1 and NXPTBL2 will be described in detail later with reference to FIG. 11 or the like. The map registers MAPREG and the registers REG1 and REG2 are registers that retain information related to the entire area of a memory space, which will be described in detail later with reference to FIG. 13 or the like. The SSD configuration information (SDCFG) or the boot program may be disposed in the control circuit MDLCT0 in a state of being directly connected to the information processing circuit MNGER in FIG. 2, for example, in order to increase the speed of the initial setting of the memory module NVMMD0.

<<Overall Configuration and Operation of Nonvolatile Memory Device>>

Figure 3A:
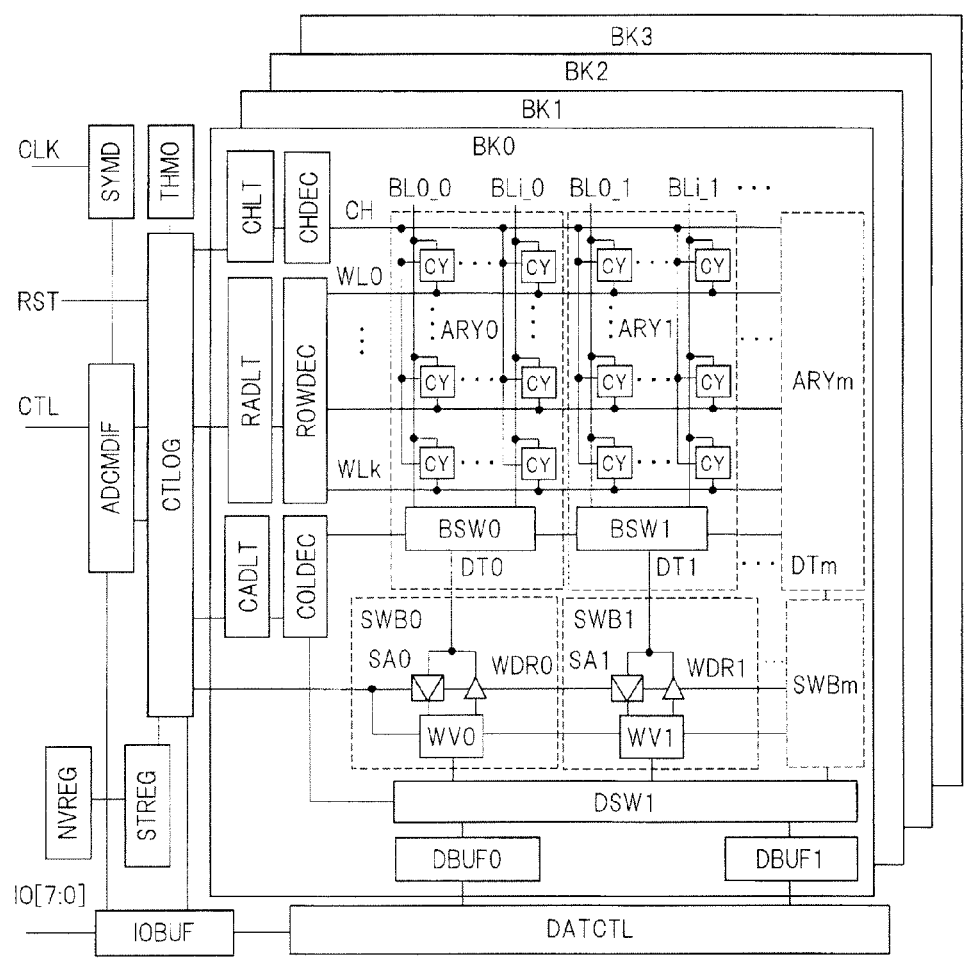
FIG. 3A is a block diagram illustrating a configuration example of a nonvolatile memory device in FIG. 1.
Figure 3B:
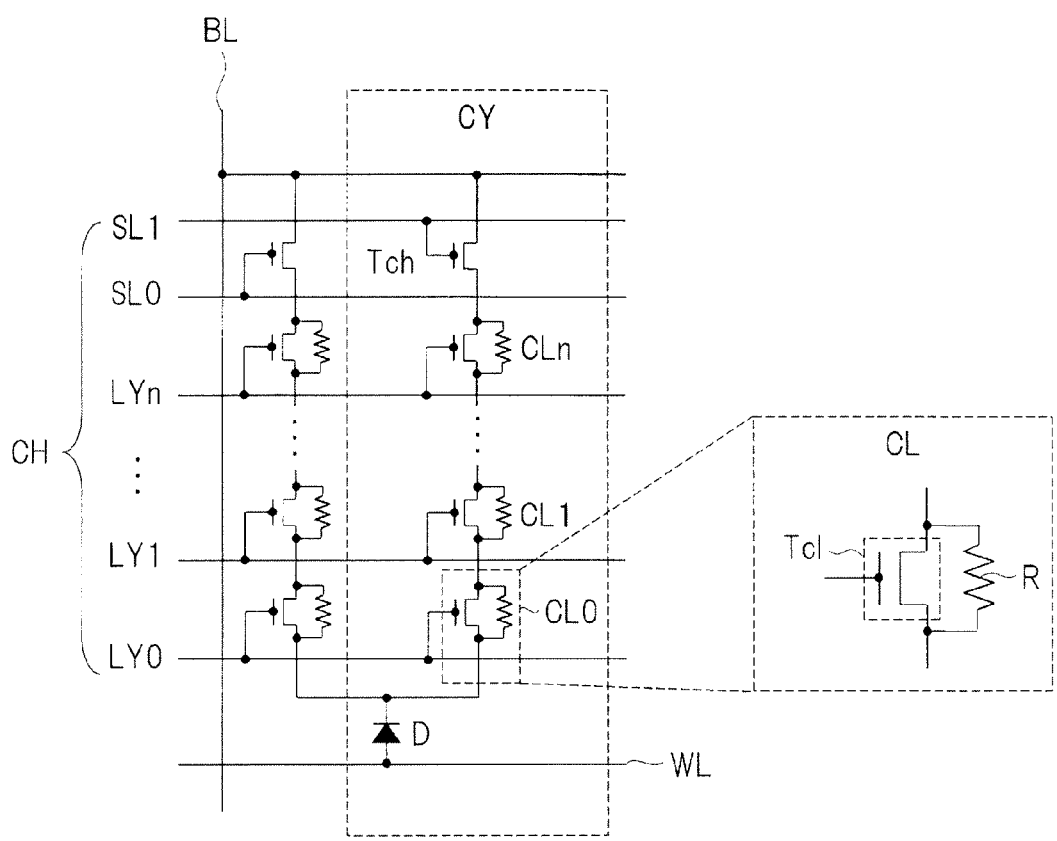
FIG. 3B is a circuit diagram illustrating a configuration example of a chain memory array in FIG. 3A.

FIG. 3A is a block diagram illustrating a configuration example of a nonvolatile memory device in FIG. 1, and FIG. 3B is a circuit diagram illustrating a configuration example of a chain memory array in FIG. 3A. The nonvolatile memory device in FIG. 3A corresponds to each of the nonvolatile memory devices NVM10 to NVM17 in FIG. 1. Here, a phase change type nonvolatile memory (phase change memory) is used as an example thereof. The nonvolatile memory device includes a clock generation circuit SYMD, a status register STREG, an erase size designation register NVREG, an address command interface circuit ADCMDIF, an IO buffer IOBUF, a control circuit CTLOG, a temperature sensor THMO, a data control circuit DATCTL, and memory banks BK0 to BK3.

Each of the memory banks BK0 to BK3 includes a memory array ARYx (x=0 to m), a read/write control block SWBx (x=0 to m) provided corresponding to each memory array, and various peripheral circuits that control the array and the block. The various peripheral circuits include a row address latch RADLT, a column address latch CADLT, a row decoder ROWDEC, a column decoder COLDEC, a chain selection address latch CHLT, a chain decoder CHDEC, a data selection circuit DSW1, and data buffers DBUF0 and DBUF1.

Each memory array ARYx (x=0 to m) includes plural chain memory arrays CYs disposed at intersections of plural word lines WL0 to WLk and plural bit lines BL0_x to BLi_x, and a bit line selection circuit BSWx that selects any one of the plural bit lines BL0_x to BLi_x to connect the selected bit line to a data line DTx. Each reading/writing control block SWBx (x=0 to m) includes a sense amplifier SAx and a write driver WDRx connected to the data line DTx, and a writing data verification circuit WVx that performs data verification using the sense amplifier SAx and the write driver WDRx when the writing operation is performed.

As shown in FIG. 3B, each chain memory array CY includes a configuration in which plural phase change memory cells CL0 to CLn are serially connected. One end of each chain memory array CY is connected to a word line WL through a diode D, and the other end thereof is connected to a bit line BL through a chain selection transistor Tch. Although not shown, the plural phase change memory cells CL0 to CLn are stacked in a height direction on a semiconductor substrate. Further, each phase change memory cell CL includes a variable resistance type storage element R and a memory cell selection transistor Tcl that are connected in parallel to each other. The storage element R is formed of a chalcogenide material, for example.

In the example of FIG. 3B, two chain memory arrays CY share the diode D, the chain selection transistors Tch in the respective chain memory arrays are respectively controlled by chain memory cell selection lines SL0 and SL1, and thus, any one chain memory array is selected. Further, the memory cell selection transistors Tcl in the phase change memory cells CL0 to CLn are respectively controlled by memory cell selection lines LY (LY0 to Lyn), and thus, each phase change memory cell is appropriately selected. The chain memory array selection lines SL0 and SL1 and the memory cell section lines LY0 to Lyn are appropriately driven through the chain selection address latch CHLT and the chain decoder CHDEC in FIG. 3A that correspond to a chain control line CH.

Next, the operation of the nonvolatile memory device in FIG. 3A will be briefly described. In FIG. 3A, first, the control circuit CTLOG receives a control signal CTL through the address command interface circuit ADCMDIF. The control signal CTL is not particularly limited, but for example, includes a command latch enable signal (CLE), a chip enable signal (CEB), an address latch signal (ALE), a light enable signal (WEB), a read enable signal (REB), and a ready busy signal (RBB), and issues a write command or a read command by combination of the above signals. The control circuit CTLOG receives an input/output signal IO through the IO buffer IOBUF, together with the control signal CTL. The input/output signal IO includes an address signal, and the control circuit CTLOG extracts a row address and a column address from the address signal. The control circuit CTLOG generates an appropriate internal address based on the row address and the column address, predetermined writing and reading units, or the like, and transmits the generated internal address to the row address latch RADLT, the column address latch CADLT, and the chain selection address latch CHLT, respectively.

The row decoder ROWDEC receives an output of the row address latch RADLT to select the word lines WL0 to WLk, and the column decoder COLDEC receives an output of the column address latch CADLT to select the bit lines BL0 to BLi. Further, the chain decoder CHDEC receives an output of the chain selection address latch CHLT to select the chain control line CH. When a read command is input by the control signal CTL, data is read, through the bit line selection circuits BSW0 to BSWm, from the chain memory array CY selected by combination of the above-described word line, bit line and chain control line. The read data is amplified by the sense amplifiers SA0 to SAm, and is transmitted to the data buffer DBUF0 (or DBUF1) through the data selection circuit DSW1. Further, data on the data buffer DBUF0 (or DBUF1) is sequentially transmitted to the input/output signal IO through the data control circuit DATCTL and the IO buffer IOBUF.

On the other hand, when a write command is input by the control signal CTL, a data signal subsequent to the above-described address signal is transmitted to the input/output signal IO, and the data signal is input to the data buffer DBUF0 (or DBUF1) through the data control circuit DATCTL. A data signal on the data buffer DBUF0 (or DBUF1) is written to the chain memory array CY selected by a combination of the above-described word line, bit line and chain control line through the data selection circuit DSW1, the write drivers WDR0 to WDRm, and the bit line selection circuits BSW0 to BSWm. Further, here, the write data verification circuits WV0 to WVm verify whether a write level reaches a sufficient level while appropriately reading the written data through the sense amplifiers SA0 to SAm, and perform the writing operation again using the write drivers WDR0 to WDRm until the level reaches the sufficient level.

Figure 4:
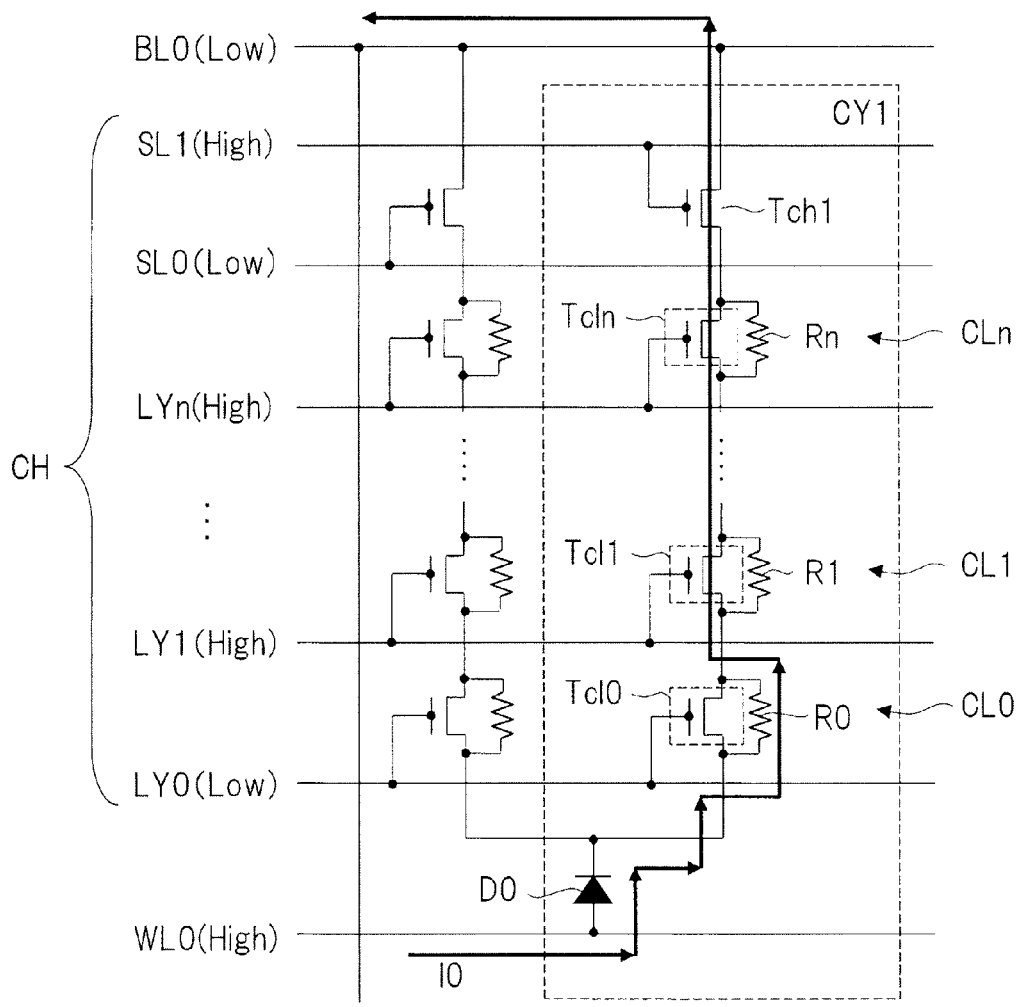
FIG. 4 is a diagram illustrating an operation example of the chain memory array in FIG. 3B.

FIG. 4 is a diagram illustrating an operation example of the chain memory array in FIG. 3B. With reference to FIG. 4, for example, an operation when a variable resistance storage element R0 in the phase change memory cell CL0 in the chain memory array CY1 has a high resistance or a low resistance will be described. Only the chain memory array selection line SL1 is activated (SL0=Low, SL1=High) by the chain decoder CHDEC, so that the chain selection transistor Tch1 is in a conductive state. Then, only the memory cell selection line LY0 is deactivated (LY0=Low, LY1 to LYn=High), so that the memory cell selection transistor Tcl0 of the phase change memory cell CL0 is in a cutoff state and the memory cell selection transistors Tcl1 to Tcln of the remaining memory cells CL1 to CLn are in a conductive state.

Figure 29:
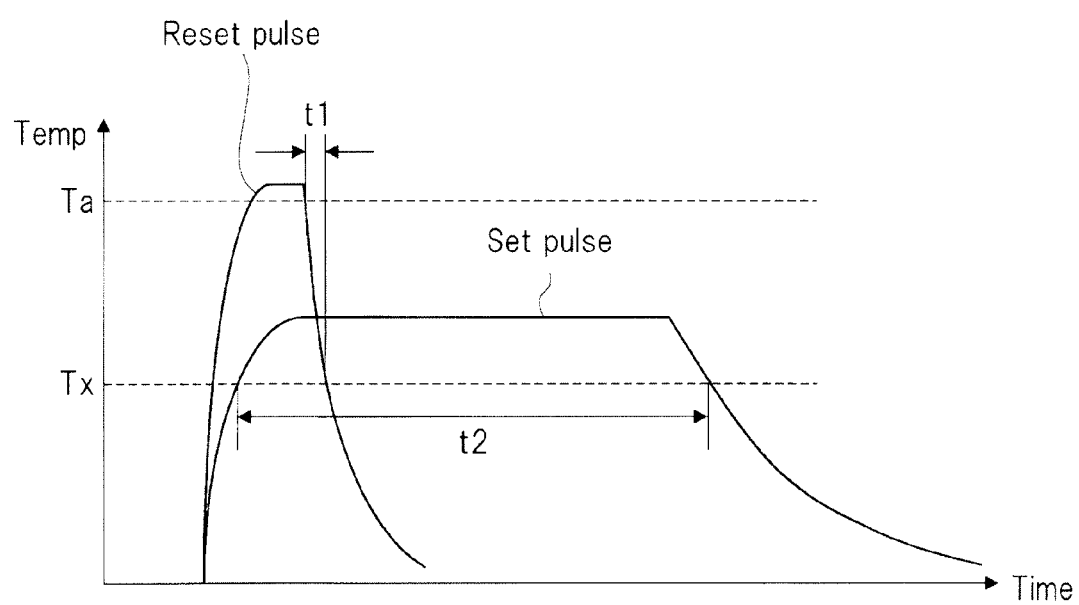
FIG. 29 is a diagram illustrating a relationship between a pulse width and a temperature necessary for phase change of a resistance storage element using a phase change material.

Then, if the word line WL0 becomes high, and then, the bit line BL0 becomes low, current I0 flows from the word line WL0 to the bit line BL0 through the diode D0, the variable resistance storage element R0, the memory cell selection transistors Tcl1 to Tcln, and the chain selection transistor Tch1. As the current I0 is controlled in the form of a reset current pulse as shown in FIG. 29, the variable resistance storage element R0 has the high resistance. Further, as the current I0 is controlled in the form of a set current pulse shown in FIG. 29, the variable resistance storage element R0 has the low resistance. According to differences between the resistance values of the variable resistance storage elements R0 to Rn, data is divided into data "1" and data "0". Although not particularly limited, it is assumed that when the variable resistance storage element has the low resistance, data "1" is recorded, and when the variable resistance storage element has the high resistance, data "0" is recorded.

When the data recorded in the variable resistance storage element R0 is read, current is applied through the same path as in the data writing such that the resistance value of the variable resistance storage element R0 is not changed. In this case, a voltage value based on the resistance value of the variable resistance storage element R0 is detected by a sense amplifier (in this example, SA0 in FIG. 3A) to determine data "0" and data "1".

Figure 5:
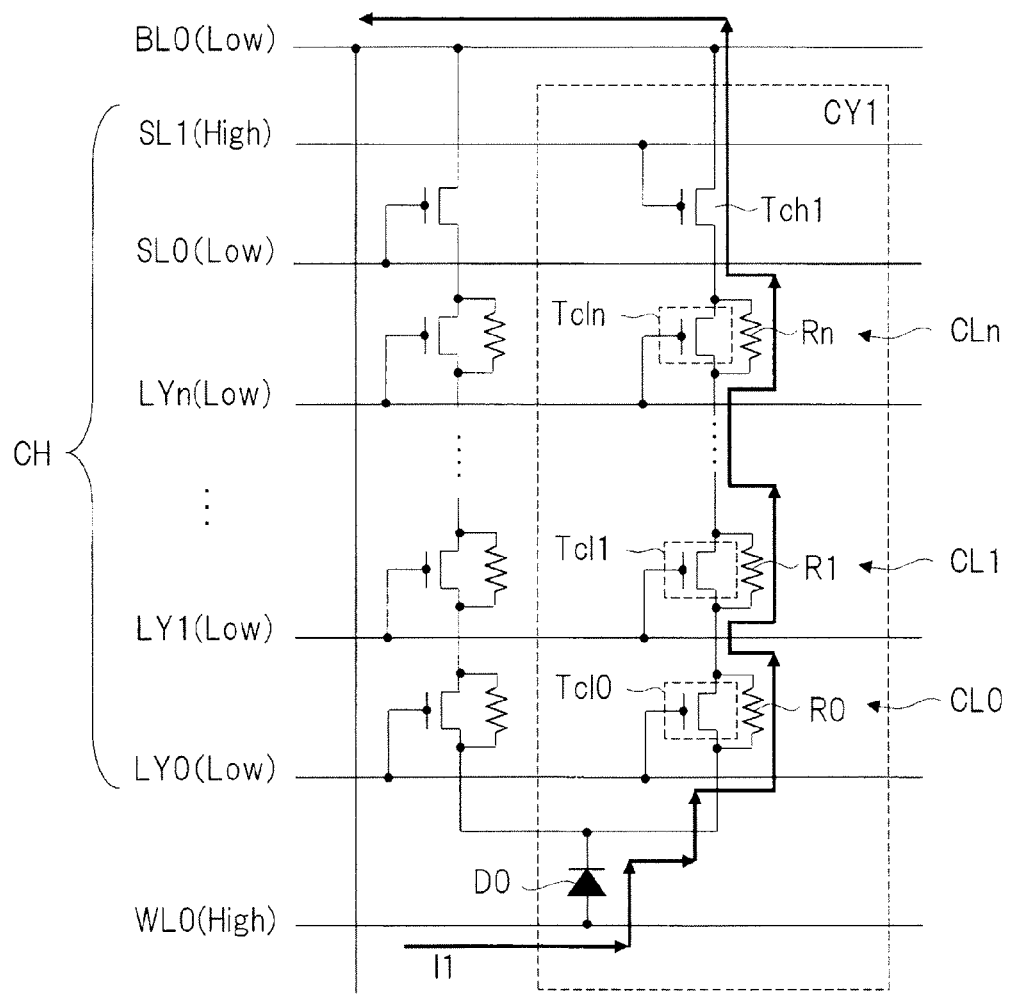
FIG. 5 is a diagram illustrating another operation example of the chain memory array in FIG. 3B.

FIG. 5 is a diagram illustrating another operation example of the chain memory array in FIG. 3B. An operation when all the variable resistance storage elements R0 to Rn in one chain memory array CY1 collectively have the low resistance will be described with reference to FIG. 5. Only the chain memory array selection line SL1 is activated (SL0=Low, SL1=High) by the chain decoder CHDEC, so that the chain selection transistor Tch1 is in a conductive state. Subsequently, the memory cell selection lines LY0 to LYn are deactivated (LY0 to LYn=Low), so that the memory cell selection transistors Tcl0 to Tcln of the memory cells CL0 to CLn are in a cutoff state. Then, if the word line WL0 becomes high, and the bit line BL0 becomes low, current I1 flows from the word line WL0 to the bit line BL0 through the diode D0, the variable resistance storage elements R0 to Rn, and the chain selection transistor Tch1. As the current I1 is controlled in the form of the set current pulse as shown in FIG. 29, the variable resistance storage elements R0 to Rn collectively have the low resistance.

<<Specific Operating Method of Chain Memory Array>>

Figure 17:
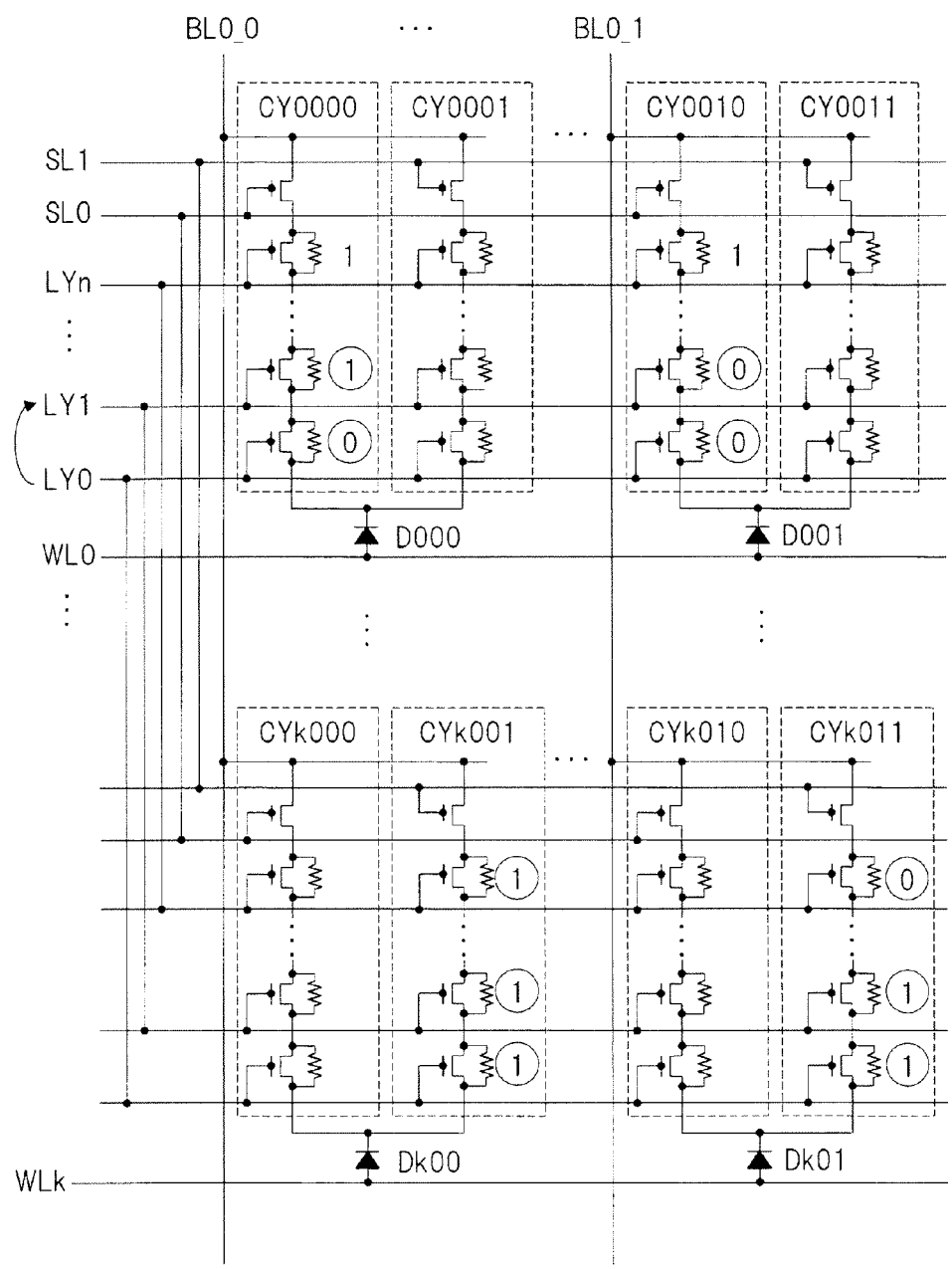
FIG. 17 is a diagram illustrating an example of a writing method to the chain memory array in the nonvolatile memory device in FIGS. 3A and 3B.
Figure 18:
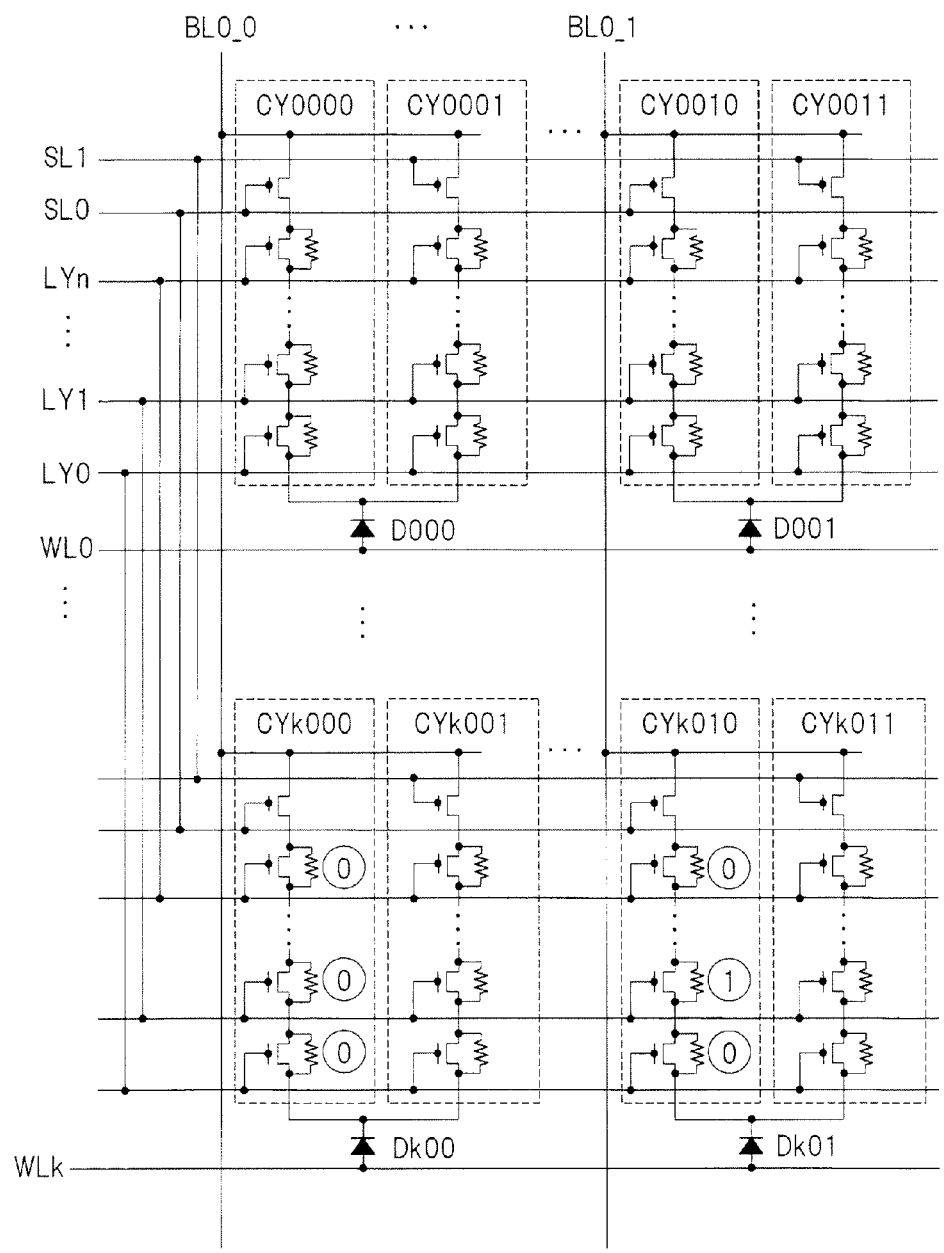
FIG. 18 is a diagram illustrating another example of the writing method to the chain memory array in the nonvolatile memory device in FIGS. 3A and 3B.
Figure 19:
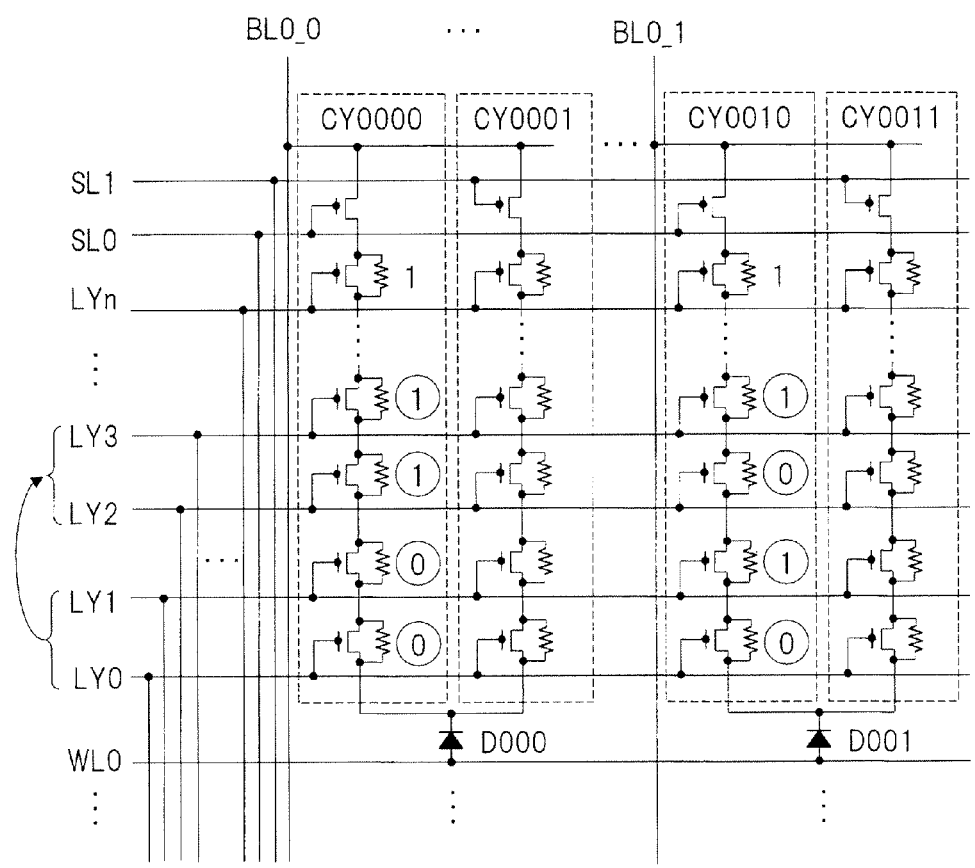
FIG. 19 is a diagram illustrating still another example of the writing method to the chain memory array in the nonvolatile memory device in FIGS. 3A and 3B.

Here, an operating method of the chain memory array which is a main characteristic of the embodiment will be described. FIGS. 17 to 19 are diagrams illustrating an example of a writing method to the chain memory array in the nonvolatile memory device in FIGS. 3A and 3B. The nonvolatile memory device according to the embodiment includes a second operation mode of performing (n+1)-bit writing with respect to (n+1)-bit phase change memory cells that form the chain memory array according to one writing command from a host (CPU_CP in FIG. 1), and a first operation mode of performing j-bit (j<(n+1)) writing. Hereinafter, a writing operation in each operation mode will be described. A specific control method of the word lines, the bit lines, the chain control lines or the like associated with the writing operation is the same as in the cases of FIGS. 4 and 5.

FIG. 17 is a diagram illustrating an example of a change state of the chain memory arrays associated with the writing operation when j=1 is set in the above-described first operation mode. In FIG. 17, for example, it is assumed that chain memory arrays CY0000 and CY0010 are allocated to the same physical address "1". Here, when the writing command "1" is input with respect to the physical address "1", in the chain memory arrays CY0000 and CY0010, first, the memory cell selection line LY0 is initially used.

Here, when the writing operation is performed with respect to the memory cell selection line LY0, beforehand, in the chain memory arrays CY0000 and CY0010, writing of "1" (set state) (referred to as initial writing or erase) is performed once with respect to all the phase change memory cells. Specifically, in a state where the chain memory array selection line SL0 is activated (SL0=High, SL1=Low) and the memory cell selection lines LY0 to LYn are all deactivated (low), the set current pulse in FIG. 29 is applied between the word line WL0 and a bit line BL0_0, and the word line WL0 and a bit line BL0_1, respectively. Then, predetermined data associated with the writing command "1" is written with respect to the phase change memory cell corresponding to the memory cell selection line LY0.

In this example, it is assumed that 1 bit data for the chain memory array CY0000 and 1 bit data for the chain memory array CY0010 associated with the writing command "1" are all "0". Here, in both the chain memory arrays CY0000 and CY0010, "0" (reset state) is written with respect to the phase change memory cell (which retains "1" associated with the initial writing (erase) in the above-described set state) corresponding to the memory cell selection line LY0. Specifically, in a state where the chain memory array selection line SL0 is activated (SL0=High, SL1=Low) and only the memory cell section line LY0 is deactivated (LY0=Low, LY1 to LYn=High), the reset current pulse in FIG. 29 is applied between the word line WL0 and the bit line BL0_0, and the word line WL0 and the bit line BL0_1, respectively.

Then, when a writing command "2" is again input with respect to the physical address "1", the memory cell selection line LY1 is then used. In this example, it is assumed that 1 bit data for the chain memory array CY0000 associated with the writing command "2" is "1" and 1 bit data for the chain memory array CY0010 is "0". Here, data on the phase change memory cell corresponding to the memory cell selection line LY1 in the chain memory arrays CY0000 and CY0010 is set to "1" in advance in association with the initial writing (erase) in the above-described memory cell selection line LY0. Accordingly, in the chain memory array CY0000 in which 1 bit data is "1" in association with the writing command "2", the writing operation is not particularly performed, and "0" (reset state) is written with respect to the phase change memory cell corresponding to the memory cell selection line LY1 in the chain memory array CY0010. Specifically, in a state where the chain memory array selection line SL0 is activated (SL0=High, SL1=Low) and only the memory cell section line LY1 is deactivated (LY1=Low, LY0, LY2 to LYn=High), the reset current pulse in FIG. 29 is applied between the word line WL0 and the bit line BL0_1. Here, the current pulse is not particularly applied between the word line WL0 and the bit line BL0_0.

In the chain memory arrays CY0000 and CY0010 in FIG. 17, a state after the writing operation is performed is shown. Thereafter, similarly, whenever the writing command is input with respect to the physical address "1", when the memory cell selection line to be used transits to LY2, LY3, . . . , LYn, and then, when LYn returns to LY0, the above-described initial writing (erase) is performed again.

Similarly, in FIG. 17, for example, it is assumed that chain memory arrays CYk001 and CYk011 are allocated to the same physical address "2". In the chain memory arrays CYk001 and CYk011 in FIG. 17 with respect to the physical address "2", a state after a writing command for setting 1 bit data for the chain memory array CYk001 and 1 bit data for the chain memory array CYk011 to "1" is input n times and after a writing command "n+1" with respect to the physical address "2" is input, is shown. In the wiring command "n+1", 1 bit data for the chain memory array CYk001 is "1", and 1 bit data for the chain memory array CYk011 is "0". In the chain memory arrays CYk001 and CYk011, after the initial writing (erase) is initially performed once according to the n-time writing commands, writing of "1" is performed while changing the memory cell selection line in the order of LY0, LY1, . . . , LY(n−1) (here, in reality, a writing operation other than the initial writing is not performed). Then, in the chain memory array CYk011, "0" (reset state) is written with respect to the phase change memory cell corresponding to the memory cell selection line LYn, according to the writing command "n+1" of the above-described 1 bit data "0".

FIG. 18 is a diagram illustrating an example of a change state of the chain memory arrays associated with the writing operation in the above-described second operation mode. In FIG. 18, for example, it is assumed that chain memory arrays CYk000 and CYk010 are allocated to the same physical address "1". Here, when the writing command "1" is input with respect to the physical address "1", in the chain memory arrays CYk000 and CYk010, first, writing of "1" (set state) (referred to as the initial writing (erase)) is initially performed with respect to all the phase change memory cells. Then, predetermined data associated with the writing command "1" is written with respect to all the phase change memory cells in the chain memory arrays CYk000 and CYk010.

In this example, it is assumed that (n+1) bit data for the chain memory array CYk000 associated with the writing command "1" is "0 . . . 00" and (n+1) bit data for the chain memory array CYk010 is "0 . . . 10". Here, data on all the phase change memory cells in the chain memory arrays CYk000 and CYk010 is set to "1" in advance in association with the above-described initial writing (erase). Accordingly, in the phase change memory cell (here, phase change memory cell corresponding to LY1 in the CYk010) in which the data associated with the writing command "1" corresponds to "1" bit, although the writing operation is not particularly performed, "0" (reset state) is written with respect to the other change memory cells. Specifically, for example, the memory cell selection line to be deactivated is sequentially shifted in the order of LY0, LY1, . . . , Lyn, and it is selected whether the reset current pulse in FIG. 29 is applied between the word line WLk and the bit line BL0_0, and between the word line WLk and the bit line BL0_1, respectively, and whenever the memory cell selection line to be deactivated is sequentially shifted. In this example, the reset current pulse is applied between the word line and the bit line except between the word line WLk and the bit line BL0_1 when the memory cell selection line LY1 is deactivated.

Then, when the writing command "2" is input with respect to the physical address "1" again, similar to the case of the writing command "1", after the initial writing (erase) is initially performed, writing of "0" (reset state) is appropriately performed based on the (n+1) bit data for the chain memory arrays CYk000 and CYk010 associated with the writing command "2". Here, the writing of "0" (reset state) is performed while sequentially shifting the memory cell selection line to be deactivated, but may be collectively performed without shifting the memory cell selection line, as necessary. That is, for example, in a state where the memory cell selection lines LY0 to LYn are all in a deactivated state, the reset current pulse is applied between the word line WLk and the bit line BL0_0, and then, in a state where the memory cell selection lines LY0 to LYn except for LY1 are in the deactivated state, the reset current pulse may be applied between the word line WLk and the bit line BL0_1.

FIG. 19 is a diagram illustrating an example of a change state of the chain memory arrays associated with the writing operation when j=2 is set in the above-described first operation mode. In FIG. 19, for example, it is assumed that the chain memory arrays CY0000 and CY0010 are allocated to the same physical address "1". Here, when the writing command "1" is input with respect to the physical address "1", in the chain memory arrays CY0000 and CY0010, first, two memory cell selection lines LY0 and LY1 are initially used.

Here, when the writing operation is performed with respect to the memory cell selection lines LY0 and LY1, beforehand, in the chain memory arrays CY0000 and CY0010, the above-described initial writing (erase) is performed with respect to all the phase change memory cells. Further, predetermined data associated with the writing command "1" is written with respect to the phase change memory cells corresponding to the memory cell selection lines LY0 and LY1. Here, it is assumed that 2 bit data for the chain memory array CY0000 associated with the writing command "1" is "00", and 2 bit data for the chain memory array CY0010 is "10". The specific writing operation is performed by shifting the memory cell selection line to be deactivated in the order of LY0 and LY1, every time, and then, by selecting whether to apply the reset current pulse in FIG. 29 between the word line WL0 and the bit line BL0_0, and between the word line WL0 and the bit line BL0_1, respectively, whenever the memory cell selection line to be deactivated is shifted.

Then, when the writing command "2" is again input with respect to the physical address "1", the memory cell selection lines LY2 and LY3 are then used. In this example, it is assumed that 2 bit data for the chain memory array CY0000 associated with the writing command "2" is "11", and 2 bit data for the chain memory array CY0010 is "10". Here, in the chain memory arrays CY0000 and CY0010 in FIG. 19, a state after the writing operation is performed is shown. Thereafter, similarly, whenever the writing command is input with respect to the physical address "1", when the memory cell selection lines to be used transit to LY4, LY5→LY6, and LY7→ . . . , and then, when LYn−1 and LYn return to LY0 and LY1, the above-described initial writing (erase) is performed again.

As described above, by using the operating method of the memory arrays shown in FIGS. 17 to 19, for example, the following effects are obtained.

(1) In the above-described first operation mode, since the (n+1)-bit chain memory array has a storage capacity of j bits (<(n+1)) and the j bits are controlled to be circulated in the chain memory array, the processing speed increases and the service life is prolonged compared with the above-described second operation mode. That is, for example, compared with the case of FIG. 17 and the case of FIG. 18, since a maximum bit number which is a target of the "0" (reset state) writing is reduced to 1/(n+1), it is possible to reduce the maximum time necessary for writing including the writing data verification (verifying operation) associated therewith. Further, in the case of FIG. 17, all the bits in the chain memory array are used once by (n+1) writing commands, whereas in the case of FIG. 18, all the bits in the chain memory array are used once by one writing operation. Thus, in the case of FIG. 17, the service life is prolonged about (n+1) times, compared with the case of FIG. 18.

On the other hand, in the second operation mode, compared with the first operation mode, it is possible to enhance capacity and to reduce cost. That is, for example, in the case of FIG. 17, one chain memory array has 1-bit storage capacity, whereas in the case of FIG. 18, one chain memory array has (n+1)-bit storage capacity, and thus, a capacity value per unit area increases, and low bit cost can be achieved. Consequently, by appropriately combining the first operation mode and the second operation mode, for example, by setting an area used in the first operation mode and an area used in the second operation mode are provided in the nonvolatile memory device, it is possible to secure the performance such as speed, service life and capacity with excellent balance, and to flexibly satisfy user desired performance.

(2) In both of the first and second operation modes, after one state among the set state and the reset state is collectively written with respect to all the memory cells in the chain memory array (after the initial writing (erase)), the other state is written in a certain memory cell, and thus, a stable writing operation can be realized. That is, in the chain memory array, first, one state is collectively written to maintain the respective states (resistance values) of the memory cells in the chain memory array to be approximately uniform. Then, when the other state is written in the certain memory cell, the respective memory cells disposed in the vicinity of the certain memory cell are similarly affected from the same initial state due to heat generated in association with the writing, and consequently, it is possible to reduce the amount of variation of the resistance values between the respective memory cells in the chain memory array. Thus, it is possible to realize a stable writing operation. Particularly, when the chain memory array having a stacked structure shown in FIGS. 17 to 19 is used, since the respective memory cells are likely to be closely disposed, compared with a case where the stacked structure is not used, it is more useful to reduce the amount of variation by such a method.

Further, here, the set state is used in the initial writing (erase), and the reset state is used in the writing with respect to a subsequent certain state. Thus, it is possible to achieve a more stable writing operation. For example, in the phase change memory cell, generally, the set state is more stable than the reset state. In addition, as shown in FIG. 29, since a pulse width when writing the set state is wider than a pulse width when writing the reset state, when writing the set state, heat generated in association with the writing operation is easily spread to the periphery thereof, and a possibility of affecting storage states of neighboring change memory cells increases. In consideration of this situation, it is preferable to use a method in which the writing of the set state is not performed with respect to a certain phase change memory cell, according to the writing method of the present embodiment. If the writing method of the present embodiment is used, when writing the reset state in the certain phase change memory cell, the neighboring phase change memory cells are stable in the set state in association with the initial writing (erase). Further, since the pulse width associated with the writing of the reset state is narrow, the spreading of the heat associated with the writing is also suppressed.

(3) By combining the first operation mode and the above-described specific writing method for the respective memory cells in the chain memory array, it is possible to enhance the service life of the memory cells, and to perform a stable writing operation, thereby enhancing reliability.

In FIGS. 17 to 19, FIG. 3B, and the like, for example, n=7 or the like is used and (n+1) phase change memory cells correspond to one chain memory array, but the invention is not necessarily limited thereto, and the correspondence may be appropriately changed. For example, in FIG. 17, n=3 may be used, and four phase change memory cells that are sequentially stacked (for example, corresponding to CY0000) and four phase change memory cells (for example, corresponding to CY0010) that are sequentially stacked and share the diode and the bit line may correspond to one chain memory array. In this case, the initial writing (erase) of the chain memory array is performed in the form of two parts by sequentially activating the chain memory array selection lines SL0 and SL1. Alternatively, for example, when a writing current can be set to a size of two times, the initial writing (erase) of the chain memory array may be performed once by activating the chain memory array selection lines SL0 and SL1 together. Further, for example, in FIG. 17, the memory cell selection line is sequentially shifted whenever the writing command is input, but for example, when data associated with the writing command is all "1", function that does not perform the shift may be added.

<<Writing Operation to Nonvolatile Memory Device>>

Figure 6:
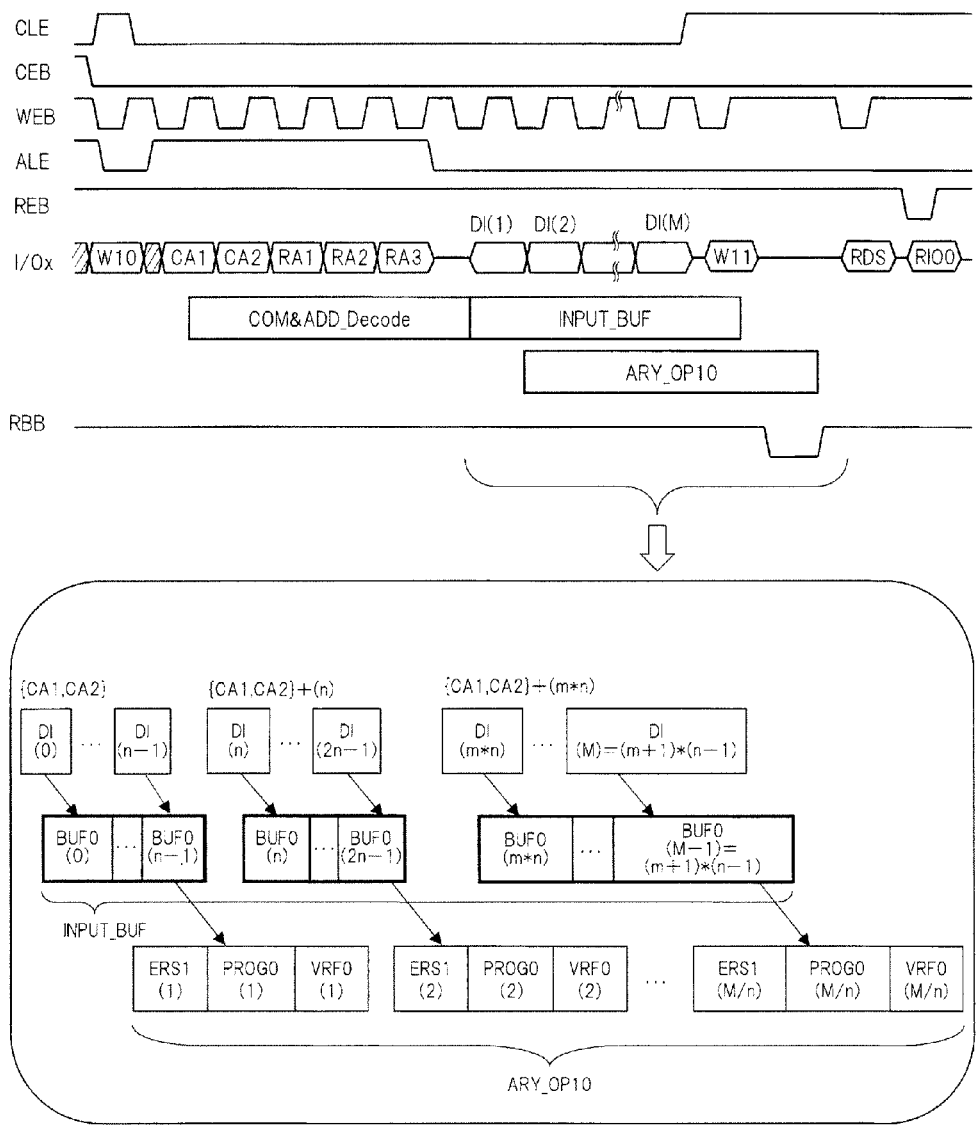
FIG. 6 is a diagram illustrating an example of a timing of a schematic writing operation in the nonvolatile memory device in FIG. 3A.

FIG. 6 is a diagram illustrating an example of a timing of a schematic writing operation in the nonvolatile memory device in FIG. 3A. Here, a case where M-byte data is written to phase change memory cells in memory arrays ARY0 to ARYm through the data buffer DBUF0 with respect to the nonvolatile memory device in FIG. 3A corresponding to any one of the nonvolatile memory devices NVM1$x$ ($x$=0 to 7) in FIG. 1 will be described as an example. In FIG. 6, "*" in "m*n" or the like represents "x" (multiplication).

In FIG. 6, the command latch enable signal CLE at a low level is driven to a high level, and the chip enable signal CEB and the address latch enable signal ALE at a high level are driven to a low level. Then, if a writing command W10 is input through the input/output line I/O$x$ ($x$=0 to 7) (IO "7:0" in FIG. 3A), the writing command W10 is imported to the address command interface circuit ADCMDIF in FIG. 3A by a rising edge of the write enable signal WEB for interpretation. Further, the writing command W10 includes information for designating the data buffer DBUF0 or DBUF1, and in the example of FIG. 6, the data buffer DBUF0 is designated.

Then, the command latch enable signal CLE at the high level is driven to the low level, and the address latch enable signal ALE at the low revel is driven to the high level, respectively. Then, a column address is sequentially input in the form of two parts (CA1, CA2), and a row address is sequentially input in the form of three parts (RA1, RA2, RA3). These addresses are imported to the address command interface circuit ADCMDIF by a rising edge of the write enable signal WEB for interpretation. As a result of the interpretation of the addresses and the writing command W10 in the address command interface circuit ADCMDIF, if information indicating that the command is a writing command to the memory bank BK0 is transmitted to the control circuit CTLOG, the control circuit CTLOG writes data to the memory bank BK0, and thus, the memory bank BK0 is activated.

The row addresses (RA1, RA2, RA3) and the column address (CA1, CA2) input to the address command interface circuit ADCMDIF are transferred to the row address latch RADLT, the column address latch CADLT, and the chain selection address latch CHLT of the activated memory bank BK0, respectively, through the control circuit CTLOG. Here, the writing operation starts from an initially input column address. The row addresses (RA1, RA2, RA3) are transferred to the row decoder ROWDEC from the row address latch RADLT, and the word line WLk (word line WLk=High) corresponding to the row addresses (RA1, RA2, RA3) is selected by the row decoder ROWDEC. Then, the chain address (CHAD) and the cell address (CLAD) are transferred to the chain decoder CHDEL from the chain selection address latch CHLT, and the chain memory array selection line SL and the memory cell selection line LY corresponding to the chain address (CHAD) and the cell address (CLAD) are selected by the chain decoder CHDEC.

Subsequently, the column addresses (CA1, CA2) are transferred to the column decoder COLDEC from the column address latch CADLT so as to be interpreted. The interpretation result from the column decoder COLDEC is input to the bit line selection circuits BSW0 to BSWm of the respective memory arrays ARY0 to ARYm, and one bit line BLi_$x$ ($x$=0 to m) is selected for each of the memory arrays ARY0 to ARYm to be connected to the write drivers WDR0 to WDRm through the data lines DT0 to Dtm. From such a state, the write drivers WDR0 to WDRm set the bit line BLi_$x$ selected through the data lines DT0 to DTm to a low state, and cause a predetermined current to flow in the variable resistance storage element R of the phase change memory cell CL as shown in FIGS. 4 and 5, to thereby set the variable resistance storage element R to the low resistance state or the high resistance state.

When the variable resistance storage element R of the phase change memory cell CL is set to the low resistance state, that is, when storage information "1" is written, the memory cell current Icl to be applied through the data lines DT0 to DTm is controlled to be a value (Iset) necessary for the set operation. When the phase change memory cell CL is set to the high resistance state, that is, when storage information "0" is written, the memory cell current Icl to be applied through the data lines DT0 to Dtm is controlled to be a value (Ireset) necessary for the reset operation. For example, when total (m+1) write drivers WDR are present in one memory bank and the chain memory array CY having 8-bit storage capacity in the memory arrays ARY0 to ARYm is selected one by one, the writing may be performed in (m+1)-byte units in the memory bank.

Next, the address latch enable signal ALE at the high level is driven to the low level, storage information pieces DI(1), and DI(2), DI(M) are respectively input by one byte through the input/output line I/Ox (x=0 to 7) in synchronization with the rising edge of the write enable signal WEB. The respective pieces of storage information DI(1), DI(2), . . . , DI(M) are sequentially input to the data buffer DBUF0. Whenever data corresponding to n bytes is input to the data buffer DBUF0, data writing corresponding to n bytes is performed through the write driver WDR corresponding to n×8. Hereinafter, the operation will be described.

First, a writing operation of initial n-byte data will be described.

In the initial n-byte data input to the data buffer DBUF0, at a point of time when initial 1 byte data is input, the memory cells corresponding to the initial n-byte data, selected by the column address {CA1, CA2}, are subjected to writing in the low resistance state (erase: ERS1 (1)) of the initial n-byte through the write driver WDR. Then, at a point of time when the initial n-byte data is all input to the data buffer DBUF0, the phase change memory cells corresponding to "0" data in the data retained in the data buffer DBUF0 are subjected to writing in the high resistance state (program: PROG0 (1)) through the write driver WDR. Finally, the write data verification circuit WVx (x=0 to m) reads the "0" data written in the phase change memory cells, and confirms whether "0" is correctly written (verify: VRF0 (1)). In this way, the initial n-byte data writing is performed.

Next, a writing operation of the second n-byte data will be described.

In the second n-byte data input to the data buffer DBUF0, at a point of time when initial 1 byte data is input, the memory cells corresponding to the second n-byte data, selected by the column address {{CA1, CA2}+(n)} are subjected to writing in the low resistance state (erase: ERS1 (2)) through the write driver WDR. Then, at a point of time when the second n-byte data is all input to the data buffer DBUF0, the phase change memory cells corresponding to "0" data in the data retained in the data buffer DBUF0 are subjected to writing in the high resistance state (program: PROG0 (2)) through the write driver WDR. Finally, the write data verification circuit WVx (x=0 to m) reads the "0" data written in the phase change memory cells, and confirms whether "0" is correctly written (verify: VRF0 (2)). In this way, the second n-byte data writing is performed.

A writing operation of the third n-byte data is performed similar to the above-described operations, in which column addresses "{{CA1, CA2}+(2n)} are used. In this way, the column addresses are generated while sequentially adding a multiple of n to the start column addresses {CA1, CA2}, and whenever the phase change memory cells CL corresponding to the n-byte data are selected by the column addresses, erase (ERS1), program (PROG0), and verify (VRF0) are executed. The addition of the column address is performed by the control circuit CTLOG in FIG. 3A for example.

With such an operation, when M-byte data is written, the erase (ERS1), the program (PROG0), and the verify (VRF0) are executed M/n times. Further, when the data buffer DBUF1 is designated by the writing command W10, the data is input to the data buffer DBUF1 through the input/output line I/Ox (x=0 to 7), and the data retained in the data buffer DBUF1 is written to the phase change memory cell CL. In FIG. 6, a write executing command W11 represents a command of a command format for instruction of finishing the input of the storage information DI(1) to DI(M) and of performing the writing operation with respect to the memory array. Here, in the example of FIG. 6, in a step before receiving the write executing command W11, an actual writing operation is performed whenever a predetermined amount of data is stored in the data buffer, which increases the processing speed.

Further, although not particularly limited, the M-byte writing in the second operation mode is performed by activating one bit line for each of the memory arrays ARY0 to ARYm with respect to one word line, respectively selecting the chain memory array CY one by one from the ARY0 to ARYm, and setting all the memory cells in the chain memory array CY as a writing target, for example. On the assumption that this memory array configuration is used, the M-byte writing in the first operation mode is performed by sequentially activating plural word lines with respect to one bit line for each of the memory arrays ARY0 to ARYm, selecting plural chain memory arrays CY from the ARY0 to ARYm, respectively, and setting one memory cell in the chain memory array CY as a writing target, for example. Alternatively, for example, the M-byte writing is performed by sequentially activating plural bit lines with respect to one word line for each of the memory arrays ARY0 to ARYm, selecting plural chain memory arrays CY from the ARY0 to ARYm, respectively, and setting one memory cell in the chain memory array CY as a writing target.

As described above, when writing the M-byte data, the nonvolatile memory device NVM1x (x=0 to 7) performs the erase (ERS1), the program (PROG0), and the verify (VRF0) of the requested M-byte data size. That is, since the data size of the erase (ERS1) and the data size of the program (PROG0) are the same, it is not necessary to perform erase (ERS1) of extra address data, to thereby realize high speed writing. Further, in the writing operation, as described in FIGS. 17 to 19, by once setting the phase change memory cell CL that is a target to an erase state without performing overwriting, it is possible to make resistance values of the phase change memory cells uniform, to thereby realize a stable writing operation. Furthermore, by performing the verify (VRF0) after the program (PROG0), it is possible to secure high reliability.

<<Reading Operation from Nonvolatile Memory Device>>

Figure 7:
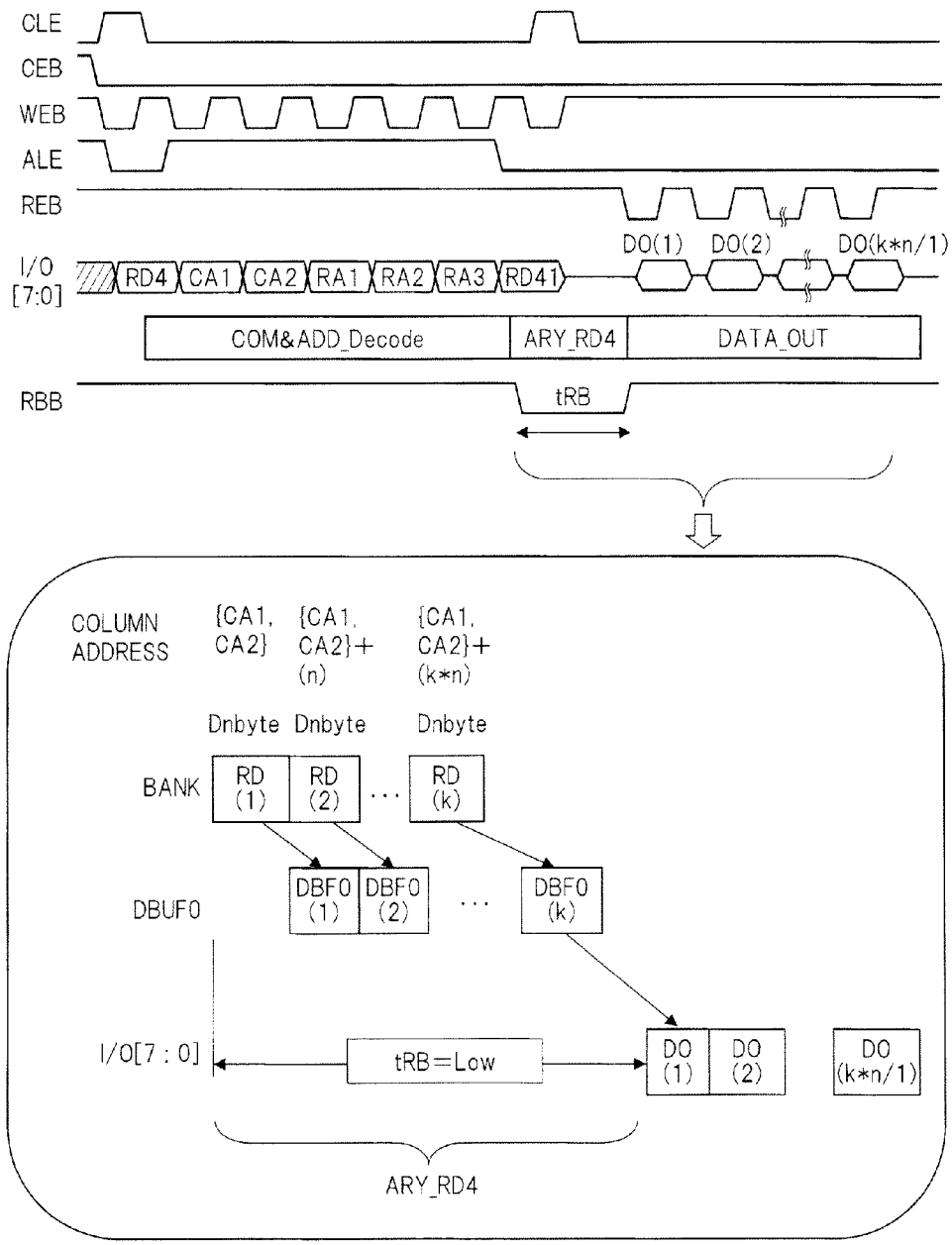
FIG. 7 is a diagram illustrating an example of a timing of a schematic reading operation in the nonvolatile memory device in FIG. 3A.

FIG. 7 is a diagram illustrating an example of a timing of a schematic reading operation in the nonvolatile memory device in FIG. 3A. Here, a case in which data corresponding to a designated data size is read through the data buffer DBUF0 from the phase change memory cell in the memory arrays ARY0 to ARYm with respect to the nonvolatile memory device in FIG. 3A corresponding to any one of the nonvolatile memory devices NVM1x (x=0 to 7) in FIG. 1 will be described as an example. In FIG. 7, "*" in "k*n" or the like represents "x" (multiplication).

In FIG. 7, the command latch enable signal CLE at a low level is driven to a high level, and the chip enable signal CEB and the address latch enable signal ALE at a high level are driven to a low level. Then, if a reading command RD4 is input through the input/output line I/Ox (x=0 to 7) (IO "7:0" in FIG. 3A), a first reading command RD4 is imported to the address command interface circuit ADCMDIF by a rising edge of the write enable signal WEB for interpretation.

Then, the command latch enable signal CLE at the high level is driven to the low level, and the address latch enable signal ALE at the low revel is driven to the high level, respectively, and column address are sequentially input in the form of two parts (CA1, CA2), and row addresses are sequentially input in the form of three parts (RA1, RA2, RA3). These addresses are imported to the address command interface circuit ADCMDIF by the rising edge of the write enable signal WEB for interpretation.

Next, the command latch enable signal CLE at the low level is driven to the high level, and the chip enable signal CEB and the address latch enable signal ALE at the high level are driven to the low level. Subsequently, if a second reading command RD41 is input through the input/output line I/Ox (x=0 to 7), the second reading command RD41 is imported to the address command interface circuit ADCMDIF by the rising edge of the write enable signal WEB for interpretation.

The commands RD4 and RD41 include information for designating the data buffer DBUF0 or DBUF1, and in the example of FIG. 7, the data buffer DBUF0 is designated. As a result of the interpretation of the addresses, the command RD4, and the command RD41 in the address command interface circuit ADCMDIF, if information indicating that the command is a reading command to the memory bank BK0 is transmitted to the control circuit CTLOG, the control circuit CTLOG reads data from the memory bank BK0 to activate the memory bank BK0.

The row addresses (RA1, RA2, RA3) and the column addresses (CA1, CA2) input to the address command interface circuit ADCMDIF are transferred to the row address latch RADLT, the column address latch CADLT, and the chain selection address latch CHLT of the activated memory bank BK0, respectively, through the control circuit CTLOG. Here, the reading operation starts from an initially input column address. The row addresses (RA1, RA2, RA3) are transferred to the row decoder ROWDEC from the row address latch RADLT, and the word line WLk (word line WLk=High) corresponding to the row addresses (RA1, RA2, RA3) is selected by the row decoder ROWDEC. Then, the chain address (CHAD) and the cell address (CLAD) are transferred to the chain decoder CHDEC from the chain selection address latch CHLT, and the chain memory array selection line SL and the memory cell selection line LY corresponding to the chain address (CHAD) and the cell address (CLAD) are selected by the chain decoder CHDEC.

Subsequently, the column addresses (CA1, CA2) are transferred to the column decoder COLDEC from the column address latch CADLT for interpretation. The interpretation result from the column decoder COLDEC is input to the bit line selection circuits BSW0 to BSWm of the respective memory arrays ARY0 to ARYm, and one bit line BLi_x (x=0 to m) is selected for each of the memory arrays ARY0 to ARYm to be connected to the sense amplifiers SA0 to SAm through the data lines DT0 to Dtm. Thus, since 1-bit phase change memory cell CL is selected for each of the memory arrays ARY0 to ARYm, (m+1)-bit phase change memory cells CL (from 0 bit to m bit) are simultaneously selected from one memory bank.

If a predetermined reading current flows toward the bit line from the word line (data lines DT0 to DTm) with respect to the phase change memory cells CL (form 0 bit to m-bit) selected for each memory array, a voltage based on the storage state is generated. The sense amplifiers SA0 to SAm measures the voltage at that time to compare the measured voltage with a reference voltage, to thereby detect data Dnbyte corresponding to (m+1) bits recorded in the phase change memory cells CL. That is, data Dnbyte corresponding to initial n bytes (=(m+1)/8) selected by the column addresses (CA1, CA2) is simultaneously detected from the phase change memory cells CL.

For example, in the memory array ARY0, when a predetermined phase change memory cell CL in the chain memory array CY disposed at an intersection of the word line WL0 and the bit line BL0_0 writes data "1" and is in the low resistance state, the bit line BL0_0 and the data line DT0 are charged, and the sense amplifier SA0 detects data "1" from the voltage. On the other hand, in the memory array ARY1, when a predetermined phase change memory cell CL in the chain memory array CY disposed at an intersection of the word line WL0 and the bit line BL0_1 writes data "0" and is in the high resistance state, the bit line BL0_1 and the data line DT1 are almost maintained at a ground voltage VSS, and the sense amplifier SA1 detects data "0" from the voltage.

The detected data Dnbyte corresponding to the initial n bytes (=(m+1)/8) is transferred to the data buffer DBUF0 designated by the commands RD4 and RD41 through the data selection circuit DSW1. The next n-byte data is selected by the column address {{CA1, CA2}+(n)}, and is transferred to the data buffer DBUF0. In this way, the column addresses are selected while sequentially adding a multiple of n to the start column address {CA1, CA2}, the n-byte data is read from the phase change memory cells CL corresponding to the selected column addresses, and is sequentially transferred to the data buffer DBUF0. The addition of the multiple of n is performed by the control circuit CTLOG in FIG. 3A, for example. When the designated data size is k*n bytes, the data transfer from the memory array ARY to the data buffer DBUF0 occurs k times.

During a period of time when the data transfer from the phase change memory cell CL to the data buffer DBUF0 is performed, the ready/busy signal RBB at the high level becomes the low level. At a point of time when the data transfer is finished, the ready/busy signal RBB at the low level becomes the high level. Here, for example, when the input/output signal IO is 8 bits (1 byte), k*n-byte data stored in the data buffer DBUF0 is output in the order of DO (1) to DO (k*n) through the input/output signal IO in synchronization with a falling edge of a read enable signal REB. For example, when the designate data size is 512 bytes, the data size of the phase change memory cells CL that are simultaneously selected is 16 bytes, and the input/output signal IO is 8 bits (1 byte), the data transfer of total 32 times (=512/16) is performed from the phase change memory cells CL to the data buffer DBUF0, and the number of times of data output from the data buffer DBUF0 through the input/output signal IO becomes 512.

Further, when the data buffer DBUF1 is designated by the commands RD4 and RD41, similarly, data corresponding to the designated data size (k*n byte) is read through the data buffer DBUF1 from the memory array of the nonvolatile memory device NVM1x (x=0 to 7). In this way, in the reading operation in which an arbitrary data size is designated, it is possible to efficiently read only data corresponding to a necessary data size, to thereby realize high speed reading.

<<Initial Sequence when Power is Supplied>>

Figure 8A:
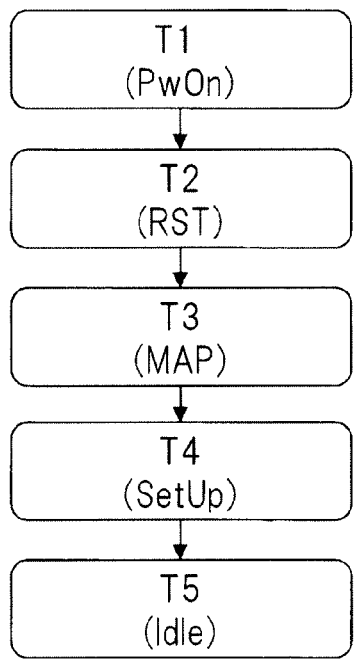
FIG. 8A is a diagram illustrating an example of an initial sequence when power is supplied, in the information processing system in FIG. 1.
Figure 8B:
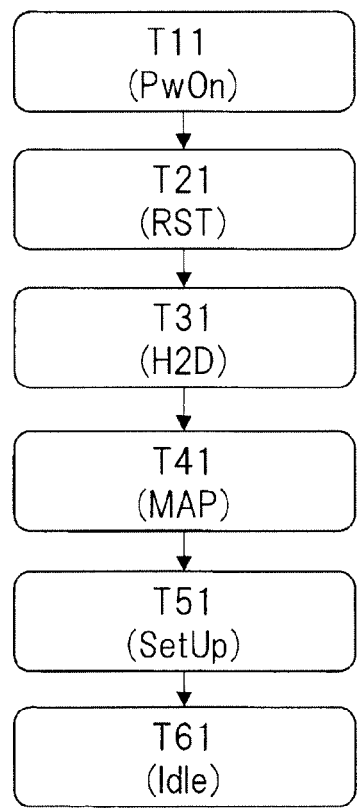
FIG. 8B is a diagram illustrating another example of the initial sequence when power is supplied, in the information processing system in FIG. 1.

FIGS. 8A and 8B are diagrams illustrating examples of different initial sequences when power is supplied in the information processing system in FIG. 1. FIG. 8A shows an initial sequence when power is supplied in a case where the SSD configuration information (SDCFG) stored in the nonvolatile memory devices NVM10 to NVM17 in the memory module (semiconductor device) NVMMD0 in FIG. 1 is used. FIG. 8B shows an initial sequence when power is supplied in a case where the SSD configuration information (SDCFG) transmitted from the information processor CPU_CP in FIG. 1 is used.

First, the initial sequence shown in FIG. 8A will be described. During a period of T1 (PwOn), power is supplied to the information processor CPU_CP, the nonvolatile memory devices NVM10 to NVM17 in the memory module NVMMD0, the random access memory RAM, and the control circuit MDLCT0, and in a period of T2 (RST), a reset operation is performed. The reset method is not particularly limited, and for example, a method for automatically performing the reset operation in each integrated circuit, or a method for providing an external reset terminal (reset signal RSTSIG) to perform the reset operation by the reset signal may be used. Further, for example, a method for inputting a reset command to the control circuit MDLCT0 from the information processor CPU_CP through the interface signal HDH_IF to perform the reset operation may be used.

During the period of T2 (RST), internal states of the information processor CPU_CP, the control circuit MDLCT0, the nonvolatile memory devices NVM10 to NVM17, and the random access memory RAM are initialized. Here, the control circuit MDLCT0 initializes an address range map (ADMAP) and various tables stored in the random access memory RAM. The various tables include an address conversion table (LPTBL), physical segment tables (PSEGTBL1, PSEGTBL2), a physical address table (PADTBL), a write physical address table (NXPADTBL).

Although described later in detail, the address range map (ADMAP) and the various tables will be briefly described as follows. The address range map (ADMAP) represents a divided section of an address area used in the above-described first operation mode and an address area used in the second operation mode. The address conversion table (LPTBL) represents a correspondence relation of a current logical address and a current physical address. The physical segment tables (PSEGTBL1, PSEGTBL2) manage the number of erases in each physical address in segment units, which are used in wear leveling or the like. The physical address table (PADTBL) manages the state of each current physical address in detail. The write physical address table (NXPADTBL) determines a physical address to be next allocated with respect to a logical address based on the wear leveling. Here, in order to increase the writing speed, the write physical address table (NXPADTBL) is configured so that a part or all of information thereof is copied to the write physical address tables NXPTBL1, and NXPTBL2 shown in FIG. 2.

During a period of T3 (MAP) after the period of T2, the control circuit MDLCT0 reads the SSD configuration information (SDCFG) stored in the nonvolatile memories NVM10 to NVM17, and transfers the read information to the map register MAPREG in FIG. 2. Then, the control circuit MDLCT0 reads the SSD configuration information (SDCFG) in the map register MAPREG, generates the above-described address range map (ADMAP) using the SSD configuration information (SDCFG), and stores the generated address range map (ADMAP) in the random access memory RAM. That is, the SSD configuration information (SDCFG) includes information about the address area used in the above-described first operation mode and the address area used in the second operation mode.

Further, if two logical address areas (LRNG1 and LRNG2) are set from among the SSD configuration information (SDCFG) in the map register MAPREG, the control circuit MDLCT0 builds the write physical address table (NXPADTBL) based thereon. Specifically, for example, the write physical address table (NXPADTBL) is divided into the write physical address table (NXPADTBL1) for the logical address area (LRNG1) and the write physical address table (NXPADTBL2) for the logical address area (LRNG2). For example, the logical address area (LRNG1) corresponds to an area for the above-described first operation mode, and the logical address area (LRNG2) corresponds to an area for the above-described second operation mode.

Although not particularly limited, but when the write physical address table (NXPADTBL) is configured to have N entries from 0 entry to (N−1)-entry, N/2 entries from 0 entry to (N/2−1) entry can be set in the write physical address table NXPADTBL1. Further, the remaining N/2 entries from N/2 entry to N entry can be also set in the write physical address table (NXPADTBL2).

After the period of T3 is finished, during a period (SetUp) of T4, the information processor CPU_CP reads the boot program stored in a nonvolatile memory device NVM0 in the memory module NVMMD0, and starts the information processor CPU_CP. After the period of T4 is finished, during a period (Idle) of T5, the memory module NVMMD0 enters an idle state, which is a state of waiting for a request from the information processor CPU_CP.

Then, the initial sequence shown in FIG. 8B will be described. During a period (PwOn) of T11 and a period (RST) of T21, the same operations as in the periods of T1 and T2 in FIG. 8A are performed, respectively. After the period of T21 is finished, during a period (H2D) of T31, the information processor CPU_CP transmits the SSD configuration information (SDCFG) to the memory module NVMMD0, and the control circuit MDLCT0 receives the SSD configuration information (SDCFG) and stores the received information in the nonvolatile memory devices NVM10 to NVM17. After the period of T31 is finished, during a period (MAP) of T41, a period (Setup) of T51, and a period (Idle) of T61, the same operations as in the periods of T3, T4, and T5 in FIG. 8A are performed, respectively.

Such an initial sequence, as shown in FIG. 8A, if the SSD configuration information (SDCFG) is stored in the memory module NVMMD0 (nonvolatile memory device NVM10 to NVM17) in advance, it is possible to execute the initial sequence when power is supplied at a high speed. On the other hand, as shown in FIG. 8B, when the SSD configuration information (SDCFG) is transmitted to the memory module NVMMD0 from the information processor CPU_CP, it is possible to appropriately customize a configuration (usage) of the memory module NVMMD0 according to an operation purposes of the information processing system.

<<Details about Physical Address Table>>

FIG. 9 is a diagram illustrating a configuration example of the physical address table stored in the random access memory in FIG. 1. The physical address table PADTBL includes a physical address (PAD [31:0]), a valid flag PVLD corresponding to each physical address PAD, an erase count PERC, a layer mode number LYM, and a layer count LYC, and is stored in the random access memory RAM in FIG. 1. When the value of the valid flag PVLD is 1, this represents that the corresponding physical address PAD is valid, and when the value of the valid flag PVLD is 0, this represents that the corresponding physical address PAD is invalid. For example, when a physical address allocated to a logical address is changed based on the write physical address table (NXPADTBL), the value of the valid flag PVLD of the physical address PAD allocated after change becomes 1, and the value of the valid flag PVLD of the physical address PAD allocated before change becomes 0.

The erase count PERC represents the number of times of the above-described initial writing (erase). Here, for example, if the physical address PAD in which the value of the valid flag PVLD is 0 and the number of times of the initial writing (erase) is small is preferentially allocated to the logical address, the value of the erase count PERC can be wear-leveled. Further, in the example in FIG. 9, the information processing circuit MNGER in FIG. 2 is configured so that the physical address PAD recognizes "00000000" to "027FFFFF" as a first physical address area PRNG1 and recognizes "02800000" to "07FFFFFF" as a second physical address area PRNG2 to manage the physical address table PADTBL. Further, although not particularly limited, the physical address PAD (PAD [31:0]) is configured to have a physical segment address SGAD (PAD [31:16]), and a segment-based physical offset address PPAD (PAD [15:0]).

Further, when the layer mode number LYM is "0", this represents that the writing is performed in all the phase change memory cells CL0 to CLn in the chain memory array CY (that is, the above-described second operation mode). Further, when the layer mode number LYM is "1", this represents that the writing is performed in one phase change memory cell in the chain memory array CY (that is, the above-described first operation mode).

In addition, a value x of the layer count LYC corresponds to the memory cell selection line LYx in the chain memory array CY in FIG. 4 or the like. For example, when the layer count LYC is "1", data corresponding to the physical address PAD is retained in the phase change memory cell CL1 selected to the memory cell selection line LY1 in the chain memory array CY shown in FIG. 4 or the like and is valid.

<<Details about Physical Segment Table>>

FIGS. 10A and 10B are diagrams illustrating a configuration example of a physical segment table stored in the random access memory in FIG. 1. FIG. 10A shows a physical segment table PSEGTBL1 relating to invalid physical addresses, and FIG. 10B shows a physical segment table PSEGTBL2 relating to valid physical addresses. Although not particularly limited, an upper PAD [31:16] of the physical address PAD (PAD [31:0]) represents the physical segment address SGAD. Further, although not particularly limited, a main data size of one physical address corresponds to 512 bytes, and a main data size of one segment corresponds to 32 Mbytes by collection of 65536 physical addresses.

First, FIG. 10A will be described. The physical segment table PSEGTB1 includes an invalid physical address total number TNIPA, a maximum erase count MXERC and a corresponding invalid physical offset address MXIPAD, and a minimum erase count MNERC and a corresponding invalid physical offset address MNIPAD, for each physical segment address SGAD (PAD [31:16]). The invalid physical address total number TNIPA represents the total number of physical addresses in the invalid state in the corresponding physical segment address SGAD. Further, the maximum erase count MXERC and the corresponding invalid physical offset address MXIPAD, and the minimum erase count MNERC and the corresponding invalid physical offset address MNIPAD are extracted from the physical addresses in the invalid state. Further, the physical segment table PSEGTBL1 is stored in the random access memory RAM in FIG. 1.

Next, FIG. 10B will be described. The physical segment table PSEGTB2 includes a valid physical address total number TNVPA, a maximum erase count MXERC and a corresponding valid physical offset address MXVPAD, and a minimum erase count MNERC and a corresponding valid physical offset address MNVPAD, for each physical segment address SGAD (PAD [31:16]). The valid physical address total number TNVPA represents the total number of physical addresses in the valid state in the corresponding physical segment address SGAD. Further, the maximum erase count MXERC and the corresponding valid physical offset address MXVPAD, and the minimum erase count MNERC and the corresponding valid physical offset address MNVPAD are extracted from the physical addresses in the valid state. Further, the physical segment table PSEGTBL2 is stored in the random access memory RAM in FIG. 1. The physical segment tables PSEGTBL1 and PSEGTBL2 are used when dynamic wear leveling or static wear leveling to be described later is performed.

<<Details about Write Physical Address Table>>

FIGS. 11A and 11B are diagrams illustrating a configuration example of a physical segment table stored in the control circuit in FIG. 2 or the random access memory in FIG. 1. FIG. 11A shows a state of the write physical address table NXPADTBL in the initial state where the use of the device starts, and FIG. 11B shows a state of the write physical address table NXPADTBL after the content is appropriately updated. The write physical address table NXPADTBL is a table that determines which physical address is preferentially allocated to the logical address when a write command associated with the logical address is received from the host (CPU_CP in FIG. 1) to write data in the physical address of the nonvolatile memory devices NVM10 to NVM17.

The write physical address table NXPADTBL is configured to be able to register plural (N) physical addresses. Here, the write physical address table NXPADTBL (NXPADTBL1, NXPADTBL2) determines a physical address to actually become a write target. Further, a time from the time when the logical address is received to the time when the physical address is determined using the table affects the writing speed. Thus, information about the write physical address table NXPADTBL (NXPADTBL1, NXPADTBL2) is retained in the write physical address tables NXPTBL1 and NXPTBL2 in the control circuit MDLCT0 in FIG. 2, and is retained in the random access memory RAM as a backup.

The write physical address table NXPADTBL includes an entry number ENUM, a write physical address NXPAD, a valid flag NXPVLD corresponding to the write physical address NXPAD, an erase count NXPERC, a layer mode number NXLYM, and a write layer count NXLYC. When two logical address areas (LRNG1 and LRNG2) are determined in the SSD configuration information (SDCFG), the control circuit MDLCT0 in FIG. 2 divides the write physical address table NXPADTBL into two parts. Here, N/2 areas from entry number 0 to entry number (N/2−1) are managed as the write physical address table NXPADTBL1, and the remaining N/2 areas from entry number (N/2−1) to entry number (N−1) are managed as the write physical address table NXPADTBL2. Further, the write physical address table NXPADTBL1 is used with respect to a write request to the logical address area (LRNG1), and the write physical address table NXPADTBL2 is used with respect to a write request to the logical address (LRNG2).

The entry number ENUM represents an N value (0 to (N−1)) in plural sets of writing physical addresses NXPAD, and the N value represents a write priority (registration count). The N values in the write physical address table NXPADTBL1 are preferentially used in the ascending order with respect to the write request to the logical address area (LRNG1), and the N values in the write physical address table NXPADTBL2 are preferentially used in the ascending order with respect to the write request to the logical address area (LRNG2). Further, when the value of the valid flag NXPVLD is 0, this represents that a target physical address is invalid, and when the value of the valid flag NXPVLD is 1, this represents that a target physical address is valid. For example, when the entry number ENUM=0 is used, since the value of the valid flag NXPVLD of the entry number ENUM=0 becomes 1, it is possible to determine that the use of the entry number ENUM 0 is completed when the table is referenced next time, and thereafter, the entry number ENUM=1 can be used.

Here, in FIG. 11A, using an example where N=32, initial setting (for example T1 to T3 in FIG. 8) of the write physical address table NXPADTBL will be described.

First, the physical address area (PRNG1) is set corresponding to the logical address area (LRNG1), and the write physical addresses NXPAD that are continuous from "00000000" address to "0000000F" address in the physical address area (PRNG1) are respectively registered from the entry number ENUM=0 to the entry number ENUM=((32/2)−1). Further, the layer mode number NXLYM is set to "1", and the write layer count NXLYC is set to "0". This represents that the operation mode is the first operation mode and the memory cell selection line to be used is LY0, similar to the layer mode number LYM and the layer count LYC described in FIG. 9.

Similarly, the physical address area (PRNG2) is set corresponding to the logical address area (LRNG2), and the write physical addresses NXPAD that are continuous from "02800000" address to "0280000F" address in the physical address area (PRNG2) are respectively registered from the entry number ENUM=(32/2) to the entry number ENUM=(32−1). Further, the layer mode number NXLYM is set to "0", and the write layer count NXLYC is set to "0". This represents that the operation mode is the second operation mode, similar to the layer mode number LYM and the layer count LYC described in FIG. 9. Further, the valid flag NXPVLD and the erase count NXPERC corresponding to the write physical address NXPDA are all set to "0".

Next, it is assumed that a write request (WQ) of which a sector count (SEC) value is 1 (512 bytes) is input (N/2) times to the logical address area (LRNG1) of the memory module (semiconductor device) NVMMD0 from the information processor CPU_CP through the interface signal HDH_IF. In this case, data included in each write request (WQ) is written to a location corresponding to continuous addresses from "00000000" address to "0000000F" address of the physical address PAD (NXPAD) in the nonvolatile memory device based on a state illustrated in FIG. 11A.

Further, in a state illustrated in FIG. 11A it is assumed that a write request (WQ) of which a sector count (SEC) value is 1 (512 bytes) is input (N/2) times to the logical address area (LRNG2) of the memory module NVMMD0 from the information processor CPU_CP through the interface signal HDH_IF. In this case, data included in each write request (WQ) is written to a location corresponding to continuous addresses from "00000000" address to "0000000F" address of the physical address PAD (NXPAD) in the nonvolatile memory device based on FIG. 11A.

In addition, another operation example will be described. It is assumed that a write request (WQ) of which a sector count (SEC) value is 16 (8 K-bytes) is input once to the logical address area (LRNG1) of the memory module NVMMD0 from the information processor CPU_CP through the interface signal HDH_IF. In this case, data included in each write request (WQ) is divided into 16 physical addresses PAD of every 512 bytes, and is written to the nonvolatile memory device corresponding to continuous addresses from "00000000" address to "0000000F" address of the physical address PAD.

In addition, it is assumed that a write request (WQ) of which a sector count (SEC) value is 16 (8 K-bytes) is input once to the logical address area (LRNG2) of the memory module NVMMD0 from the information processor CPU_CP through the interface signal HDH_IF. In this case, data included in each write request (WQ) is divided into 16 physical addresses PAD of every 512 bytes, and is written to the nonvolatile memory device corresponding to continuous addresses from "02800000" address to "0280000F" address of the physical address PAD.

Further, the write physical address table NXPADTBL is appropriately updated while such a writing operation is being performed, and consequently, as shown in FIG. 11B, the values of the write physical address NXPAD, the erase count NXPERC, the write layer count NXLYC and the like are approximately changed. Here, since the memory cell selection line LY according to the first operation mode described in FIG. 17 or the like sequentially shifts, the value of the write layer count NXLYC in the write physical address table NXPADTBL1 is accordingly changed. On the other hand, the value of the write layer count NXLYC in the write physical address table NXPADTBL2 is not particularly changed according to the second operation mode described in FIG. 18 or the like. The update of the write physical address table NXPADTBL can be performed by using a period where the writing is actually performed to the phase change memory cell in the memory array.

<<Initial Setting of Address Conversion Table and Nonvolatile Memory Device>>

FIG. 12A is a diagram illustrating a configuration example of an address conversion table stored in the random access memory in FIG. 1 and an example of the state after initial setting, and FIG. 12B is a diagram illustrating an example of the state after initial setting in the nonvolatile memory device in FIG. 1. The initial setting may be performed by the control circuit MDLCT0 during the period of T1 (immediately after power is supplied) in FIG. 8, for example.

The address conversion table LPTBL shown in FIG. 12A manages a currently allocated physical address PAD, a valid flag CPVLD of the physical address, and a layer count LYC of the physical address for each logical address LAD, with respect to all the logical addresses LAD. After the initial setting, all the physical addresses PAD with respect to all the logical addresses LAD are set to 0, the valid flag CPVLD is set to 0 (invalid), and the layer count LYC is set to "0". Further, as shown in FIG. 12B, in the nonvolatile memory devices NVM10 to NVM17, data DATA stored in each physical address PAD is set to 0, and the logical address LAD corresponding to each physical address PAD and the data valid flag DVF are also set to 0. In addition, the layer count LYC corresponding to each physical address PAD is set to "0". The logical address LAD, the data valid flag DVF, and the layer count LYC are recorded using a predetermined redundancy area in the nonvolatile memory device, for example.

<<Details about SSD Configuration Information>>

FIGS. 13A, 13B, and 13C are diagrams illustrating different examples of the SSD configuration information (SDCFG) stored in the nonvolatile memory device NVM0 for booting in FIG. 1. In the respective drawings, LRNG represents a logical address area, and represents a range of the logical address LAD in sector units (512 bytes). CAP represents a logical data capacity value in a range determined by the logical address area LRNG. The logical address area LRNG1 occupies a logical address LAD space of "0000_0000" to "007F_FFFF" as hexadecimal digits, and has a capacity of 4 Gbytes. Further, the logical address area LRNG2 occupies a logical address space of "0080_0000" to "037F_FFFF" as hexadecimal digits, and has a size of 32 Gbytes.

Further, CHNCELL in the drawings represents the number of memory cells that are data writing targets in all the phase change memory cells CL0 to CLn in the chain memory array CY shown in FIG. 3B, or the like. For example, as shown in FIGS. 13A and 13B, if CHNCELL is "18", this represents that the writing is performed with respect to one memory cell among eight memory cells in the chain memory array CY. If CHNCELL is "88", this represents that the writing is performed with respect to eight memory cells among eight memory cells in the chain memory array CY. Further, for example, as shown in FIG. 13C, if CHNCELL is "28", this represents that the writing is performed with respect to two memory cells among eight memory cells in the chain memory array CY.

In addition, if NVMMODE in the drawings is "0", this represents that, when data is written to the nonvolatile memory device NVM, the writing operation is performed with the minimum erase data size and the minimum program data size being the same, and if NVMMOD is "1", this represents that the writing operation is performed on the assumption that the minimum erase data size is different from the minimum program data size. ERSSIZE in the drawings represents the minimum erase data size [bytes], and PRGSIZE represents the minimum program data size [bytes]. For example, if the nonvolatile memory device NVM is the resistance change storage element, as shown in FIGS. 13A and 13B, NVMNODE is set to "0", and the minimum erase data size (ERSSIZE) and the minimum program data size (PRGSIZE) are all set to have the same size, that is, "512". In this case, the writing operation can be performed at high speed.

On the other hand, if the nonvolatile memory device NVM is a NAND-type flash memory, for example, when a block erase size of the NAND-type flash memory is 512 Kbytes and a page size is 4 Kbytes, as shown in FIG. 13C, NVMMODE is set to 1. Further, according to specification of the NAND-type flash memory, by setting the minimum erase data size (ERSSIZE) to 512 Kbytes and the minimum program data size (PRGSIZE) to 4 Kbytes, it is also possible to handle a writing operation to a NAND-type flash memory in the related art. In this way, it is possible to reflect the specification of the nonvolatile memory device to be used to flexibly handle the writing operation.

Further, if TESTMODE in the drawings is "1", immediately after power is supplied, a test operation of confirming maintenance performance of data stored in physically adjacent memory cells. The test operation is performed using a test area (TESTAREA) formed by physically adjacent plural chain memory arrays CY which are prepared in advance to perform the test. The test operation is described below.

Although not particularly limited, the number of the physically adjacent chain memory arrays CY in the test area (TESTAREA) is 25 (5 chain×5 chain), and it is assumed that these chain memory arrays CY are [X, Y] arranged from CY [1, 1] to CY [5, 5]. First, the variable resistance storage element R of all the phase change memory cells in 25 chain memory arrays CY [1, 1] to CY [5, 5] is set to the high resistance state (write "0"). Then, the variable resistance element R of all the phase change memory cells of one middle chain memory array CY [3, 3] among 25 chain memory arrays CY [1, 1] to CY [5, 5] is set to the low resistance state (write "1").

Next, data retained in all the phase change memory cells of the chain memory arrays CY [2, 2] to CY [2, 4], CY [3, 2], CY [3, 4], and CY [4, 2] to CY [4, 4] which are most adjacent among the chain memory arrays which surround the chain memory array CY [3, 3] is read. If the data read as described above is all "0", by writing "1", it is possible to confirm that "0" data retained in the most adjacent memory cells is not lost.

Then, data retained in all the phase change memory cells of the chain memory arrays that are second most adjacent among the chain memory arrays which surround the chain memory array CY [3, 3] is read. That is, data about the chain memory arrays CY [1, 1] to CY [1, 5], CY [2, 1], CY [2, 5], CY [3, 1], CY [3, 5], CY [4, 1], CY [4, 5], and CY [5, 1] to CY [5, 5] is read. If the data read from all the phase change memory cells in the second most adjacent chain memory array is all "0", by writing "1", it is possible to confirm that "0" data retained in the secondly adjacent memory cell is not lost.

Subsequently, the same operation is performed in a state where "0" and "1" are inverted. That is, in a state where "1" is written to 25 chain memory arrays CY [1, 1] to CY [5, 5], "0" is written to one middle chain memory array CY [3, 3] to read data about the peripheral chain memory arrays CY. The number of physically adjacent plural chain memory arrays CY in the test area (TESTAREA) is not particularly limited, and may be a numerical value suitable for confirming the data maintenance performance.

In FIGS. 13A, 13B, and 13C, TESTCELL information represents information necessary for determining continuous memory cell areas (TAREA) for performing testing. When TESTCELL is 5, the size of the memory areas (TAREA) becomes physically adjacent five plural chain memory arrays CY. The value of the TESTCELL information may be programmed as a numerical value suitable for confirming the data maintenance performance.

ECCFLG in the drawings represents a data unit when error check and correct (ECC) is performed. Although not particularly limited, when ECCFLG is 0, ECC is performed in the unit of 512-byte data, and when ECCFLG is 1, ECC is performed in the unit of 2048-byte data. Similarly, when ECCFLG is 2, 3, and 4, ECC is performed in the unit of 4096-byte data, 8192-byte data, and 16384-byte data, respectively. Further, when ECCFLG is 5, 6, 7 and 8, ECC is performed in the unit of 32-byte data, 64-byte data, 128-byte data, and 256-byte data, respectively.

There are various storage devices such as a hard disk, a solid state drive, a cache memory or a main memory, which have different units of data reading or writing. For example, in the storage device such as a hard disk or an SSD, data reading or writing is performed in the unit of 512-byte or more data. Further, in the cache memory, data reading or data writing is performed between the cache memory and a main memory in the unit of line sizes (32 bytes, 64 bytes or the like). In this way, even when data units are different, it is possible to perform ECC in different data units using ECCFLG, and to flexibly handle a request to the memory module (semiconductor device) NVMMD0.

Further, write method selection information WRTFLG in the drawings represents a writing method during writing. Although not particularly limited, when the write method selection information WRTFLG is 0, the writing is performed by a normal method, and when WRTFLG is 1, inverted data is written. Further, when the write method selection information WRTFLG is 2, data is read once before data writing, and then, the data is written.

In this way, since the SSD configuration information (SD-CFG) can be appropriately programmed, it is possible to flexibly handle the process according to levels or the like of function, performance, and reliability necessary for the memory module (semiconductor device) NVMMD0.

<<Configuration Example of Write Data>>

FIG. 14A is a diagram illustrating a configuration example of data to be written to the nonvolatile memory devices NVM10 to NVM17 from the control circuit MDLCT0 in the memory module NVMMD0 in FIG. 1. FIGS. 14B and 14C are diagrams illustrating configuration examples of data writing layer information in FIG. 14A. In FIG. 14A, although not particularly limited, write data (page data) PGDAT includes main data DArea (512 bytes), and redundant data RArea (16 bytes). The redundant data RArea includes a data inversion flag INVFLG, a write flag WTFLG, an ECC flag ECCFLG, state information STATE, area information AREA, data writing layer information LYN, an ECC code ECC, bad block information BADBLK, and a reserve area RSV.

The data inversion flag INVFLG represents whether the main data DArea written to the nonvolatile memory devices NVM10 to NVM17 by the control circuit MDLCT0 is data obtained by inverting each bit of the original write data. When 0 is written in the data inversion flag INVFLG, this represents that data is written without inverting each data of the original main data. When 1 is written, this represents that data obtained by inverting each bit of the original main data is written.

The write flag WTFLG represents a writing method executed when the control circuit MDLCT0 writes the main data DArea to the nonvolatile memory devices NVM10 to NVM17. Although not particularly limited, when 0 is written in WTFLG, the main data DArea is written by a normal method, and when 1 is written in WTFLG, data obtained by inverting each bit of the original main data is written. When 2 is written in WTFLG, data is read once before writing the data, and then, only data necessary for rewriting is written.

When the control circuit MDLCT0 writes the main data DArea to the nonvolatile memory devices NVM10 to NVM17, the ECC flag ECCFLG represents the size of the main data DArea to which the ECC code is generated. Although not particularly limited, when 0 is written to ECCFLG, this represents that a code is generated with respect to the data size of 512 bytes, and when 1 is written to ECCFLG, this represents that a code is generated with respect to the data size of 1024 bytes. When 2 is written to ECCFLG, this represents that a code is generated with respect to the data size of 2048 bytes, and when 3 is written to ECCFLG, this represents that a code is generated with respect to the data size of 32 bytes.

The ECC code ECC represents data necessary for detecting and correcting an error of the main data DArea. When the control circuit MDLCT0 writes the main data DArea to the nonvolatile memory devices NVM10 to NVM17, ECC is generated corresponding to the main data DArea by the control circuit MDLCT0, and is written to the redundant data RArea. The state information STATE represents that the main data DArea written to the nonvolatile memory devices NVM10 to NVM17 is a valid state, an invalid state, or an erase state. Although not particularly limited, when 0 is written to the state information STATE, this represents that the main data DArea is in the invalid state, and when 1 is written to the state information STATE, this represents that the main data DArea is in the valid state. When 3 is written to the state information STATE, this represents that the main data DArea is in the erase state.

Figure 15:
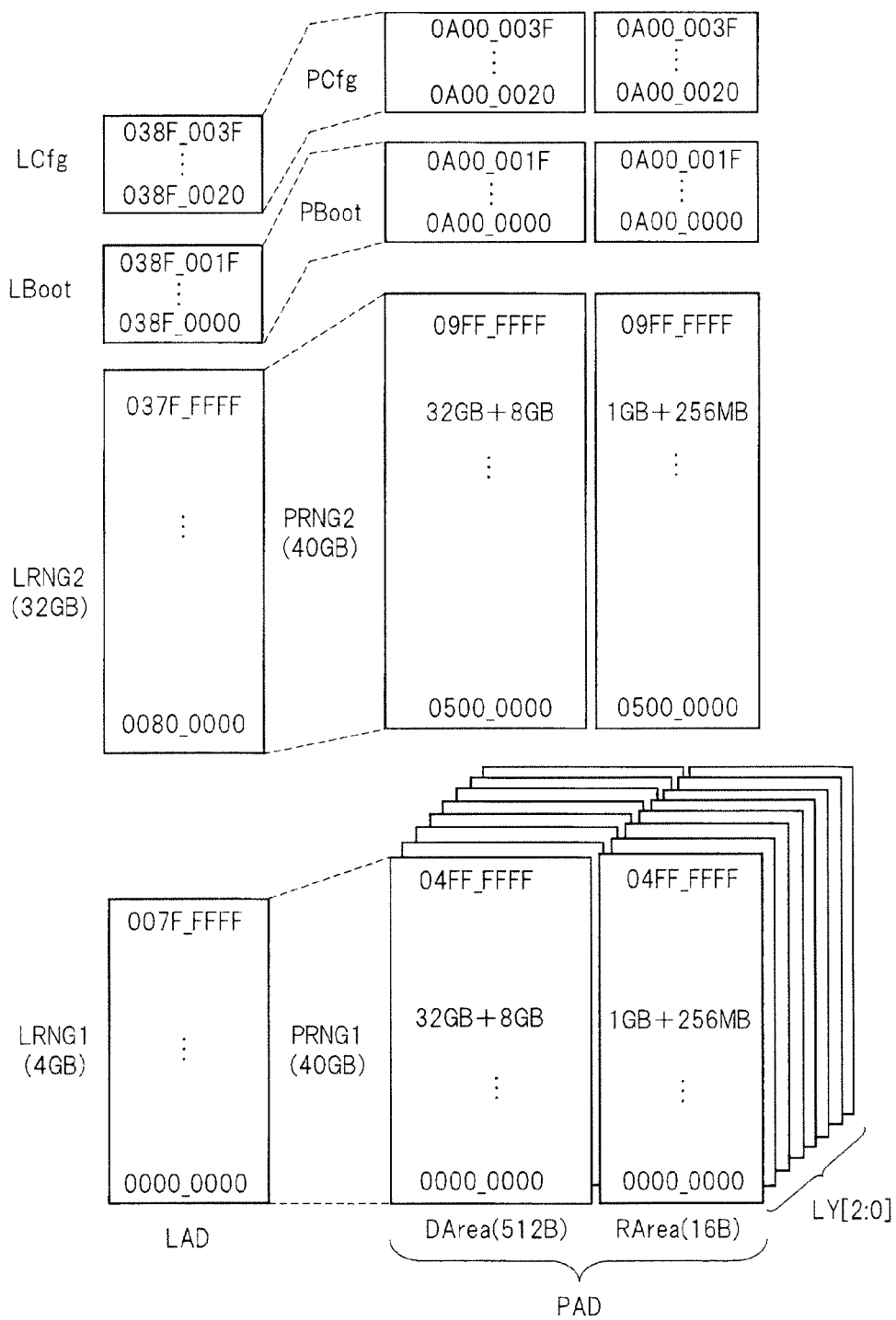
FIG. 15 is a diagram illustrating an example of an address map range stored in the random access memory in FIG. 1.

The area information AREA is information indicating whether data in which the main data DArea is written is written to the first physical address area PRNG1 or the second physical address area PRNG2 in the address map range (ADMAP) shown in FIG. 15. Although not particularly limited, when the value of the area information AREA is 1, this represents that the main data DArea is written to the first physical address area PRNG1, and when the value of the area information AREA is 2, this represents that the main data DArea is written to the second physical address area PRNG2.

Further, in FIGS. 14B and 14C, data writing layer information LYN [n:0] represents information indicating which memory cell among the phase change memory cells CL0 to CLn in the chain memory array CY valid data is written in. In initial setting, LYN [n:0] is set to 0. In this example, a case where eight phase change memory cells CL0 to CL7 are included in the chain memory array CY is shown.

The data writing layer information LYN is configured to have 8 bits of LYN [7:0], and LYN [7] to LYN [0] correspond to phase change memory cells CL7 to CL0, respectively. For example, when valid data is written to the phase change memory cell CL0, "1" is written to LYN [0], and in other cases, "0" is written. Further, for example, when valid data is written to the phase change memory cell CL1, "1" is written to LYN [1], and in other cases, "0" is written. Thereafter, this is similarly applied to the relationship between phase change memory cells CL2 to CL7 and LYN [2] to LYN [7].

In the example of FIG. 14B, since "1" is written to LYN [0], and "0" is written in LYN [7:1], the valid data is written to the phase change memory cell CL0 of the chain memory array CY. In the example of FIG. 14C, since "1" is written to LYN [0] and LYN [4], and "0" is written in LYN [7:5] and LYN [3:1], the valid data is written to the phase change memory cells CL0 and CL4 of the chain memory array CY.

In FIG. 14A, the bad block information BADBLK represents whether the main data DArea written to the nonvolatile memory devices NVM10 to NVM17 is available. Although not particularly limited, when 0 is written to the bad block information BADBLK, this represents that the main data DArea is available, and when "1" is written, this represents that the main data DArea is not available. For example, when error correction is possible by means of ECC, the bad block information BADBLK becomes 0, and when error correction is not possible, the bad block information BADBLK becomes 1. The reserve area RSV is present as an area where the control circuit MDLCT0 can be freely defined.

<<Details about Address Map Range>>

FIG. 15 is a diagram illustrating an example of the address map range (ADMAP) stored in the random access memory in FIG. 1. The address map range (ADMAP) is generated by the control circuit MDLCT0 using the SSD configuration information (SDCFG), shown in FIG. 13A, for example, stored in the NVM10 to NVM17, and is stored in the random access memory RAM, as described with reference to FIG. 8 or the like.

Figure 16:
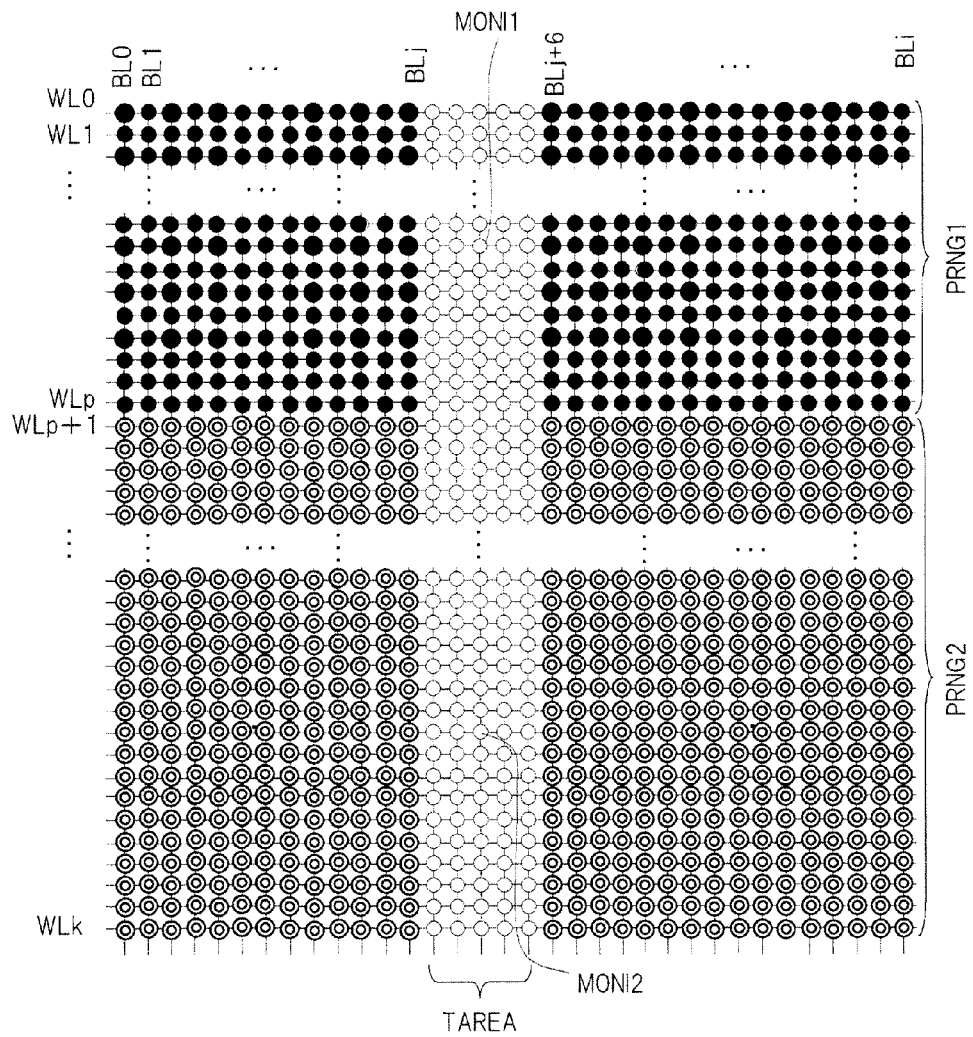
FIG. 16 is a supplemental diagram of FIG. 15, which is a diagram schematically illustrating an arrangement example of writable memory cells set based on the SSD configuration information in FIG. 13A and the address map range in FIG. 15 by the control circuit.

FIG. 16 is a supplemental diagram of FIG. 15, which is a diagram schematically illustrating an arrangement example of writable memory cells set based on the SSD configuration information in FIG. 13A and the address map range (ADMAP) in FIG. 15 by the control circuit MDLCT0. FIG. 16 shows an example of one memory array ARY in the nonvolatile memory device, specifically, an arrangement example thereof. In FIG. 16, the chain memory arrays CY shown in FIG. 4 or the like are disposed at intersections of the word lines WL0 to WLk and the bit lines BL0 to BLi. Here, a range formed by the word lines WL0 to WLp and the bit lines BL0 to BLi is set as a first physical address area PRNG1, and "●" at the intersection therein represents that the writing is performed, for example, with respect to one memory cell among plural memory cells included in the chain memory array. Further, a range formed by the word lines WLp+1 to WLk and the bit lines BL0 to BLi is set as a second physical address area PRNG2, and "◎" at the intersection therein represents that the writing is performed with respect to all the plural memory cells included in the chain memory array.

A testing area TAREA in FIG. 16 represents a memory cell area connected to a bit line BLj+5 from a bit line BLj+1, and includes memory cells corresponding to 5× word line count (k+1). The control circuit MDLCT0 determines the testing area TAREA by TESTCELL information value "5" of the SSD configuration information (SDCFG) shown in FIG. 13A or the like and information about the address map range (ADMAP). In the testing area TAREA, for example, two monitoring memory cells MONI1 and MONI2 are set.

In FIG. 15, LAD represents a logical address to be input to the memory module NVMMD0 from the information processor CPU_CP in the unit of 512-byte data. Further, PAD represents a physical address to be input to the nonvolatile memory devices NVM10 to NVM17 from the control circuit MDLCT0. In the example of FIG. 15, 512-byte main data DArea and 16-byte redundant data RArea are provided in one physical address PAD. The control circuit MDLCT0 converts the logical address LAD into the physical address PAD, and writes the data to the nonvolatile memory devices NVM10 to NVM17.

A logical address area LRNG1 occupies a logical address LAD space of "00000000" to "007F_FFFF" as hexadecimal digits, and has a capacity of 4 Gbytes. On the other hand, the first physical address area PRNG1 corresponding to the logical address area LRNG1 has a physical address PAD space of "0000_0000" to "04FF_FFFF" as hexadecimal digits. The capacity of all the memory cells present in the physical address PAD space corresponding to the first physical address area PRNG1 is configured such that the main data DArea is 32 Gbytes+8 Gbytes and the redundant data RArea is 1 Gbyte+256 Mbytes. In this way, the physical address PAD space in the first physical address area PRNG1 has a space larger than the logical address LAD space, and is operated by the first operation mode described in FIG. 17 or the like.

Further, a logical address area LRNG2 occupies a logical address LAD space of "00800_0000" to "037F_FFFF" as hexadecimal digits, and has a size of 32 Gbytes. The second physical address area PRNG2 corresponding to the logical address area LRNG2 has a physical address PAD space of "0500_0000" to "09FF_FFFF" as hexadecimal digits. The capacity of all the memory cells present in the physical address PAD space corresponding to the second physical address area PRNG2 is configured such that the main data DArea is 32 Gbytes+8 Gbytes and the redundant data RArea is 1 Gbyte+256 Mbytes. In this way, the physical address PAD space in the second physical address area PRNG2 has a space larger than the logical address LAD space, and is operated by the second operation mode described in FIG. 18 or the like.

In addition, a logical boot area LBoot occupies a logical address LAD space of "038F_0000" to "038F_001F" as hexadecimal digits, and a physical boot area PBoot corresponding to the logical boot area LBoot has a physical address PAD space of "0A00_0000" to "0AFF_001F" as hexadecimal digits. The boot program is stored in the physical boot area PBoot area. Further, the boot program can be appropriately rewritten by the information processor CPU_CP.

Furthermore, a logical configuration area LCfg occupies a logical address LAD space of "038F_0020" to "038F_003F" as hexadecimal digits, and a physical configuration area PCfg corresponding to the logical configuration area LCfg has a physical address PAD space of "0A00_0020" to "0AFF_003F" as hexadecimal digits. The SSD configuration information (SDCFG) is stored in the physical configuration area PCfg. Further, the SSD configuration information (SDCFG) can be appropriately rewritten by the information processor CPU_CP.

As described above, since the first physical address area PRNG1 of the memory module (semiconductor device) NVMMD0 has a size ten times larger than that of the logical address area LRNG1, the number of times allowable rewriting using the logical address area LRNG1 becomes ten times the number of times of allowable rewriting using the logical address area LRNG2, which prolongs the service time. Further, since the writing is performed with respect to only a part (for example, one) memory cell among eight memory cells included in the chain memory array, high speed writing can be realized. On the other hand, since the second physical address area PRNG2 of the memory module (semiconductor device) NVMMD0 has the same size as that of the logical address area LRNG2, the capacity is large compared with a case where the logical address area LRNG1 is used. Furthermore, since the boot program or the SSD configuration information (SDCFG) can be appropriately programmed, the memory module NVMMD0 can flexibly satisfy a desired service life or performance.

<<Writing Operation Flow of Memory Module (Semiconductor Device)>>

Figure 20:
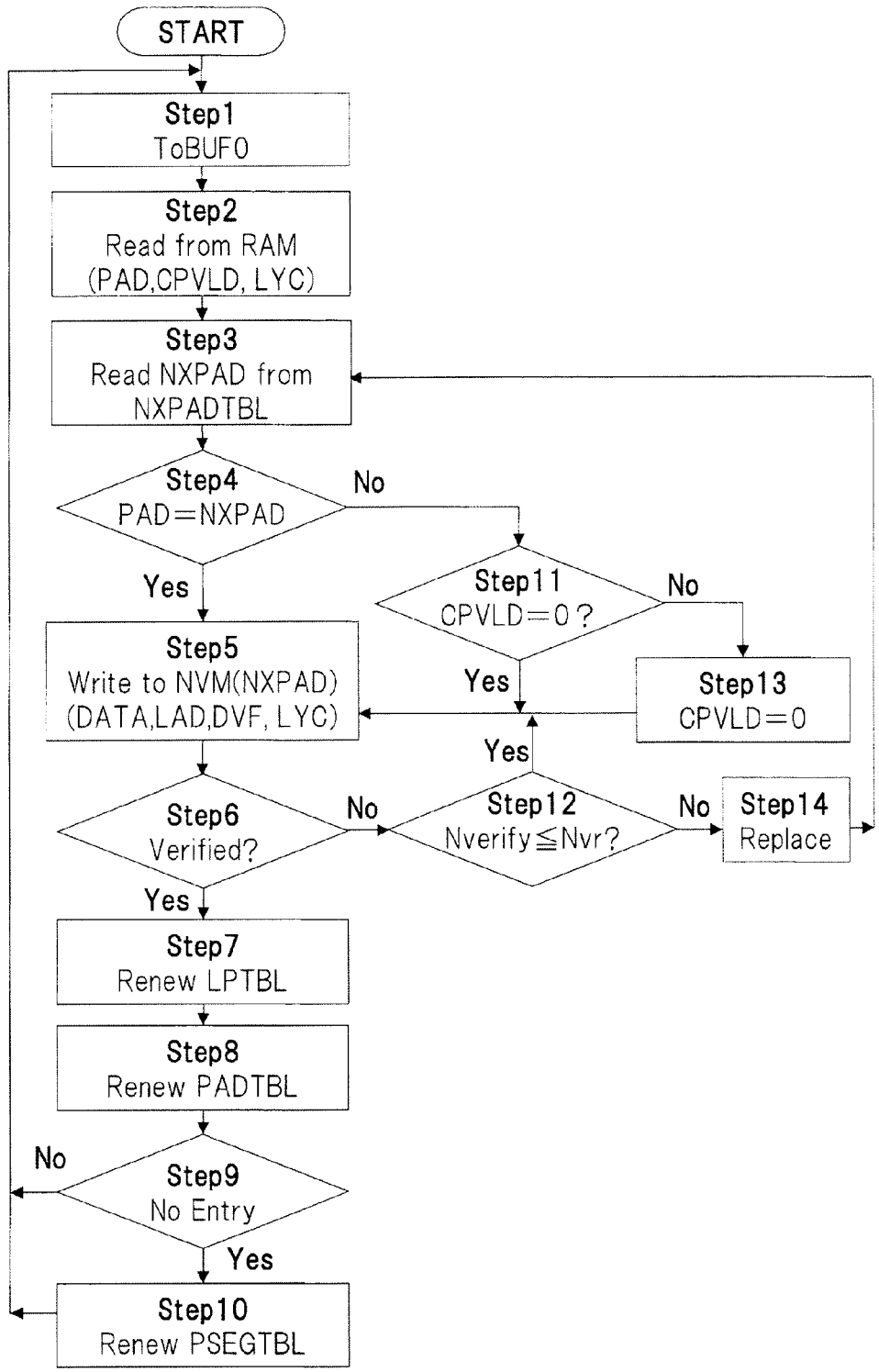
FIG. 20 is a flowchart illustrating an example of a detailed write processing routine performed in a memory module when a write request is input to the memory module from an information processor in FIG. 1.

FIG. 20 is a flowchart illustrating an example of a detailed write processing routine performed in the memory module MVMMD0 when a write request (WREQ01) is input to the memory module MVMMD0 from the information processor CPU_CP in FIG. 1. Here, the processing content of the information processing circuit MNGER in FIG. 2 is mainly shown, and the information processing circuit MNGER is not particularly limited, but performs writing to the nonvolatile memory devices NVM10 to NVM17 by making one physical address correspond to each size of 512-byte main data DArea and 16-byte redundant data RArea.

First, a write request (WQ01) in which a logical address value (for example, LAD=0), a data write command (WRT), a sector count value (for example, SEC=1), and 512-byte write data (WDATA0) are included is input to the control circuit MDLCT0 from the information processor CPU_CP. The interface circuit HOST_IF in FIG. 2 extracts clock information embedded in the write request (WQ01), converts the write request (WQ01) that is serial data into parallel data, and transfers the result to the buffer BUF0 and the information processing circuit MNGER (Step 1).

Then, the information processing circuit MNGER interprets the logical address value (LAD=0), the data write command (WRT), and the sector count value (SEC=1), and retrieves the address conversion table LPTBL (FIG. 12A) in the random access memory RAM. Thus, the information processing circuit MNGER reads a current physical address value (for example, PAD=0) stored in the address of the logical address value (LAD=0), the value of the valid flag CPVDL corresponding to the physical address value (PAD=0), and the layer count LYC. Further, the information processing circuit MNGER reads the erase count value (for example, PERC=400) and the valid flag PVLD value corresponding to the physical address value (PAD=0) from the physical address table PADTBL (FIG. 9) in the random access memory RAM (Step 2).

Then, the information processing circuit MNGER determines whether the logical address value (LAD=0) input to the control circuit MDLCT0 from the information processor CPU_CP is the logical address value in the logical address area LRNG1 or the logical address value in the logical address area LRNG2 using the address map range (ADMAP) (FIG. 15) stored in the random access memory RAM.

Here, when the logical address value (LAD=0) is the logical address value in the logical address area LRNG1, the information processing circuit MNGER refers to the write physical address table NXPADTBL1 in FIG. 11, and when the logical address value (LAD=0) is the logical address value in the logical address area LRNG2, the information processing circuit MNGER refers to the write physical address table NXPADTBL2. In reality, as described above, the tables are stored in the write physical address tables NXPTBL1 and NXPTBL2 in FIG. 2. The information processing circuit MNGER reads necessary data corresponding to the number designated in the sector count value (SEC=1) in the descending order of writing priority (that is, in the descending order of the entry number ENUM). In this case, the write physical address (for example, NXPAD=100) corresponding to one piece of data, the valid flag NXPVLD value corresponding to the write physical address (NXPAD=100), the erase count NXPERC value, and the write layer count NXLYC are read (Step 3).

Then, the information processing circuit MNGER determines whether the current physical address value (PAD=0) and the write physical address value (NXPAD=100) that becomes the next write target are the same (Step 4). If the current physical address value (PAD=0) and the write physical address value (NXPAD=100) are the same, the information processing circuit MNGER executes Step 5, and if the current physical address value (PAD=0) and the write physical address value (NXPAD=100) are different from each other, the information processing circuit MNGER executes Step 11. In Step 5, the information processing circuit MNGER writes various pieces of data to the addresses corresponding to the physical address value (NXPAD=100) in the nonvolatile memory devices NVM10 to NVM17. Here, write data (WDATA0) is written as the main data DArea shown in FIG. 14A, and the data inversion flag INVFLG, the write flag WTFLG, the ECC flag ECCFLG, the state information STATE, the data write layer information LYN, and the ECC code ECC are written as the redundant data RArea. Further, as shown in FIG. 12B, the logical address value (LAD=0) corresponding to the physical address value (NX-PAD=100), the valid flag value (DVF=1), and the layer count LYC are written.

Here, for example, when the write layer count NXLYC read from the write physical address table NXPADTBL1 is 10, the main data DArea (write data (WDATA0)) and the redundant data RArea are written to one phase change memory cell CL0 in each chain memory array CY. Accordingly, "0" is written to the data write layer information LYN [7:1] in the redundant data RArea in FIG. 14, and "1" is written to the data write layer information LYN [0]. On the other hand, for example, when the write layer count NXLYC read from the write physical address table NXPADTBL2 is "00", the main data DArea (write data (WDATA0)) and the redundant data RArea are written to all the phase change memory cells CL0 to CLn in each chain memory array CY. Further, "1" is written to the data write layer information LYN [7:0] in the redundant data RArea.

In FIG. 20, in Step 11, the information processing circuit MNGER determines whether the valid flag CPVLD value corresponding to the physical address value (PAD=0) read from the address conversion table LPTBL (FIG. 12A) is 0. When the valid flag CPVLD value is 0, this represents that the current physical address value (PAD=0) corresponding to the logical address value (LAD=0) is invalid, and represents that only a new physical address value (NXPAD=100) is present as the physical address corresponding to the logical address value (LAD=0). In other words, even though the new physical address value (NXPAD=100) is allocated to the logical address value (LAD=0) as it is, the physical address value is not doubly allocated to the logical address value (LAD=0). Thus, in this case, the information processing circuit MNGER executes the above-described Step 5.

On the other hand, when the valid flag CPVLD value is 1 in Step 11, this represents that the physical address value (PAD=0) corresponding to the logical address value (LAD=0) is still valid. Accordingly, when the new physical address value (NXPAD=100) is allocated to the logical address value (LAD=0) as it is, the physical address value is doubly present with respect to the logical address value (LAD=0). Thus, in Step 13, the information processing circuit MNGER changes the valid flag CPVLD value of the physical address value (PAD=0) corresponding to the logical address value (LAD=0) in the address conversion table LPTBL to 0 (invalid). In addition, the information processing circuit MNGER also sets the valid flag PVLD corresponding to the physical address value (PAD=0) in the physical address table PADTBL to 0 (invalid). In this way, the information processing circuit MNGER makes the physical address value (PAD=0) corresponding to the logical address value (LAD=0) invalid, and then, executes the above-described Step 5.

In Step 6 subsequent to Step 5, the information processing circuit MNGER and/or the nonvolatile memory devices NVM10 to NVM17 checks whether the write data (WDATA0) is correctly written. If the write data is correctly written, Step 7 is executed, and if the write data is not correctly written, Step 12 is executed. In Step 12, the information processing circuit MNGER and/or the nonvolatile memory devices NVM10 to NVM17 checks whether a verify check count (Nverify) for checking whether the write data (WDATA0) is correctly written is equal to or smaller than a set number (Nvr). If the verify check count (Nverify) is equal to or smaller than the set number (Nvr), Step 5 and Step 6 are executed again. If the verify check count (Nverify) is larger than the set number (Nvr), it is determined that the write data (WDATA0) is not to be written to the write physical address value (NCPAD=100) read from the write physical address tables NXPADTBL1 and NXPADTBL2 (Step 14), and Step S3 is executed again. Such data verification may be performed using the write data verification circuits WV0 to WVm in the nonvolatile memory device shown in FIG. 3A. Further, the data verification may be performed only using an internal circuit of the nonvolatile memory device, or may be appropriately performed in association with the outside (information processing circuit MNGER).

In Step 7 subsequent to Step 6, the information processing circuit MNGER updates the address conversion table LPTBL. Specifically, for example, the new physical address value (NXPAD=100) is written to the address of the logical address value (LAD=0), the valid flag CPVDL value is set to 1, and the write layer count NXLYC is written to the layer count LYC. In the next Step 8, the information processing circuit MNGER updates the physical address table PADTBL. Specifically, a new erase count value obtained by adding 1 to the erase count (NXPERC) of the write physical address value (NXPAD=100) shown in the write physical address table is generated, and the new erase count value is written to a corresponding location in the physical address table PADTBL (erase count (PERC) of the physical address value (NXPAD=100)). Further, the valid flag PVLD in the physical address table PADTBL is set to 1, and the write layer count NXLYC is written to the layer count LYC.

In Step 9, the information processing circuit MNGER determines whether the writing to all the write physical addresses NXPAD stored in the write physical address table NXPADTBL is finished. If the writing to all the write physical addresses NXPAD stored in the write physical address table NXPADTBL is finished, Step 10 is executed, and if the writing to all the write physical addresses NXPAD stored in the write physical address table NXPADTBL is not finished, the information processing circuit MNGER waits for a new write request to the memory module LVMMD0 from the information processor CPU_CP.

In Step 10, for example, at a point of time when the writing to all the write physical addresses NXPAD stored in the write physical address table NXPADTBL is finished, the information processing circuit MNGER updates the physical segment table PSEGTBL (FIG. 10). That is, the information processing circuit MNGER updates the physical segment table PSEGTBL when the entries in the write physical address table NXPADTBL are all used, and also updates the write physical address table NXPADTBL using the result, details of which will be described with reference to FIG. 21.

When updating the physical segment table PSEGTBL, the information processing circuit MNGER refers to the valid flag PVLD and the erase count PERC of the physical address in the physical address table PADTBL. Further, the information processing circuit MNGER updates the invalid physical address total number TNIPA, the maximum erase count MXERC and the corresponding invalid physical offset address MXIPAD, and the minimum erase count MNERC and the corresponding invalid physical offset address MNIPAD, for each physical segment address SGAD, with reference to the physical addresses in which the valid flag PVLD is 0 (invalid) in the physical address table PADTBL. Furthermore, the information processing circuit MNGER updates the valid physical address total number TNVPA, the maximum erase count MXERC and the corresponding valid physical offset address MXVPAD, and the minimum erase count MNERC and the corresponding valid physical offset address MNVPAD, for each physical segment address SGAD, with reference to the physical addresses in which the valid flag PVLD is 1 (valid) in the physical address table PADTBL.

Further, the information processing circuit MNGER updates the write physical address table NXPADTBL. When the updating of the write physical address table NXPADTBL is finished, the write physical address table NXPADTBL waits for a write request from the information processor CPU_CP to the memory module NVMMD0.

In this way, when performing the writing to the nonvolatile memory devices NVM10 to NVM17, since the information processing circuit MNGER uses the write physical address table NXPADTBL, it is possible to realize a high speed writing operation, for example, compared with a case where a physical address with a small erase count is retrieved from the physical address table PADTBL whenever writing is performed. Further, as shown in FIG. 2, when the plural write physical address tables NXPTBL1 and NXPTBL2 are provided, since the respective tables can be independently managed and updated, it is also possible to realize a high speed writing operation. For example, it is possible to update the write physical address table NXPTBL2 while the write physical address table NXPTBL1 is being used, to transit to the write physical address table NXPTBL2 when the write physical address table NXPTBL1 is used up, and to update the write physical address table NXPTBL1 while the write physical address table NXPTBL2 is being used.

<<Updating Method of Write Physical Address Table (Wear Leveling Method [1])>>

Figure 21:
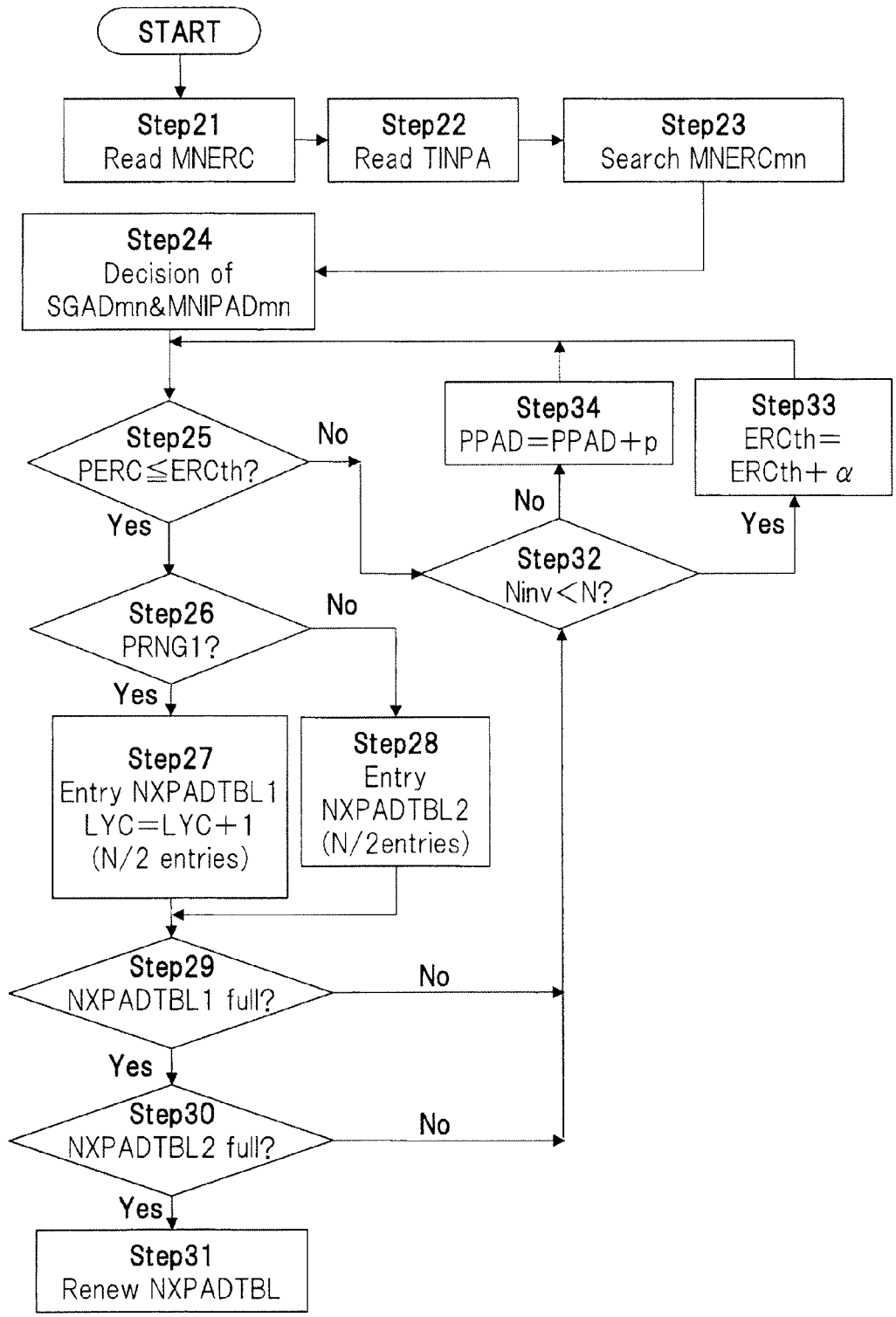
FIG. 21 is a flowchart illustrating an example of an updating method in the write physical address table in FIGS. 11A and 11B.

FIG. 21 is a flowchart illustrating an example of an updating method in the write physical address table in FIGS. 11A and 11B. As shown in FIGS. 11A and 11B, the information processing circuit MNGER manages N/2 entry number EMUM from 0 to (N/2−1) as the write physical address table NXPADTBL1, and manages N/2 entry number EMUM from (N/2) to (N−1) as the write physical address table NXPADTBL2, in the write physical address table NXPADTBL.

Further, in the example of the address range map (AD-MAP) in FIG. 15, an area where the physical address PAD is from "0000_0000" to "04FF_FFFF" represents the first physical address area PRNG1, and an area where the physical address PAD is from "0500_0000" to "09FF_FFFF" represents the second physical address area PRNG2. Accordingly, the range of the physical segment address SGA of the first physical address area PRNG1 is from "0000" to "04FF", and the range of the physical segment address SGA of the second physical address area PRNG2 is from "0500" to "09FF".

The information processing circuit MNGER uses the write physical address table NXPADTBL1 with respect to the physical address PAD in the range of the first physical address area PRNG1 to update the write physical address table NXPADTBL1, and uses the write physical address table NXPADTBL2 with respect to the physical address PAD in the range of the second physical address area PRNG2 to update the write physical address table NXPADTBL2. In order to update the write physical address table NXPADBL, first, a physical segment address is determined, and then, a physical offset address in the determined physical segment address is determined. As shown in FIG. 10A, in the physical segment table PSEGTBL1 in the random access memory RAM, the invalid physical address total number (TNIPA), a physical offset address (MNIPAD) having a minimum erase count among the invalid physical addresses, and the corresponding erase count (MNERC) are stored for each physical segment address SGAD.

Thus, as shown in FIG. 21, first, the information processing circuit MNGER reads the invalid physical address total number (TNIPA), the physical offset address (MNIPAD) having the minimum erase count, and the corresponding erase count (MNERC) with reference to the physical segment table PSEGTBL1 of the random access memory RAM for each physical segment address SGAD (Step 21). Then, the information processing circuit MNGER selects the physical segment addresses SGAD in which the invalid physical address total number (TNIPA) for each physical segment address SGAD is larger than a registration number N of the write physical address table NXPADTBL (Step 22). Further, the information processing circuit MNGER compares the minimum erase count values (MNERC) for the selected physical segment addresses SGAD with each other to obtain a minimum value (MNERCmn) among the minimum erase count values (Step 23).

Then, the information processing circuit MNGER determines a physical segment address (SGADmn) having the minimum value (MNERCmn) and a corresponding physical offset address (MNIPADmn) as first candidates to be registered in the write physical address table NXPADTBL (Step 24). In order to allow the physical segment address SGAD selected in Step 22 to be present, the size of the physical address space may be set to be equal to or larger than a size corresponding to addresses where at least the write physical address table NXPADTBL can be registered, with reference to the size of the logical address space.

Then, the information processing circuit MNGER reads the erase count PERC value corresponding to the physical offset address PPAD which is a current candidate in the above-described physical segment addresses (SGADmn) from the random access memory RAM, with reference to the physical address table PADTBL (FIG. 9), and compares the result with an erase count threshold value ERCth (Step 25). Step 25 is a part of loop processing, and initially, the above-described physical offset address (MNIPADmn) becomes the candidate of the physical offset address PPAD. If the erase count PERC value is the erase count threshold value ERCth or smaller, the information processing circuit MNGER confirms the physical offset address PPAD which is the current candidate as a registration target, and executes Step 26.

On the other hand, if the erase count PERC value is larger than the erase count threshold value ERCth, the information processing circuit MNGER excludes the physical offset address PPAD which is the current candidate from the candidate, and executes Step 32. In Step 32, the information processing circuit MNGER determines whether the number (Ninv) of physical offset addresses in the invalid state having the erase count which is the erase count threshold value ERCth or smaller in the above-described physical segment address (SGADmn) is smaller than the number N of addresses (Ninv<N) where the write physical address table NXPADTBL can be registered. If Ninv is smaller than N, Step 33 is executed, and if Ninv is larger than N, Step 34 is executed with reference to the physical address table PADTBL.

In Step 34, the information processing circuit MNGER performs computation to the physical offset address PPAD which is the current candidate to generate a physical offset address PPAD which is a new candidate, and executes Step 25 again. In Step 34, the information processing circuit MNGER adds a p value to the current physical offset address PPAD to obtain the physical offset address PPAD which is a new candidate. The p value in Step 34 is programmable, and an optimal value thereof may be selected by a minimum data size managed by the information processing circuit MNGER or the configuration of the nonvolatile memory device. In the embodiment, for example, p=8 is used. In Step 33, the information processing circuit MNGER generates the new erase count threshold value ERCth obtained by adding a certain value α to the erase count threshold value ERCth, and executes Step 25 again.

In Step 26, it is checked whether the physical offset address PPAD which becomes the registration target through Step 25 is an address within the first physical address area PRNG1. If the physical offset address PPAD which is the registration target is the address within the first physical address area PRNG1, Step 27 is executed, and if the physical offset address PPAD which is the registration target is not the address within the first physical address area PRNG1 (that is, address within the second physical address area PRNG2), Step 28 is executed.

In Step 27, the information processing circuit MNGER registers an address that includes the above-described physical segment address (SGADmn) in the physical offset address PPAD which is the registration target as the write physical address NXPAD, with respect to the write physical address table NXPADTBL1. In addition, the information processing circuit MNGER registers the valid flag NXPVLD value (here, 0) of the write physical address NXPAD, registers the erase count (PERC) value of the write physical address NXPAD as the erase count NXPERC, and then, registers a value obtained by adding 1 to the current layer count LYC of the write physical address NXPAD as a new layer count NXLYC. Although not particularly limited, N/2 sets of registration can be performed in the write physical address table NXPADTBL1, and the registration is performed in the descending order of the entry numbers ENUM in the write physical address table NXPADTBL1.

As shown in FIG. 3B or the like, when (n+1) phase change memory cells CL0 to CLn are included in the chain memory array CY, the maximum value of the layer umbers LYC (NXLYC) becomes n. In the example of the write physical address table NXPADTBL in FIG. 11, the layer count NXLYC="n" is set. When the layer count LYC (NXLYC) reaches the maximum value n, the value of the new layer count LYC (NXLYC) becomes 0. Since the writing to the nonvolatile memory devices NVM10 to NVM17 is performed using the write physical address table NXPADTBL, the first operation mode described in FIG. 17 or the like can be realized by sequentially shifting the layer count LYC (NXLYC) when the table is updated.

In Step 28, the information processing circuit MNGER registers an address that includes the above-described physical segment address (SGADmn) in the physical offset address PPAD which is the registration target as the write physical address NXPAD, with respect to the write physical address table NXPADTBL2. In addition, the information processing circuit MNGER registers the valid flag NXPVLD value (here, 0) of the write physical address NXPAD, registers the erase count (PERC) of the write physical address NXPAD and the current layer count LYC as the erase count NXPERC and the layer count NXLYC. Although not particularly limited, N/2 sets of registration can be performed, and the registration is performed in the descending order of the entry numbers ENUM in the write physical address table NXPADTBL2. The number of sets of registration of the write physical address tables NXPADTBL1 and NXPADTBL2 can be arbitrarily set by the information processing circuit MNGER, and may be set so that the writing speed to the nonvolatile memory devices NVM10 to NVM17 becomes the maximum.

In the next Step 29, the information processing circuit MNGER checks whether the registration is finished with respect to all sets (all entry numbers) of the write physical address table NXPADTBL1. If all sets of registration are not finished, Step 32 is executed, and if all sets of registrations are finished, Step 30 is executed. In the next Step 30, the information processing circuit MNGER checks whether all sets of registration in the write physical address table NXPADTBL2 is finished. If all sets of registration are not finished, Step 32 is executed, and if all sets of registration are finished, the updating of the write physical address table NXPADTBL is finished (Step 31).

If such an updating flow is used, schematically, the physical address segment of which the erase count is the minimum physical address is determined (Steps 21 to 24), and physical addresses of which the erase count is a predetermined threshold value or lower are sequentially extracted, using the minimum physical address as a starting point, among the physical address segments (Step 25, Steps 32 to 34). Here, if the extraction number does not satisfy a predetermined registration number (Step 32), the physical addresses are sequentially extracted (Steps 25 and 34) until the extraction number satisfies the predetermined registration number (Step 32, Steps 29 and 30) while increasing the threshold value of the erase count step by step (Step 33). Thus, wear leveling (dynamic wear leveling) for wear leveling the erase count can be realized with respect to the physical address in the invalid state (physical address that is not currently allocated to the logical address).

<<Details about Address Allocation of Nonvolatile Memory Devices>>

Figure 22A:
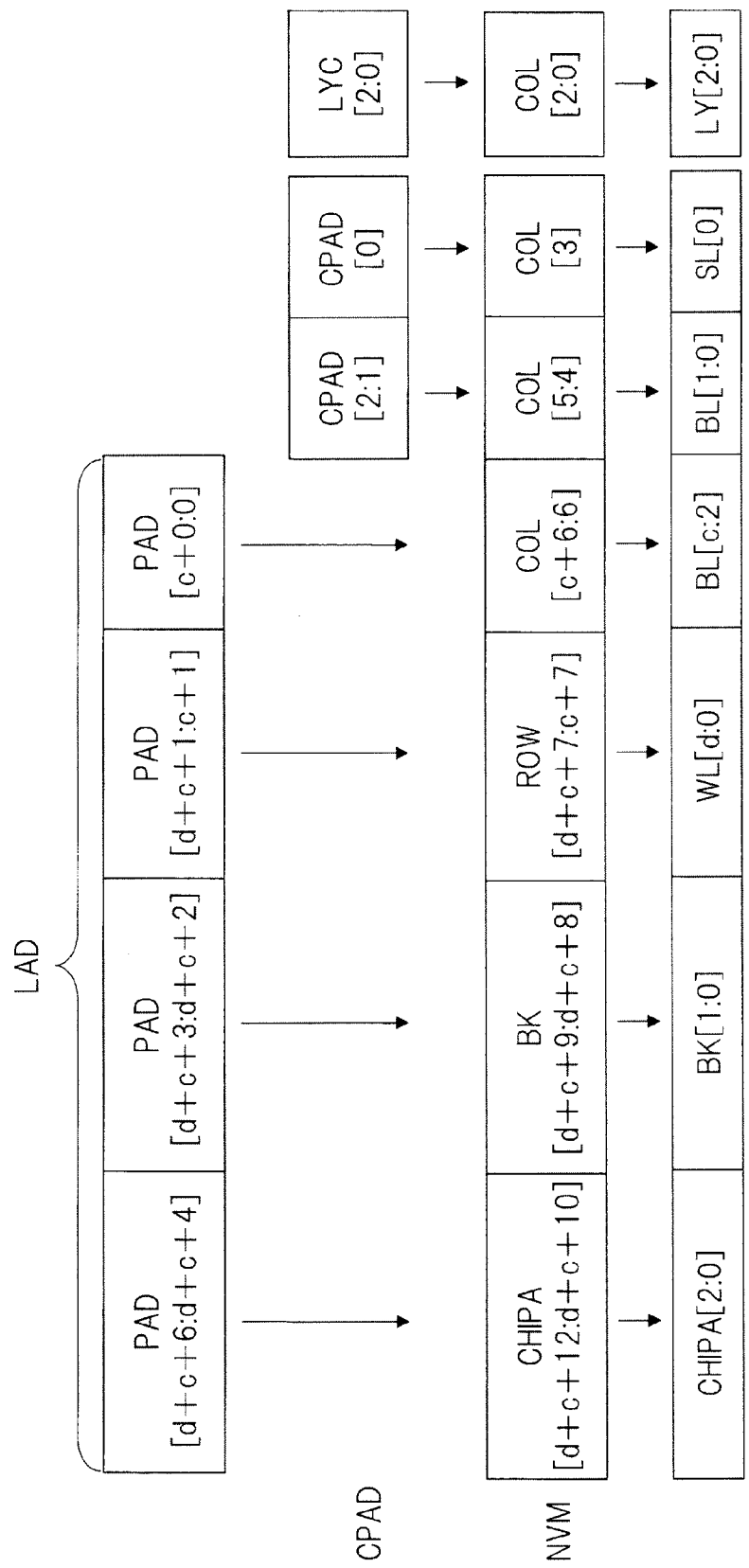
Figure 22B:
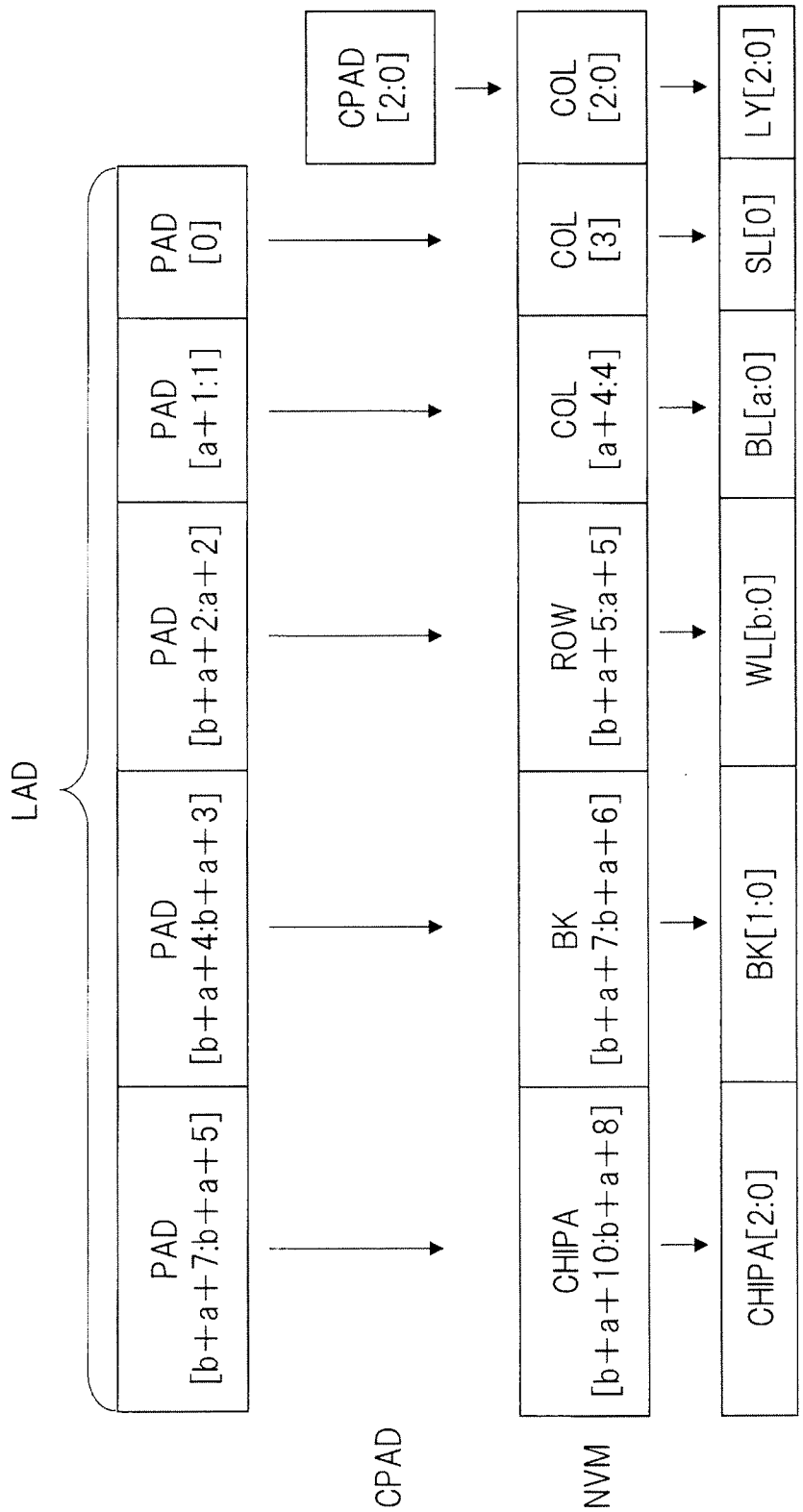

FIG. 22A is a diagram illustrating an example of a correspondence relationship of a logical address, a physical address, and an in-chip address in the nonvolatile memory device allocated to the first physical address area PRNG1 in FIG. 15 or the like. FIG. 22B is a diagram illustrating an example of a correspondence relationship of a logical address, a physical address, and an in-chip address in the nonvolatile memory device allocated to the second physical address area PRNG2 in FIG. 15 or the like.

In FIGS. 22A and 22B, the correspondence relationships of a logical address LAD, a physical address PAD, a physical address CPAD, a chip address CHIPA [2:0] of the nonvolatile memory devices NVM10 to NVM17, a bank address BK [1:0] in each chip, a row address ROW and a column address COL are shown. Further, the correspondence relationship between a layer count LYC and the column address COL, the correspondence relationship between the row address ROW and a word line WL, and the correspondence relationships between the column address COL, and a bit line BL, a chain memory array selection line SL and a memory cell selection line LY are respectively shown.

Although not particularly limited, it is assumed that eight chips are present in the nonvolatile memory devices NVM10 to NVM17, two chain memory array selection lines SL are present in one chip nonvolatile memory device, and eight memory cells and eight memory cell selection lines LY are present in one chain memory array CY. Further, it is assumed that 528 memory arrays ARY are present in one memory bank BK and one chain memory array CY is selected by one memory array ARY. That is, 528chain memory arrays CY are simultaneously selected from one memory bank BK. Further, four memory banks are provided. It is assumed that, in the first physical address area PRNG1 in FIG. 22A, data is maintained in only one memory cell among eight memory cells in one chain memory array CY, and in the second physical address area PRNG2 in FIG. 22B, data is maintained in eight memory cells among eight memory cells in one chain memory array CY.

The address allocation shown in FIGS. 22A and 22B is performed by the information processing circuit MNGER in FIG. 2, for example. In FIG. 22A, when writing data to the nonvolatile memory devices NVM10 to NVM17, the information processing circuit MNGER in FIG. 2 associates the layer count NXLYC (LYC [2:0]) and the physical address NXPAD (PAD [31:0]) stored in the write physical address table NXPADTBL1 (FIGS. 11A and 11B) with the physical address CPAD [2:0]. Further, when reading data from the nonvolatile memory devices NVM10 to NVM17, the information processing circuit MNGER associates the physical address PAD [31:0] stored in the address conversion table LPTBL (FIG. 12A), the layer count LYC [2:0] of the physical address PAD, and the physical address CPAD [2:0].

The layer count LYC [2:0] corresponds to a column address COL [2:0], and the column address COL [2:0] corresponds to a memory cell selection line LY [2:0]. The value of the layer count LYC [2:0] becomes the value of the memory cell selection line LY [2:0], so that data is written to a memory cell designated by the layer count LYC [2:0], and data is read from the memory cell designated by the layer count LYC [2:0].

A physical address CPAD [0] corresponds to a column address COL [3], and the column address COL [3] corresponds to a chain memory array selection line SL [0]. A physical address CPAD [2:1] corresponds to a column address COL [5:4], and the column address COL [5:4] corresponds to a bit line BL [1:0]. A physical address PAD [c+0:0] corresponds to a column address COL [c+6:6], and the column address COL [c+6:6] corresponds to a bit line BL [c:2].

A physical address PAD [d+c+1:c+1] corresponds to a row address ROW [d+c+7:c+7], and the row address ROW [d+c+7:c+7] corresponds to a word line WL [d:0]. A physical address PAD [d+c+3:d+c+2] corresponds to a bank address BK [d+c+9:d+c+8], and the bank address BK [d+c+9:d+c+8] corresponds to a bank address BK [1:0]. A physical address PAD [d+c+6:d+c+4] corresponds to a chip address CHIPA [d+c+12:d+c+10], and the chip address CHIPA [d+c+12:d+c+10] corresponds to a chip address CHIPA [2:0].

Here, for example, a case that main data of 512 bytes and redundant data of 16 bytes are written is considered. Further, it is assumed that the physical address PAD [d+c+6:d+c+4] is 3, the physical address PAD [d+c+3:d+c+2] is 2, the physical address PAD [d+c+1:c+1] is 8, the physical address CPAD [c+0:0] is 0, the physical address CPAD [2:1] is 0, the physical address CPAD [0] is 0, and the layer count LYC [2:0] is 0.

In this case, the information processing circuit MNGER in FIG. 2 increases the value of physical address CPAD [2:0] from 0 to 7 by 1 without changing the layer count LYC value and the physical address PAD value, to write data of 528 bits to the respective addresses, thereby writing data of total 528 byes. Further, on the same assumption, when reading the main data of 512 bytes and the redundant data of 16 bytes, the information processing circuit MNGER in FIG. 2 increases the value of the physical address CPAD [2:0] from 0 to 7 by 1 without changing the layer count LYC value and the physical address PAD value, to read data of 528 bits from the respective addresses, thereby reading data of total 528 bytes.

That is, in this case, in FIG. 3A, four bit lines BL are sequentially selected with respect to one word line WL for each of the memory arrays ARY0 to ARY527, and as shown in FIG. 3B, one of two chain memory arrays CY selected by, the chain memory array selection line SL, disposed at each intersection of the word line WL and the bit line BL, is selected. Here, the number of the phase change memory cell selected in each chain memory array CY is 1.

On the other hand, in FIG. 22B, when writing data to the nonvolatile memory devices NVM10 to NVM17, the information processing circuit MNGER in FIG. 2 associates the physical address NXPAD (PAD [31:0]) stored in the write physical address table NXPADTBL2, the physical address CPAD [2:0], and the addresses of the nonvolatile memory devices NVM10 to NVM17. Further, when reading data from the nonvolatile memory devices NVM10 to NVM17, the information processing circuit MNGER associates the physical address PAD [31:0] stored in the address conversion table LPTBL, the physical address CPAD [2:0], and the addresses of the nonvolatile memory devices NVM10 to NVM17.

The physical address CPAD [2:0] corresponds to the column address COL [2:0], and the column address COL [2:0] corresponds to the memory cell selection line LY [2:0]. The value of the physical address CPAD [2:0] corresponds to the value of the memory cell selection line LY [2:0], so that data is written to the memory cell designated by the physical address CPAD [2:0], and data is read from the memory cell designated by the physical address CPAD [2:0].

The physical address PAD [0] corresponds to the column address COL [3], and the column address COL [3] corresponds to the chain memory array selection line SL [0]. A physical address PAD [a+1:1] corresponds to a column address COL [a+4:4], and the column address COL [a+4:4] corresponds to a bit line BL [a:0]. A physical address PAD [b+a+2:a+2] corresponds to a row address ROW [b+a+5:a+5], and the row address ROW [b+a+5:a+5] corresponds to a word line WL [b:0].

A physical address PAD [b+a+4:b+a+3] corresponds to a bank address BK [b+a+7:b+a+6], and the bank address BK [b+a+7:b+a+6] corresponds to a bank address BK [1:0]. A physical address PAD [b+a+7:b+a+5] corresponds to a chip address CHIPA [b+a+10:b+a+8], and the chip address CHIPA [b+a+10:b+a+8] corresponds to a chip address CHIPA [2:0].

Here, for example, a case that main data of 512 bytes and redundant data of 16 bytes are written is considered. Further, it is assumed that the physical address PAD [b+a+7:b+a+5] is 3, the physical address PAD [b+a+4:b+a+3] is 2, the physical address PAD [b+a+2:a+2] is 8, the physical address PAD [a+1:1] is 0, the physical address PAD [0] is 0, and the physical address CPAD [2:0] is 0.

In this case, the information processing circuit MNGER in FIG. 2 increases the value of the physical address CPAD [2:0] from 0 to 7 by 1 without changing the value of the physical address PAD, to write data of 528 bits to the respective addresses, thereby writing data of total 528 bytes. Further, on the same assumption, when reading the main data of 512 bytes and the redundant data of 16 bytes, the information processing circuit MNGER in FIG. 2 increases the value of physical address CPAD [2:0] from 0 to 7 by 1 without changing the value of the physical address PAD, to read data of 528 bits from the respective addresses, thereby reading data of total 528 bytes.

That is, in this case, in FIG. 3A, one bit line BL is selected with respect to one word line WL for each of the memory arrays ARY0 to ARY527, and as shown in FIG. 3B, one of two chain memory arrays CY selected by the chain memory array selection line SL, disposed at each intersection of the word line WL and the bit line BL, is selected. Here, the number of the phase change memory cells selected in each chain memory array CY is 8.

Figure 22C:
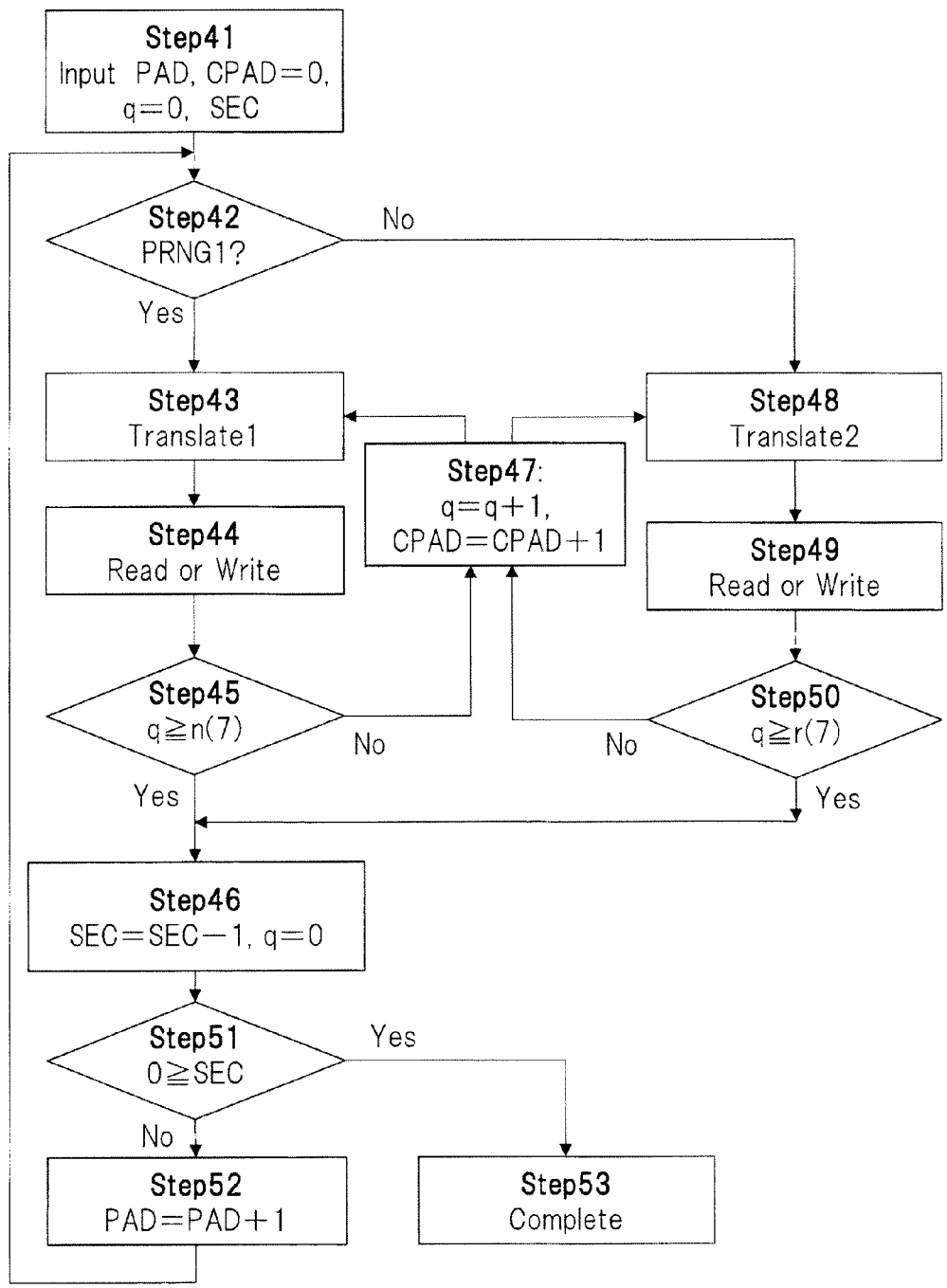
FIG. 22C is a diagram illustrating an example of a change state of a physical address when an information processing circuit in FIG. 2 performs data writing or data reading in a nonvolatile memory device.

FIG. 22C is a diagram illustrating an example of a change state of the physical address PAD and the physical address CPAD when the information processing circuit MNGER in FIG. 2 performs data writing or data reading with respect to the nonvolatile memory device. First, the information processing circuit MNGER determines a sector count SEC, a physical address PAD, and a physical address CPAD (=0), and then sets a variable q to 0 (Step 41) to check whether the physical address PAD is a physical address within the first physical address area PRNG1 (Step 42). If the physical address PAD is not the physical address within the first physical address area PRNG1, Step 48 is executed. Further, if the physical address PAD is the physical address within the first physical address area PRNG1, the address conversion shown in FIG. 22A is performed (Step 43), and data writing or data reading with respect to the nonvolatile memory devices is performed (Step 44).

Next, the information processing circuit MNGER checks whether the value of the variable q is n or greater (Step 45). If the value of the variable q is smaller than n, the information processing circuit MNGER calculates a new physical address obtained by adding 1 to the physical address CPAD (Step 47), executes Step 43 again, and then, executes Step 44. If the value of the variable q is n or greater, the information processing circuit MNGER decreases the sector count SEC by 1, sets the value of the variable q to 0 (Step 46), and then executes Step 51. In Step 51, the information processing circuit MNGER checks whether the sector count SEC value is 0 or smaller. If the sector count SEC value is greater than 0, the information processing circuit MNGER calculates a new physical address PAD obtained by adding 1 to the physical address PAD (Step 52), and then returns to Step 42 again to continue the process. If the sector counter SEC value is 0 or smaller, the information processing circuit MNGER finishes the data writing or data reading (Step 53).

When 1 is added to the physical address CPAD in Step 47, as understood from FIG. 22A, the chain memory array selection line SL or the bit line BL (that is, the position of the chain memory array CY) is changed. In Step 48, the information processing circuit MNGER performs the address conversion shown in FIG. 22B (Step 48), and performs the data writing or data reading with respect to the nonvolatile memory device (Step 49). Then, the information processing circuit MNGER checks whether the value of the variable q is r or greater (Step 50). If the value of the variable q is smaller than r, the information processing circuit MNGER calculates a new physical address CPAD obtained by adding 1 to the physical address CPAD (Step 47), and executes Step 48 again, and then executes Step 49. If the value of the variable q is r or greater, the information processing circuit MNGER executes Step 46 and thereafter. When 1 is added to the physical address CPAD in Step 47, as understood from FIG. 22B, the memory cell selection line LY (that is, the position of the memory cell in the chain memory array CY) is changed.

The n value of Step 45 and the r value of Step 50 are programmable, and optimal values thereof may be selected by the minimum data size managed by the information processing circuit MNGER or the configuration of the nonvolatile memory device. In the embodiment, for example, n=r=7 is used.

<<Updating Operation Example of Address Conversion Table and Nonvolatile Memory Device>>

Figure 23A:
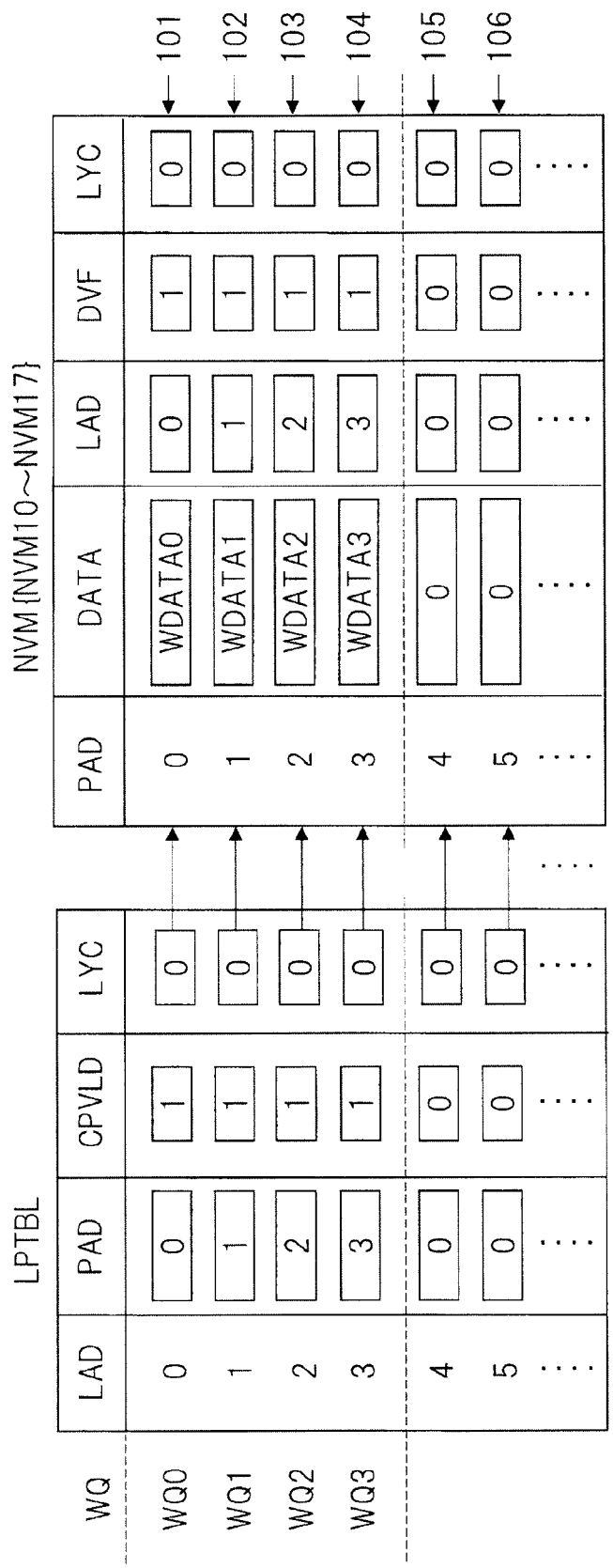
FIG. 23A is a diagram illustrating an example of an updating method of an address conversion table and a data updating method of a nonvolatile memory device when the control circuit in FIG. 1 writes data to a first physical address area of the nonvolatile memory device.
Figure 23B:
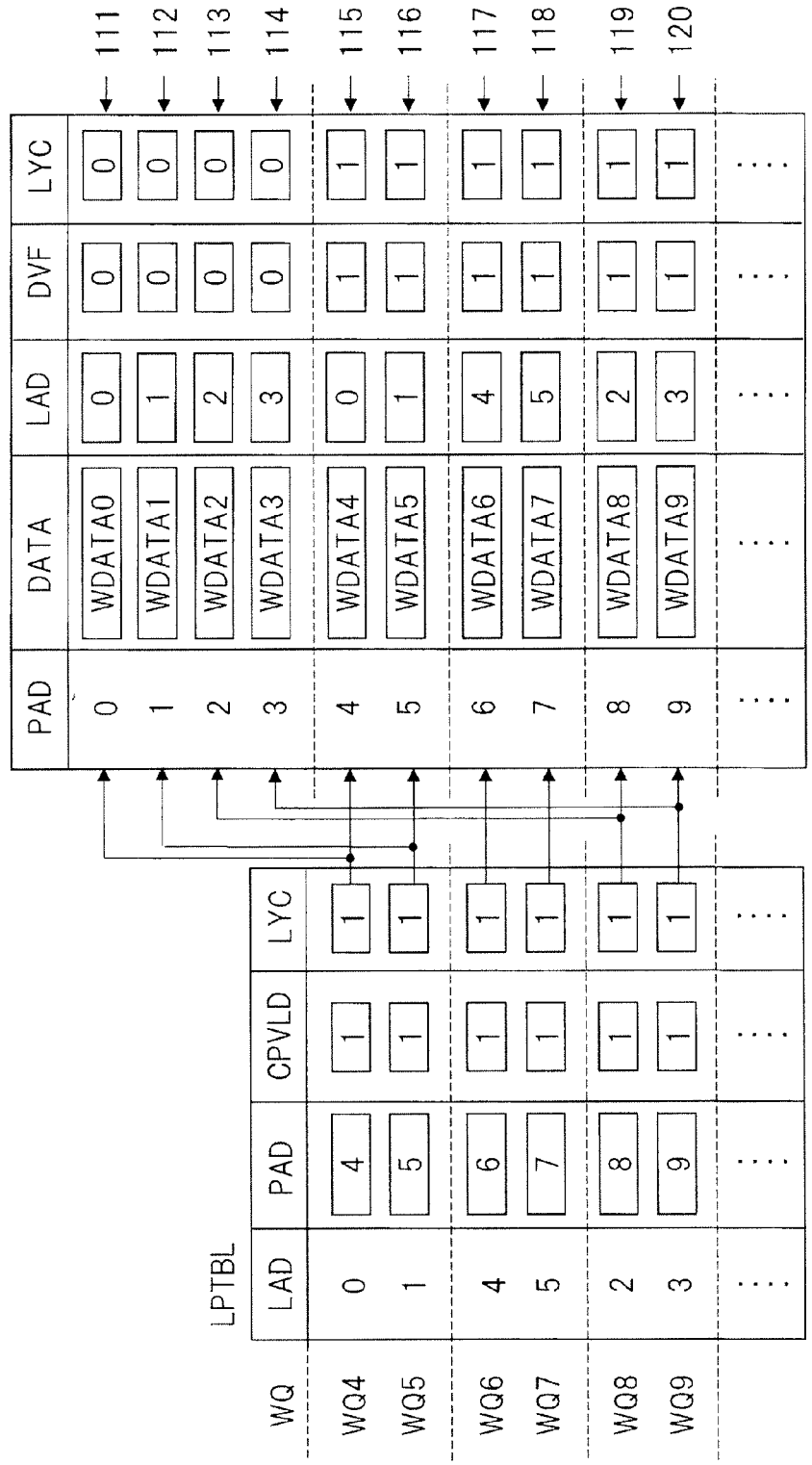
FIG. 23B is a diagram subsequent to FIG. 23A, which illustrates an example of an updating method of an address conversion table and a data updating method of a nonvolatile memory device.

FIGS. 23A and 23B are diagrams illustrating examples of an updating method of the address conversion table LPTBL and a data updating method of the nonvolatile memory device when the control circuit MDLCT0 in FIG. 1 writes data to the first physical address area PRNG1 of the nonvolatile memory device. The address conversion table LPTBL represents a table for converting the logical address LAD input to the control circuit MDLCT0 from the information processor CPU_CP into the physical address PAD of the nonvolatile memory device.

The address conversion table LPTBL includes the physical address PAD corresponding to the logical address LAD, and the valid flag CPVLD and the layer count LYC of the physical address. Further, the address conversion table LPTBL is stored in the random access memory RAM. In the nonvolatile memory device, the data DATA corresponding to the physical address PAD, the logical address LAD, the data valid flag DVF, and the layer count LYC are stored.

FIG. 23A shows a state after the write requests WQ0, WQ1, WQ2, and WQ3 to the control circuit MDLCT0 are input to the logical address area LRNG1 from the information processor CPU_CP, after time T0. Specifically, the address conversion table LPTBL, and addresses, data, valid flags and layer counts LYC stored in the nonvolatile memory device, during time T1 after data about the write requests is written to the first physical address area PRNG1 of the nonvolatile memory device, are shown.

The write request WQ0 includes a logical address value (LAD=0), a data write command (WRT), s sector count value (SEC=1), and write data (DATA0). The write request WQ1 includes a logical address value (LAD=1), a data write command (WRT), a sector count value (SEC=1), and write data (DATA1). The write request WQ2 includes a logical address value (LAD=2), a data write command (WRT), a sector count value (SEC=1), and write data (WDATA2). The write request WQ3 includes a logical address value (LAD=3), a data write command (WRT), a sector count value (SEC=1), and write data (DATA3). When the write requests WQ0, WQ1, WQ2, and WQ3 are input to the control circuit MDLCT0, the interface circuit HOST_IF transfers the write requests to the buffer BUF0.

Then, the information processing circuit MNGER sequentially reads the write requests WQ0, WQ1, WQ2, and WQ3 stored in the buffer BUF0. Subsequently, since the logical address values (LAD) of the write requests WQ0, WQ1, WQ2, and WQ3 are respectively 0, 1, 2, and 3, the information processing circuit MNGER respectively reads information based thereon from the address conversion table LPTBL stored in the random access memory RAM through the memory control circuit RAMC. That is, the information processing circuit MNGER reads the physical address (PAD) value, the valid flag (CPVLD) value, and the layer count LYC from address 0, address 1, address 2, and address 3 of the logical address LAD of the address conversion table LPTBL.

First, as shown in FIG. 12A, since all the read valid flag (CPVLD) values are 0, it can be understood that the physical address PAD is not allocated to address 0, address 1, address 2, and address 3 of the logical address LAD. Then, the information processing circuit MNGER reads the write physical address values (NXPAD) and the layer counts NXLYC stored in address 0 to address 3 of the entry number ENUM of the write physical address table NXPADTBL1, and allocates the write physical address values (NXPAD) and the layer counts NXLYC to address 0, address 1, address 2, and address 3 of the logical address LAD, respectively. In this example, it is assumed that the write physical address values (NXPAD) stored in address 0 to address 3 of the entry number ENUM are respectively, 0, 1, 2, and 3 as decimal digits, and the layer counts NXLYC are respectively 0, 0, 0, and 0.

Then, the information processing circuit MNGER generates ECC codes 0, 1, 2, and 3 with respect to write data DATA0, DATA1, DATA2, and DATA3 of the write requests WQ0, WQ1, WQ2, and WQ3, and generates write data WDATA0, WDATA1, WDATA2, and WDATA3 to the nonvolatile memory device according to the data format shown in FIG. 14. That is, the write data WDATA0 is configured to have main data DArea0 that includes write data (DATA0) and corresponding redundant data RArea0, and the write data WDATA1 is configured to have main data DArea1 that includes write data (DATA1) and corresponding redundant data RArea1. Similarly, the write data WDATA2 is configured to have main data DArea2 that includes write data (DATA2) and corresponding redundant data RArea2, and the write data WDATA3 is configured to have main data DArea3 that includes write data (DATA3) and corresponding redundant data RArea3.

The write data WDATA0, WDATA1, WDATA2, and WDATA3 are respectively written to four physical addresses of the nonvolatile memory device by the information processing circuit MNGER. The redundant data RArea0, RArea1, RArea2, and RArea3 respectively includes ECC codes ECC0, ECC1, ECC2, and ECC3. Further, a data inversion flag value (INVFLG=0), a write flag value (WTFLG=0), an ECC flag value (ECCFLG=0), a state information value (STATE=1), an area information value (AREA=1), a data writing layer information value (LYN=1), a bad block information value (BADBLK=0), and a reserve area value (RSV=0) are commonly included.

In the case of the write request to the logical address area LRNG1, the area information value (AREA) becomes 1, and in the case of the write request to the logical address area LRNG2, the area information value (AREA) becomes 2. When the layer count NXLYC value read from the write physical address table NXPADTBL1 is 0, LYN [n:1] in the data write layer information LYN [n:0] becomes 0, and LYN [0] therein becomes 1. This represents that data is written to the phase change memory cell CL0 in the chain memory array CY.

Further, the information processing circuit MNGER performs writing to the nonvolatile memory devices NVM10 to NVM17 according to 0, 1, 2, and 3 as decimal digits of the write physical address value (NXPAD) by the arbiter circuit ARB and the memory control circuits NVCT10 to NVCT17. That is, the information processing circuit MNGER writes the write data WDATA0 corresponding to the write request WQ0, the logical address value (LAD=0) and the layer value (LYC=0) to address 0 of the physical address PAD of the nonvolatile memory device NVM, and writes 1 as the data valid flag (DVF). The information processing circuit MNGER writes the write data WDATA1 corresponding to the write request WQ1, the logical address value (LAD=1) and the layer value (LYC=0) to address 1 of the physical address PAD of the nonvolatile memory device NVM, and writes 1 as the data valid flag (DVF). Similarly, the information processing circuit MNGER writes the write data WDATA2, the logical address value (LAD=2), the data valid flag (DVF=1) and the layer count (LYC=0) to address 2 of the physical address PAD, and writes the write data WDATA3, the logical address value (LAD=3), the data valid flag (DVF=1) and the layer count (LYC=0) to address 3 of the physical address PAD.

Finally, the information processing circuit MNGER updates the address conversion table LPTBL stored in the random access memory RAM through the memory control circuit RAMC. That is, the information processing circuit MNGER writes physical address (PAD=0), valid flag (CPVLD=1), and layer count (LYC=0) after allocation to address 0 of the logical address LAD, and writes physical address (PAD=1), valid flag (CPVLD=1) and layer count (LYC=0) after allocation to address 1 of the logical address LAD. The information processing circuit MNGER writes physical address (PAD=2), valid flag (CPVLD=1) and layer count (LYC=0) after allocation to address 2 of the logical address LAD, and writes physical address (PAD=3), valid flag (CPVLD=1) and layer count (LYC=0) after allocation to address 3 of the logical address LAD.

FIG. 23B shows a state after write requests WQ4, WQ5, WQ6, WQ7, WQ8, and WQ9 are input to the control circuit MDLCT0 from the information processor CPU_CP, after time T1. Specifically, during time T2 after data about the write requests is written to the first physical address area PRNG1 of the nonvolatile memory device, the address conversion table LPTBL, and addresses, data, and valid flags stored in the nonvolatile memory device, are shown.

The write request WQ4 includes logical address value (LAD=0), data write command (WRT), sector count value (SEC=1), and write data (DATA4). The write request WQ5 includes logical address value (LAD=1), data write command (WRT), sector count value (SEC=1), and write data (DATA5). The write request WQ6 includes logical address value (LAD=4), data write command (WRT), sector count value (SEC=1), and write data (DATA6). The write request WQ7 includes logical address value (LAD=5), data write command (WRT), sector count value (SEC=1), and write data (DATA7). The write request WQ8 includes logical address value (LAD=2), data write command (WRT), sector count value (SEC=1), and write data (DATA8). The write request WQ9 includes logical address value (LAD=3), data write command (WRT), sector count value (SEC=1), and write data (DATA9). When the write requests WQ4, WQ5, WQ6, WQ7, WQ8 and WQ9 are input to the control circuit MDLCT0, the interface circuit HOST_IF transfers the write requests to the buffer BUF0.

Then, the information processing circuit MNGER sequentially reads the write requests WQ4, WQ5, WQ6, WQ7, WQ8, and WQ9 stored in the buffer BUF0. Subsequently, the information processing circuit MNGER respectively generates write data WDATA4, WDATA5, WDATA6, WDATA7, WDATA8, and WDATA9 corresponding to the write requests WQ4, WQ5, WQ6, WQ7, WQ8 and WQ9 according to the data format shown in FIG. 14. The write data WDATA4 is configured to have main data DArea4 that includes write data DATA4 and redundant data RArea4, the write data WDATA5 is configured to have main data DArea5 that includes write data DATA5 and redundant data RArea5. The write data WDATA6 is configured to have main data DArea6 that includes write data DATA6 and redundant data RArea6, and the write data WDATA7 is configured to have main data DArea7 that includes write data DATA7 and redundant data RArea7. The write data WDATA8 is configured to have main data DArea8 that includes write data DATA8 and redundant data RArea8, and the write data WDATA9 is configured to have main data DArea9 that includes write data DATA9 and redundant data RArea9.

The redundant data RArea4, RArea5, RArea6 RArea7, RArea8, and RArea9 respectively include ECC codes ECC4, ECC5, ECC6, ECC7, ECC8, and ECC9 generated by the information processing circuit MNGER using the write data DATA4, DATA5, DATA6, DATA7, DATA8, and DATA9. Further, a data inversion flag value (INVFLG=0), a write flag value (WTFLG=0), an ECC flag value (ECCFLG=0), a state information value (STATE=1), an area information value (AREA=1), a bad block information value (BADBLK=0), and a reserve area value (RSV=0) are commonly included.

The write data WDATA4, WDATA5, WDATA6, WDATA7, WDATA8, and WDATA9 are respectively written to six physical addresses of the nonvolatile memory device by the information processing circuit MNGER. Here, since the logical address values (LAD) of the write requests WQ4, WQ5, WQ6, WQ7, WQ8, and WQ9 are respectively 0, 1, 4, 5, 2, and 3, the information processing circuit MNGER respectively reads information based thereon from the address conversion table LPTBL stored in the random access memory RAM through the memory control circuit RAMC. That is, the physical address (PAD) value, the valid flag (CPVLD) value, and the layer count LYC are read from address 0, address 1, address 4, address 5, address 2, and address 3 of the logical address LAD of the address conversion table LPTBL.

In the address conversion table LPTBL in FIG. 23A, the physical address (PAD) of address 0 of the logical address LAD is 0, the valid flag value (CPVLD) is 1, and the layer count LYC is 0, and thus, it is necessary to negate data on address 0 of the physical address PAD that is stored in advance, in association with the write request WQ4 to address 0 of the logical address LAD. Thus, the information processing circuit MNGER sets the valid flag value (DVF) of address 0 of the physical address PAD in the nonvolatile memory device to 0 (101 in FIG. 23A→111 in FIG. 23B). Similarly, in FIG. 23A, the physical address (PAD) of address 1 of the logical address LAD is 1, the valid flag value (CPVLD) is 1, and the layer count LYC is 0, and thus, it is necessary to negate data on address 1 of the physical address PAD associated with the write request WQ5. Thus, the information processing circuit MNGER sets the valid flag value (DVF) of address 1 of the physical address PAD to 0 (102 in FIG. 23A→112 in FIG. 23B).

Further, in the address conversion table LPTBL in FIG. 23A, the physical address (PAD) of address 4 of the logical address LAD associated with the write request WQ6 is 0, the valid flag value (CPVLD) is 0, and the layer count LYC is 0, and thus, it can be understood that the physical address PAD is not allocated to address 4 of the logical address LAD. Similarly, in FIG. 23A, the physical address (PAD) of address 5 of the logical address LAD associated with the write request WQ7 is 0, the valid flag value (CPVLD) is 0, and the layer count LYC is 0, and thus, it can be understood that the physical address PAD is not allocated to address 5 of the logical address LAD.

On the other hand, in the address conversion table LPTBL in FIG. 23, the physical address (PAD) of address 2 of the logical address LAD is 2, the valid flag value (CPVLD) is 1, and the layer count LYC is 0, and thus, it is necessary to negate data on address 2 of the physical address PAD that is stored in advance, in association with the write request WQ8 to address 2 of the logical address LAD. Thus, the information processing circuit MNGER sets the valid flag value (DVF) of address 2 of the physical address PAD to 0 (103 in FIG. 23A→113 in FIG. 23B). Similarly, in FIG. 23A, the physical address (PAD) of address 3 of the logical address LAD is 3, the valid flag value (CPVLD) is 1, and the layer count LYC is 0, and thus, it is necessary to negate data on address 3 of the physical address PAD associated with the write request WQ9. Thus, the information processing circuit MNGER sets the valid flag value (DVF) of address 6 of the physical address PAD to 0 (104 in FIG. 23A→114 in FIG. 23B).

Next, the information processing circuit MNGER reads the write physical address values (NXPAD) and the layer counts NXLYC stored in address 4 to address 9 of the entry number ENUM of the write physical address table NXPADTBL1, and allocates the write physical address values (NXPAD) and the layer counts NXLYC to address 0, address 1, address 4, and address 5, address 2, and address 3 of the logical address LAD, respectively. In this example, it is assumed that the write physical address values (NXPAD) stored in address 4 to address 9 of the entry number ENUM are respectively, 4, 5, 6, 7, 8, and 9, and the layer counts NXLYC are respectively 1, 1, 1, 1, 1, and 1.

Subsequently, the information processing circuit MNGER performs writing to the nonvolatile memory devices NVM10 to NVM17 through the arbiter circuit ARB and the memory control circuits NVCT10 to NVCT17 according to the write physical address values (NXPAD) 4, 5, 6, 7, 8, and 9. That is, the information processing circuit MNGER writes the write data WDATA4 corresponding to the write request WQ4, the logical address value (LAD=0), and the layer count (LYC=1) to address 4 of the physical address PAD of the nonvolatile memory device NVM, and writes 1 as the data valid flag (DVF). The information processing circuit MNGER writes the write data WDATA5 corresponding to the write request WQ5, the logical address value (LAD=1), and the layer count (LYC=1) to address 5 of the physical address PAD of the nonvolatile memory device NVM, and writes 1 as the data valid flag (DVF).

Further, the information processing circuit MNGER writes the write data WDATA6 corresponding to the write request WQ6, the logical address value (LAD=4), and the layer count (LYC=1) to address 6 of the physical address PAD of the nonvolatile memory device NVM, and writes 1 as the data valid flag (DVF). Similarly, the information processing circuit MNGER writes the write data WDATA7 corresponding to the write request WQ7, the logical address value (LAD=5), and the layer count (LYC=1) to address 7 of the physical address PAD of the nonvolatile memory device NVM, and writes 1 as the data valid flag (DVF).

Furthermore, the information processing circuit MNGER writes the write data WDATA8 corresponding to the write request WQ8, the logical address value (LAD=2), and the layer count (LYC=1) to address 8 of the physical address PAD of the nonvolatile memory device NVM, and writes 1 as the data valid flag (DVF). Similarly, the information processing circuit MNGER writes the write data WDATA9 corresponding to the write request WQ9, the logical address value (LAD=3), and the layer count (LYC=1) to address 9 of the physical address PAD of the nonvolatile memory device NVM, and writes 1 as the data valid flag (DVF).

Figure 24A:
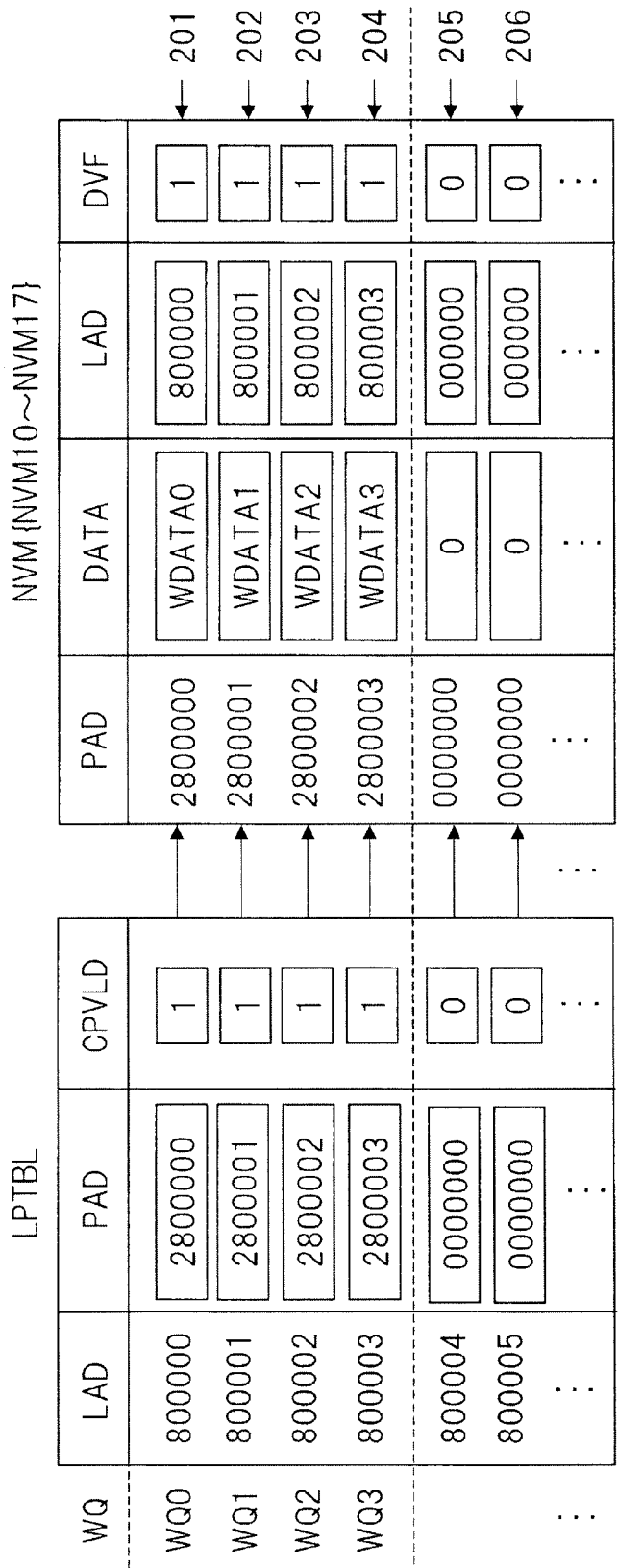
FIG. 24A is a diagram illustrating an example of an updating method of an address conversion table and a data updating method of a nonvolatile memory device when the control circuit in FIG. 1 writes data to a second physical address area of the nonvolatile memory device.
Figure 24B:
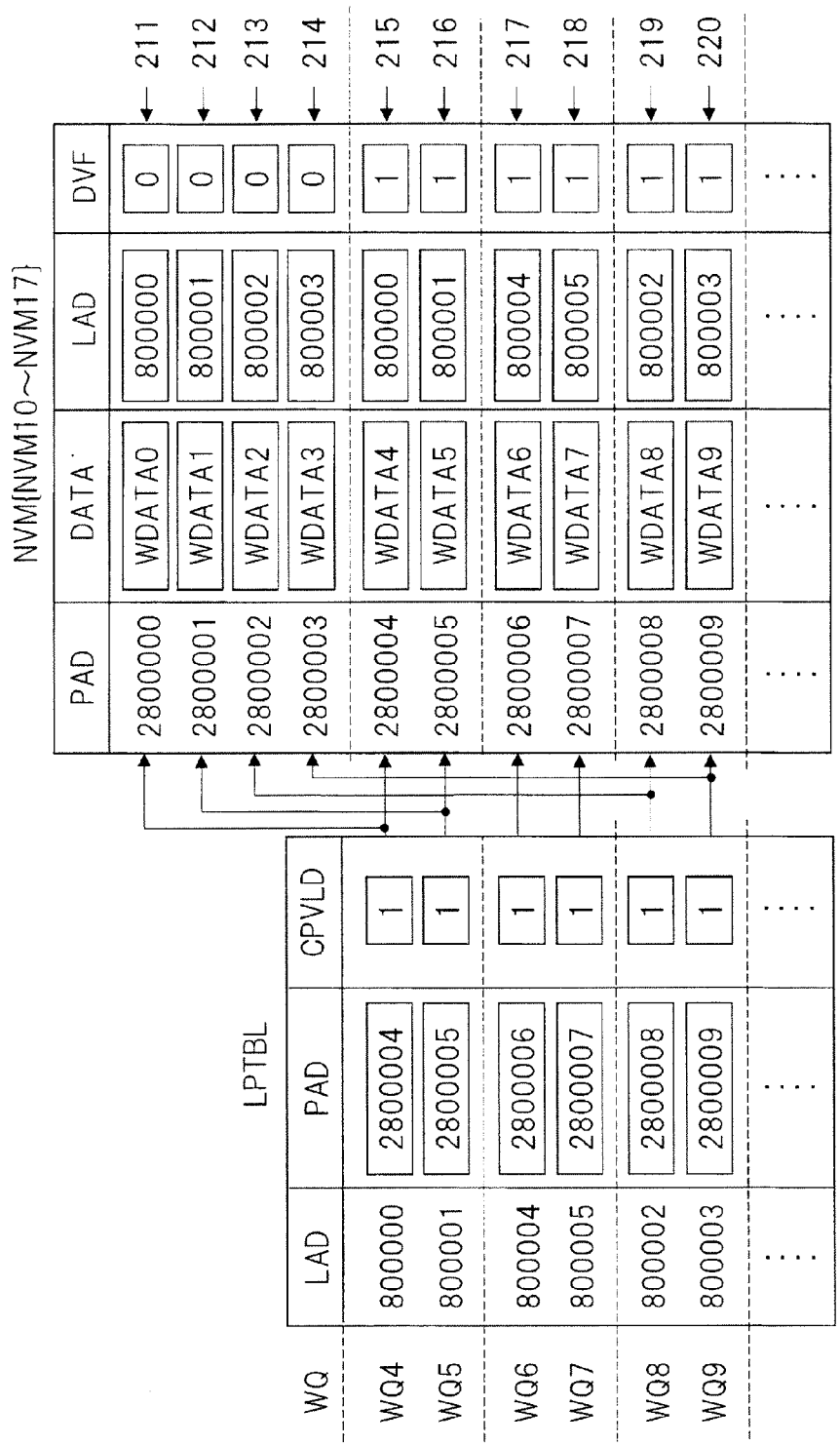
FIG. 24B is a diagram subsequent to FIG. 24A, which illustrates an example of an updating method of an address conversion table and a data updating method of a nonvolatile memory device.

FIGS. 24A and 24B are diagrams illustrating examples of an updating method of the address conversion table LPTBL and a data updating method of the nonvolatile memory device when the control circuit MDLCT0 in FIG. 1 writes data to the second physical address area PRNG2 of the nonvolatile memory device. Similar to the cases of FIGS. 23A and 23B, states of the address conversion table LPTBL and the nonvolatile memory device NVM are shown.

The address conversion table LPTBL includes the physical address PAD corresponding to the logical address LAD, the valid flag CPVLD, and the layer count LYC of the physical address. Further, the address conversion table LPTBL is stored in the random access memory RAM. The nonvolatile memory device stores the data DATA corresponding to the physical address PAD, the logical address LAD, the data valid flag DVF, and the layer count LYC. Here, the layer count LYC is all "0", which is not shown in the drawings.

FIG. 24A shows a state after the write requests WQ0, WQ1, WQ2, and WQ3 to the logical address area LRNG2 are input to the control circuit MDLCT0 from the information processor CPU_CP, after time T0. Specifically, the address conversion table LPTBL, and addresses, data, and valid flags stored in the nonvolatile memory device, during time T1 after data about the write requests is written to the second physical address area PRNG2 of the nonvolatile memory device, are shown.

The write request WQ0 includes logical address value (LAD="800000") as hexadecimal digits, data write command (WRT), sector count value (SEC=1), and write data (DATA0). The write request WQ1 includes logical address value (LAD="800001") as hexadecimal digits, data write command (WRT), sector count value (SEC=1), and write data (DATA1). The write request WQ2 includes logical address value (LAD="800002") as hexadecimal digits, data write command (WRT), sector count value (SEC=1), and write data (DATA2). The write request WQ3 includes logical address value (LAD="800003") as hexadecimal digits, data write command (WRT), sector count value (SEC=1), and write data (DATA3).

When the write requests WQ0, WQ1, WQ2, and WQ3 are input to the control circuit MDLCT0, the interface circuit HOST_IF transfers the write requests to the buffer BUF0. Then, the information processing circuit MNGER sequentially reads the write requests WQ0, WQ1, WQ2, and WQ3 stored in the buffer BUF0. Here, the information processing circuit MNGER reads various pieces of information corresponding to the write requests WQ0, WQ1, WQ2, and WQ3 with reference to the address conversion table LPTBL stored in the random access memory RAM through the memory control device RAMC. Specifically, the information processing circuit MNGER respectively reads physical address (PAD) and valid flag CPVLD from "800000" address, "800001" address, "800002" address, and "800003" address of the logical address LAD of the address conversion table LPTBL.

As shown in FIG. 12A, since all the read valid flags CPVLD are initially 0, it can be understood that the physical address PAD is not allocated to "800000" address, "800001" address, "800002" address, and "800003" address of the logical address LAD. Then, the information processing circuit MNGER generates the write data WDATA0, WDATA1, WDATA2, and WDATA3 to the nonvolatile memory device according to the data format shown in FIG. 14, corresponding to the write requests WQ0, WQ1, WQ2, and WQ3. The write data WDATA0 is configured to have main data DArea0 that includes write data DATA0 and corresponding redundant data RArea0, and the write data WDATA1 is configured to have main data DArea1 that includes write data DATA1 and corresponding redundant data RArea2. The write data WDATA2 is configured to have main data DArea2 that includes write data DATA2 and corresponding redundant data RArea2, and the write data WDATA3 is configured to have main data DArea3 that includes write data DATA3 and corresponding redundant data RArea3.

The redundant data RArea0, RArea1, RArea2, and RArea3 respectively include ECC codes ECC0, ECC1, ECC2, and ECC3 generated by the information processing circuit MNGER using the write data DATA0, DATA1, DATA2, and DATA3. Further, a data inversion flag value (INVFLG=0), a write flag value (WTFLG=0), an ECC flag value (ECCFLG=0), a state information value (STATE=1), an area information value (AREA=1), a bad block information value (BADBLK=0), and a reserve area value (RSV=0) are commonly included.

The write data WDATA0, WDATA1, WDATA2, and WDATA3 are written to four physical addresses of the nonvolatile memory device by the information processing circuit MNGER. Here, the information processing circuit MNGER reads write physical addresses NXPAD stored, for example, in address 16 to address 19 of the entry number ENUM of the write physical address table NXPADTBL2 according to the write requests WQ0 to WQ3, and allocates the write physical addresses NXPAD to the respective logical addresses. Here, it is assumed that the write physical address values (NXPAD) are respectively "2800000", "2800001", "2800002", and "2800003", and the information processing circuit MNGER respectively allocates these values to address "800000", address "800001", address "800002", and address "800003" of the logical address LAD.

Further, the information processing circuit MNGER performs writing to the nonvolatile memory devices NVM10 to NVM17 through the arbiter circuit ARB and the memory control circuits NVCT10 to NVCT17 according to the write physical address values (NXPAD). Specifically, the information processing circuit MNGER writes the write data WDATA0 corresponding to the write request WQ0, and the logical address value (LAD="800000") to address "2800000" of the physical address PAD of the nonvolatile memory device, and writes 1 as the data valid flag DVF. The information processing circuit MNGER writes the write data WDATA1 corresponding to the write request WQ1, and the logical address value (LAD="800001") to address "2800001" of the physical address PAD of the nonvolatile memory device, and writes 1 as the data valid flag DVF.

Further, the information processing circuit MNGER writes the write data WDATA2 corresponding to the write request WQ2, and the logical address value (LAD="800002") to address "2800002" of the physical address PAD of the nonvolatile memory device, and writes 1 as the data valid flag DVF. Similarly, the information processing circuit MNGER writes the write data WDATA3 corresponding to the write request WQ3, and the logical address value (LAD="800003") to address "2800003" of the physical address PAD of the nonvolatile memory device NVM, and writes 1 as the data valid flag DVF.

Finally, the information processing circuit MNGER writes the address conversion table LPTBL stored in the random access memory RAM through the memory control circuit RAMC. Specifically, the information processing circuit MNGER writes the physical address value (PAD="2800000") and the valid flag value (CPVLD=1) to address "800000" of the logical address LAD in the address conversion table LPTBL. Further, the information processing circuit MNGER writes the physical address value (PAD="2800001") and the valid flag value (CPVLD=1) to address "800001" of the logical address LAD. Similarly, the information processing circuit MNGER writes the physical address value (PAD="2800002") and the valid flag value (CPVLD=1) to address "800002" of the logical address LAD, and writes the physical address value (PAD="2800003") and the valid flag value (CPVLD=1) to address "800003" of the logical address LAD.

FIG. 24B shows a state after write requests WQ4, WQ5, WQ6, WQ7, WQ8, and WQ9 are input to the control circuit MDLCT0 from the information processor CPU_CP, after time T1. Specifically, the address conversion table LPTBL, and addresses, data, and valid flags stored in the nonvolatile memory device, during time T2 after data about the write requests is written to the second physical address area PRNG2 of the nonvolatile memory device, are shown.

The write request WQ4 includes logical address value (LAD="800000"), data write command (WRT), sector count value (SEC=1), and write data (DATA4). The write request WQ5 includes logical address value (LAD="800001"), data write command (WRT), sector count value (SEC=1), and write data (DATA5). The write request WQ6 includes logical address value (LAD="800004"), data write command (WRT), sector count value (SEC=1), and write data (DATA6). The write request WQ7 includes logical address value (LAD="800005"), data write command (WRT), sector count value (SEC=1), and write data (DATA7). The write request WQ8 includes logical address value (LAD="800002"), data write command (WRT), sector count value (SEC=1), and write data (DATA8). The write request WQ9 includes logical address value (LAD="800003"), data write command (WRT), sector count value (SEC=1), and write data (DATA9).

When the write requests WQ4, WQ5, WQ6, WQ7, WQ8 and WQ9 are input to the control circuit MDLCT0, the interface circuit HOST_IF transfers the write requests to the buffer BUF0. Then, the information processing circuit MNGER sequentially reads the write requests WQ4, WQ5, WQ6, WQ7, WQ8, and WQ9 stored in the buffer BUF0. Subsequently, the information processing circuit MNGER generates the write data WDATA4, WDATA5, WDATA6, WDATA7, WDATA8, and WDATA9 to the nonvolatile memory device according to the data format shown in FIG. 14, corresponding to the write requests WQ4, WQ5, WQ6, WQ7, WQ8, and WQ9.

The WDATA4 is configured to have main data DArea4 that includes write data DATA4 and corresponding redundant data RArea4, and the write data WDATA5 is configured to have main data DArea5 that includes write data DATA5 and corresponding redundant data RArea5. The write data WDATA6 is configured to have main data DArea6 that includes write data DATA6 and corresponding redundant data RArea6, and the write data WDATA7 is configured to have main data DArea7 that includes write data DATA7 and corresponding redundant data RArea7. The write data WDATA8 is configured to have main data DArea8 that includes write data DATA8 and corresponding redundant data RArea8, and the write data WDATA9 is configured to have main data DArea9 that includes write data DATA9 and corresponding redundant data RArea9.

The redundant data RArea4, RArea5, RArea6, RArea7, RArea8, and RArea9 respectively include ECC codes ECC4, ECC5, ECC6, ECC7, ECC8, and ECC9 generated by the information processing circuit MNGER using the write data DATA4, DATA5, DATA6, DATA7, DATA8, and DATA9. Further, a data inversion flag value (INVFLG=0), a write flag value (WTFLG=0), an ECC flag value (ECCFLG=0), a state information value (STATE=1), an area information value (AREA=1), a bad block information value (BADBLK=0), and a reserve area value (RSV=0) are commonly included.

The write data WDATA4, WDATA5, WDATA6, WDATA7, WDATA8, and WDATA9 are written to six physical addresses of the nonvolatile memory device by the information processing circuit MNGER. Here, the information processing circuit MNGER reads various pieces of information corresponding to the write requests WQ4, WQ5, WQ6, WQ7, WQ8, and WQ9 with reference to the address conversion table LPTBL stored in the random access memory RAM through the memory control circuit RAMC. Specifically, the information processing circuit MNGER respectively reads physical address (PAD) and valid flag CPVLD from "800000" address, "800001" address, "800004" address, "800005" address, "800002" address, and "800003" address of the logical address LAD of the address conversion table LPTBL.

In the address conversion table LPTBL in FIG. 24A, the physical address (PAD) of address "800000" of the logical address LAD is "2800000", and the valid flag value (CPVLD) is 1, and thus, it is necessary to negate data on the physical address that is stored in advance, in association with the write request WQ4 to address "800000" of the logical address LAD. Thus, the information processing circuit MNGER sets the valid flag value (DVF) of address "2800000" of the physical address PAD to 0 (201 in FIG. 24A→211 in FIG. 24B). Similarly, the physical address (PAD) of address "800001" of the logical address LAD in FIG. 24A is "2800001" and the valid flag value (CPVLD) is 1, and thus, it is necessary to negate data on the physical address that is stored in advance, in association with the write request WQ5. Thus, the information processing circuit MNGER sets the valid flag value DVF of address "2800001" of the physical address PAD to 0 (202 in FIG. 24A→212 in FIG. 24B).

On the other hand, in the address conversion table LPTBL in FIG. 24A, the physical address (PAD) of address "800004" of the logical address LAD associated with the write request WQ6 is 0, and the valid flag value (CPVLD) is 0, and thus, it can be understood that the physical address PAD is not allocated to address "800004" of the logical address LAD. Similarly, the physical address (PAD) of address "800005" of the logical address LAD associated with the write request WQ7 is 0, and the valid flag value (CPVLD) is 0, and thus, it can be understood that the physical address PAD is not allocated to address "800005" of the logical address LAD.

Further, in the address conversion table LPTBL in FIG. 24A, the physical address (PAD) of address "800002" of the logical address LAD is "2800002", the valid flag value (CPVLD) is 1, and thus, it is necessary to negate the physical address that is stored in advance, in association with the write request WQ8 to address "800002" of the logical address LAD. Thus, the information processing circuit MNGER sets the valid flag value (DVF) of address "2800002" of the physical address PAD to 0 (203 in FIG. 24A→213 in FIG. 24B). Similarly, the physical address (PAD) of address "800003" of the logical address LAD in FIG. 24A is "2800003", and the valid flag value (CPVLD) is 1, and thus, it is necessary to negate data on the physical address stored in advance, in association with the write request WQ9. Thus, the information processing circuit MNGER sets the valid flag value (DVF) of address "2800003" of the physical address PAD to 0 (204 in FIG. 24A→214 in FIG. 24B).

Next, the information processing circuit MNGER reads the write physical address values NXPAD stored in address 20 to address 25 of the entry number ENUM of the write physical address table NXPADTBL2 according to the write requests WQ4 to WQ9, and allocates the write physical address values NXPAD to the respective logical addresses, respectively. Here, it is assumed that the write physical address values (NXPAD) are respectively, "2800004", "2800005", "2800006", "2800007", "2800008", and "2800009". Further, these values are respectively allocated to "800000" address, "800001" address, "800004" address, "800005" address, "800002" address, and "800003" address of the logical address LAD.

Subsequently, the information processing circuit MNGER performs writing to the nonvolatile memory devices NVM10 to NVM17 through the arbiter circuit ARB and the memory control circuits NVCT10 to NVCT17 according to allocation of the physical address values. Specifically, the information processing circuit MNGER writes the write data WDATA4 corresponding to the write request WQ4, and the logical address value (LAD="800000") to address "2800004" of the physical address PAD of the nonvolatile memory device NVM, and writes 1 as the data valid flag DVF. The information processing circuit MNGER writes the write data WDATA5 corresponding to the write request WQ5, and the logical address value (LAD="800001") to address "2800005" of the physical address PAD, and writes 1 as the data valid flag DVF.

Similarly, the information processing circuit MNGER writes the write data WDATA6 corresponding to the write request WQ6, and the logical address value (LAD="800004") to address "2800006" of the physical address PAD, and writes 1 as the data valid flag DVF. Similarly, the information processing circuit MNGER writes the write data WDATA7 corresponding to the write request WQ7, and the logical address value (LAD="800005") to address "2800007" of the physical address PAD, and writes 1 as the data valid flag DVF. The information processing circuit MNGER writes the write data WDATA8 corresponding to the write request WQ8, and the logical address value (LAD="800002") to address "2800008" of the physical address PAD, and writes 1 as the data valid flag DVF. The information processing circuit MNGER writes the write data WDATA9 corresponding to the write request WQ9, and the logical address value (LAD="800003") to address "2800009" of the physical address PAD, and writes 1 as the data valid flag DVF. Finally, the information processing circuit MNGER updates the address conversion table LPTBL stored in the random access memory RAM into a state shown in FIG. 24B, through the memory control circuit RAMC.

<<Reading Operation of Memory Module (Semiconductor Device)>>

Figure 25:
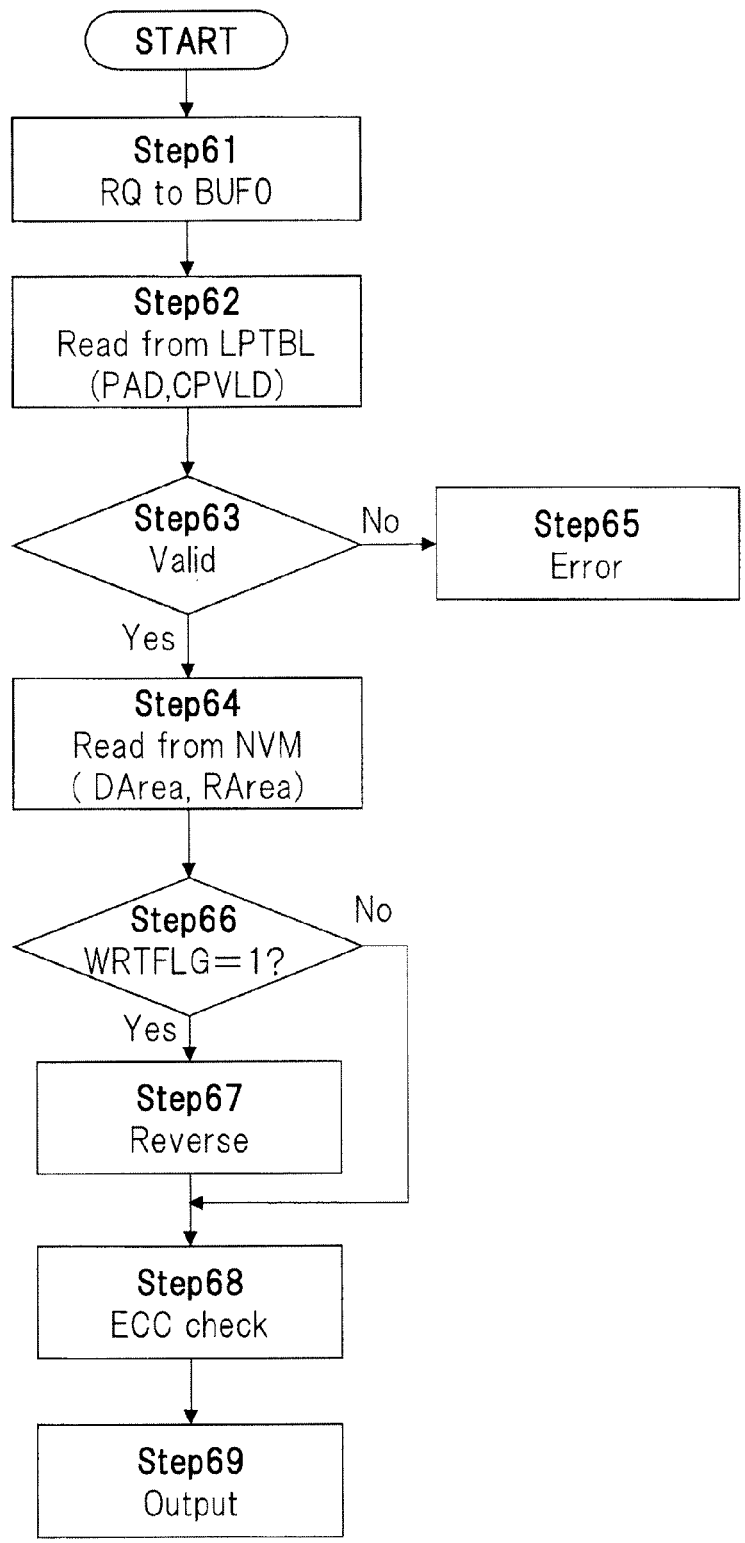
FIG. 25 is a flowchart illustrating an example of a data reading operation performed by a memory module when a read request is input to the memory module from the information processor in FIG. 1.

FIG. 25 is a flowchart illustrating an example of a data reading operation performed by the memory module NVMMD0 when a read request (RQ) is input to the memory module NVMMD0 from the information processor CPU_CP in FIG. 1. First, the read request (RQ) in which logical address value (for example, LAD=0) from the information processor CPU_CP, data read command (RD), and sector count value (SEC=1) are included is input to the control circuit MDLCT0. The interface circuit HOST_IF receives the read request, extracts clock information embedded in the read request (RQ), converts the read request (RQ) that is serial data into parallel data, and transfers the converted read request (RQ) to the buffer BUF0 and the information processing circuit MNGER (Step 61).

Then, the information processing circuit MNGER interprets the logical value (LAD=0), the data read command (RD), and the sector count value (SEC=1), and reads various pieces of information with reference to the address conversion table LPTBL stored in the random access memory RAM. Specifically, in the address conversion table LPTBL, the information processing circuit MNGER reads the physical address value PAD (for example, PAD=0) stored in address 0 of the logical address LAD, the valid flag CPVLD and the layer count LYC corresponding to the physical address PAD (Step 62). Then, the information processing circuit MNGER checks whether the read valid flag CPVLD is 1 (Step 63).

If the valid flag CPVLD is 0, the information processing circuit MNGER recognizes that the physical address PAD is not allocated to the logical address value (LAD=0). In this case, since data cannot be read from the nonvolatile memory device NVM, the information processing circuit MNGER transmits information indicating that an error occurs to the information processor CPU_CP through the interface circuit HOST_IF (Step 65).

If the valid flag CPVLD is 1, the information processing circuit MNGER determines that the physical address PAD (PAD=0) corresponds to the logical address value (LAD=0). If the physical address value PAD (PAD=0) corresponding to the logical address value (LAD=0) is an address within the first physical address area PRNG1, the physical address value PAD (PAD=0), the physical address value CPAD (CPAD=0), and the layer count LYC are converted into chip address CHIPA, bank address BK, row address ROW, and column address COL of the nonvolatile memory device NVM shown in FIG. 22A. On the other hand, if the physical address value (PAD=0) corresponding to the logical address value (LAD=0) is an address within the second physical address area PRNG2, the physical address value PAD (PAD=0) and the physical address value CPAD (CPAD=0) are converted into chip address CHIPA, bank address BK, row address ROW, and column address COL of the nonvolatile memory device NVM shown in FIG. 22B.

Further, the chip address CHIPA) converted from the physical address value PAD (PAD=0), the physical address value CPAD and the layer count LYC, the bank address BK, the row address ROW and the column address COL of the nonvolatile memory device NVM are input to the nonvolatile memory device NVM through the arbiter circuit ARB and the memory control circuit NVCT. Further, according to the operation shown in FIG. 22C, data (RDATA0) stored in the nonvolatile memory device NVM is read. Data (RDATA0) includes main data DArea0 and redundant data RArea0, and the redundant data RArea0 includes write flag WTFLG and ECC code ECC0 (Step 64).

Then, the information processing circuit MNGER reads the logical address area LRNG in the SSD configuration information (SDCFG) stored in the nonvolatile memory device NVM, and the write method selection information WRTFLG (FIG. 13) corresponding to the logical address area LRNG. Further, the information processing circuit MNGER checks which certain logical address area LRNG the logical address value (LAD=0) belongs to, and obtains corresponding write method selection information WRTFLG. Further, the information processing circuit MNGER checks whether the value of the write method selection information WRTFLG is 1 (Step 66).

If the value of the write method selection information WRTFLG is 1, the information processing circuit MNGER inverts respective bits of the main data DArea0 and the ECC code ECC0 to generate main data (/DArea0) and ECC code (/ECC0) (Step 67). Then, the information processing circuit MNGER checks whether an error is present in the main data (/DArea0) using the ECC code (/ECC0). If the error is present, the information processing circuit MNGER performs error correction (Step 68), and transfer the result to the information processor CPU_CP through the interface circuit HOST_IF (Step 69).

On the other hand, if the write method selection information WRTFLG value is not 1, the information processing circuit MNGER checks whether an error is present in the main data DArea0 using the ECC code ECC0. If the error is present, the information processing circuit MNGER performs error correction (Step 68), and transfers the result to the information processor CPU_CP through the interface circuit HOST_IF (Step 69).

<<Writing Operation of Memory Module (Semiconductor Device) Based on Write Method Selection Information>>

Figure 26:
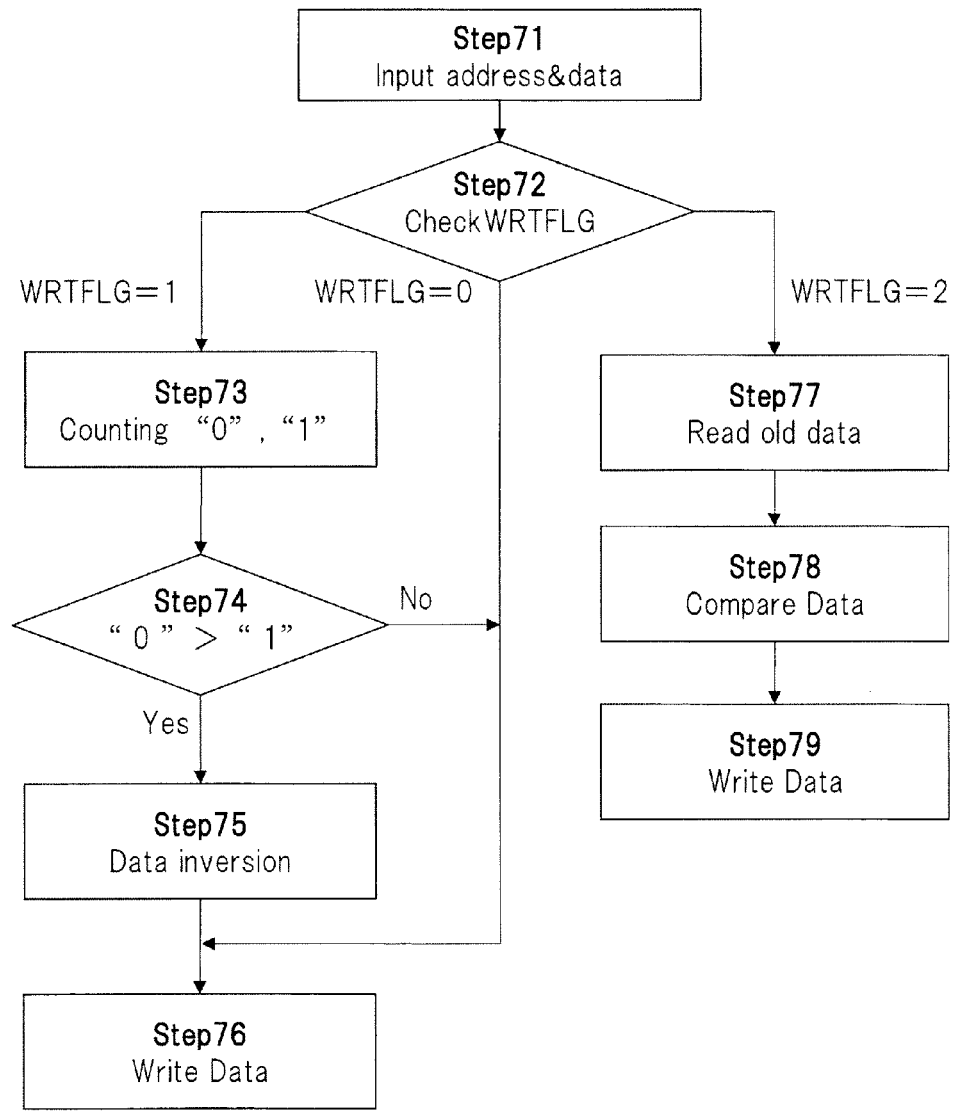
FIG. 26 is a flowchart illustrating an example of a writing operation of a memory module based on write method selection information as an example of the SSD configuration information shown in FIG. 13B.

FIG. 26 is a flowchart illustrating an example of a writing operation of a memory module based on write method selection information WRTFLG, as an example of the SSD configuration information (SDCFG) shown in FIG. 13B. In the example of FIG. 13B, the write method selection information WRTFLG of the logical address area LRNG1 is set to 0, and the write method selection information WRTFLG of the logical address area LRNG2 is set to 1. Although not particularly limited, the memory cell in the set state represents "1" bit data, and the memory cell data in the reset state represents "0" bit data.

First, write request (WQ01) in which logical address value (LAD), data write command (WRT), sector count value (for example, SEC=1), and 512-byte write data (DATA0) are included is input from the information processor CPU_CP to the information processing circuit MNGER through the interface circuit HOST_IF (Step 71). The information processing circuit MNGER determines whether logical address value (LAD) is logical address value within logical address area LRNG1 or logical address within logical address area LRNG2 using the address map range (ADMAP) stored in the random access memory RAM, and checks write method selection information WRTFLG of each of the logical address areas LRNG1 and LRNG2 (step 72).

If logical address value (LAD) included in write request (WQ01) is logical address LAD within logical address area LRNG1, since the write method selection information WRTFLG of logical address area LRNG1 is set to 0, the information processing circuit MNGER executes Step 76 to perform writing to the nonvolatile memory device. That is, redundant data (RArea0) corresponding to write data (DATA0) and write data (DATA0) is written to one memory cell selected by a memory cell selection line among plural chain memory arrays indicated by "●" in the first physical address area PRNG1 in FIG. 16 (Step 76).

On the other hand, if logical address value (LAD) included in write request (WQ01) is logical address LAD within logical address area LRNG2, since the write method selection information WRTFLG of logical address area LRNG2 is set to 1, the information processing circuit MNGER executes Step 73 to Step 76. That is, in Step 73, the information processing circuit MNGER counts "0" bit data and "1" bit data among 512-byte (512×8 bits) write data (DATA0) (Step 73), and compares the number of "0" bit data with the number of "1" bit data (Step 74). Then, if the number of "0" bit data is greater than the number of "1" bit data, the information processing circuit MNGER inverts respective bits of write data (DATA0) (Step 75), and executes Step 76 to write the inverted data to the nonvolatile memory device. That is, the information processing circuit MNGER performs writing to each memory cell in plural chain memory cells indicated by "◉" in the second physical address area PRNG2 in FIG. 16 (Step 76).

In this way, by inverting the respective bits of write data (DATA0), the number of "0" bit data is set to be constantly 2048 bits (=4096/2) or less, among 512 bytes (512×8 bits). Thus, the number of "1" bit data in the write data is set to be constantly the half or less, to thereby make it possible to halve the amount of write data. That is, as described above, when 512-byte (512×8 bits) data is written to the memory cells, the 512-byte (512×8 bits) memory cells enter the set state (erasing to "1" bit data), and then, necessary memory cells are subjected to rewriting to enter the reset state (writing to "0" bit data"). Here, in the plural chain memory arrays indicated by "◉" in the second physical address area PRNG2 in FIG. 16, since it is sufficient if "0" bit data is written to the half memory cells, it is possible to realize SSD with high speed and low power.

Further, in Step 72 in FIG. 26, if the write method selection information WRTFLG is set to 2 with respect to a logical address area where the temporally input logical address value (LAD) is included, the information processing circuit MNGER executes Step 77 to Step 79. That is, the information processing circuit MNGER reads data from the physical address of the nonvolatile memory device corresponding to the corresponding logical address value (LAD) once (Step 77), and compares the read data with the input write data (DATA0) for each bit (Step 78). Then, the information processing circuit MNGER performs writing to the nonvolatile memory device with respect to only bits with different data using the comparison result (Step 79).

In the write method, as an example of FIG. 13B, a case where the write method selection information WRTFLG of the logical address region LRNG1 is set to 0 and the write method selection information WRTFLG of the logical address area LRNG2 is set to 1 is described. Here, the embodiment is not limited thereto, and even when the write method selection information WRTFLG of the logical address region LRNG1 is set to 1, the same effect is obtained.

<<Wear Leveling Method [2]>>

Figure 27:
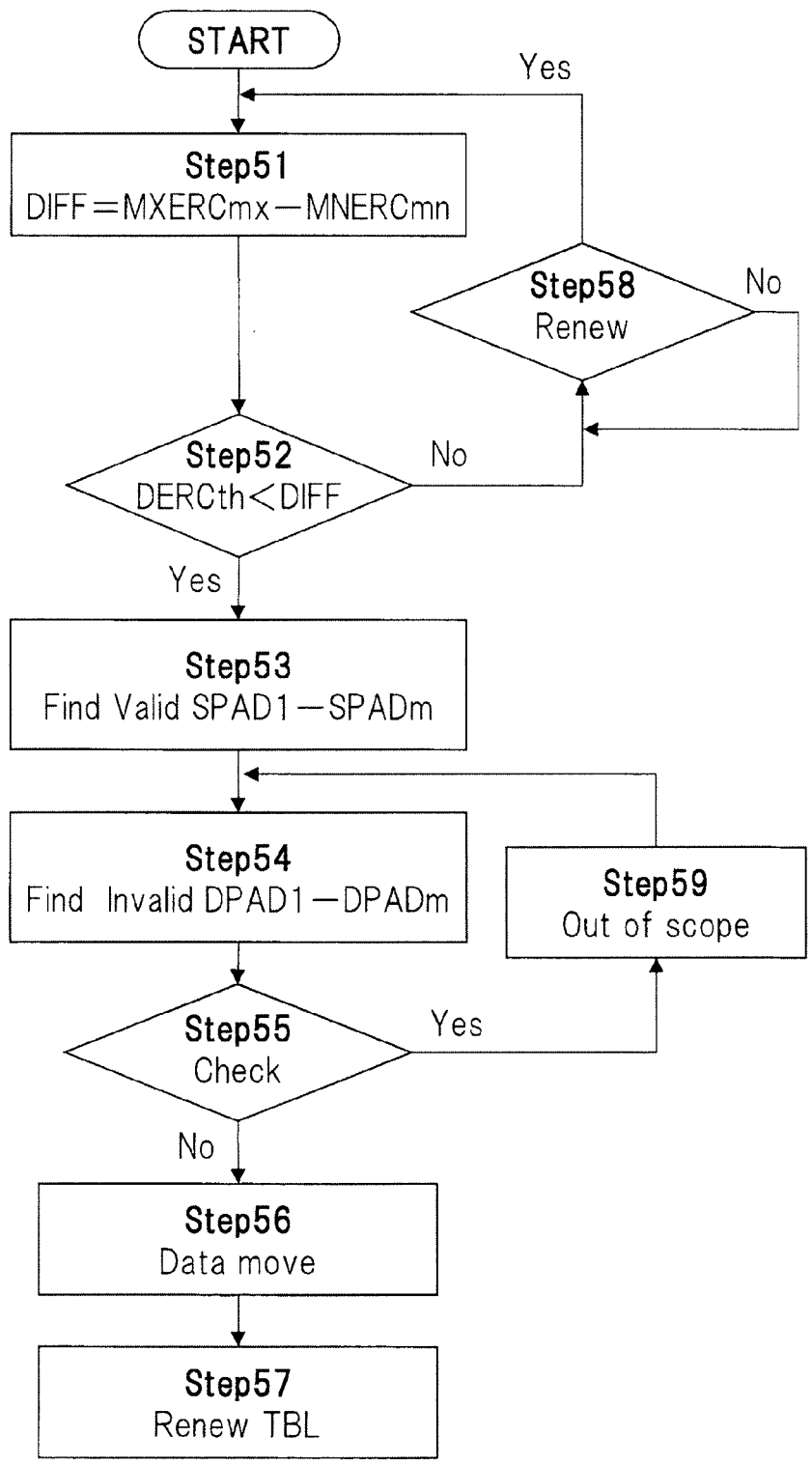
FIG. 27 is a flowchart illustrating an example of a wear leveling method executed by the information processing circuit in FIG. 2, in addition to the case of FIG. 21.

FIG. 27 is a flowchart illustrating an example of a wear leveling method executed by the information processing circuit MNGER in FIG. 2, in addition to the case of FIG. 21. As shown in FIG. 11, the information processing circuit MNGER manages N/2 entry number EMUM from 0 to (N/2−1) as the write physical address table NXPADTBL1, and manages the remaining N/2 entry number EMUM from (N/2) to N as the write physical address table NXPADTBL2, in the write physical address table NXPADTBL. As described in FIG. 21, the dynamic wear leveling performed by updating the write physical address table NXPADTBL using the physical segment table PSEGTBL1 in FIG. 10A is a leveling method of dynamic erase counts with respect to the invalid physical addresses.

However, since the dynamic wear leveling is performed with respect to the invalid physical addresses, a difference between the erase count of the invalid physical addresses and the erase count of the valid physical addresses may gradually increase. For example, when after writing is performed in a certain logical address (corresponding physical address), the physical address is in the valid state, and then, a write command is not performed with respect to the logical address (corresponding physical address) for a long time, the physical address is excluded from a long-time wear leveling target. Thus, the information processing circuit MNGER in FIG. 2 executes a static erase count leveling method (static wear leveling) of suppressing the variation of the erase count of the invalid physical addresses and the erase count of the valid physical addresses, as shown in FIG. 27.

The information processing circuit MNGER performs the static erase count wear leveling shown in FIG. 27, in the respective ranges of the first physical address area PRNG1 and the second physical address area PRNG2 in the address range map (ADMAP) in FIG. 15. First, the information processing circuit MNGER detects a maximum value MXER-Cmx in the maximum erase count MXERC in the physical segment table PSEGTBL1 (FIG. 10A) relating to the invalid physical addresses, and a minimum value MXERCmn in the minimum erase count MNERC in the physical segment table PSEGTBL2 (FIG. 10B) relating to the valid physical addresses. Then, the information processing circuit MNGER calculates a difference DIFF (=MXERCmx-MNERCmn) between the maximum value MXERCmx and the minimum value MXERCmn (Step 51).

In the next Step 52, the information processing circuit MNGER sets a threshold value DERCth of the difference between the erase count of the invalid physical addresses and the erase count of the valid physical addresses, and compares the threshold value DERCth with the erase count difference DIFF. If the erase count difference DIFF is greater than the threshold value DERCth, the information processing circuit MNGER executes Step 53 for leveling of the erase count, and if the erase count difference DIFF is smaller than the threshold value DERCth, the information processing circuit MNGER executes Step 58. In Step 58, the information processing circuit MNGER determines whether the physical segment table PSEGTBL1 or the physical segment table PSEGTBL2 is updated. If the physical segment table PSEGTBL1 or the physical segment table PSEGTBL2 is updated, the information processing circuit MNGER calculates the erase count difference DIFF again in Step 51, and if both of the physical segment tables are not updated, the information processing circuit MNGER executes Step 58 again.

In step 53, the information processing circuit MNGER sequentially selects m physical addresses SPAD1 to SPADm from the smallest erase count, from the minimum erase count MNERC in the physical segment table PSEGTBL2 relating to the valid physical addresses. In Step 54, the information processing circuit MNGER sequentially selects m physical addresses DPAD1 to DPADm from the largest erase count, from the maximum erase count MXERC in the physical segment table PSEGTBL1 relating to the invalid physical addresses.

In Step 55, the information processing circuit MNGER inspects whether candidate physical addresses DPAD1 to DPADm are registered in the write physical address table NXPADTBL. If any one of the candidate physical addresses DPAD1 to DPADm is registered in the write physical address table NXPADTBL, in Step 59, the information processing circuit MNGER excludes the any one of the physical addresses DPAD1 to DPADm from the candidates, and performs supplement of the candidate in Step 54 again. If the selected physical addresses DPAD1 to DPADm are not registered in the write physical address table NXPADTBL, the information processing circuit MNGER executes Step 56.

In Step 56, the information processing circuit MNGER moves data of the physical addresses SPAD1 to SPADm in the nonvolatile memory device to the physical addresses DPAD1 to DPADm. In step 57, the information processing circuit MNGER moves the data of the physical addresses SPAD1 to SPADm to the physical addresses DPAD1 to DPADm, to thereby update all the tables to be updated.

By using the above-described static wear leveling together with the dynamic wear leveling shown in FIG. 21, the leveling of the erase count can be performed in the entire nonvolatile memory devices NVM10 to NVM17. In this example, an example in which the data of m physical addresses is moved is shown, but the value of m may be programmable by the information processing circuit MNGER according to desired performance. When the registration number of the write physical address table NXPADTBL is N, for example, the value of m may be set to $1 \leq m \leq N$.

<<Pipeline Writing Operation>>

Figure 28:
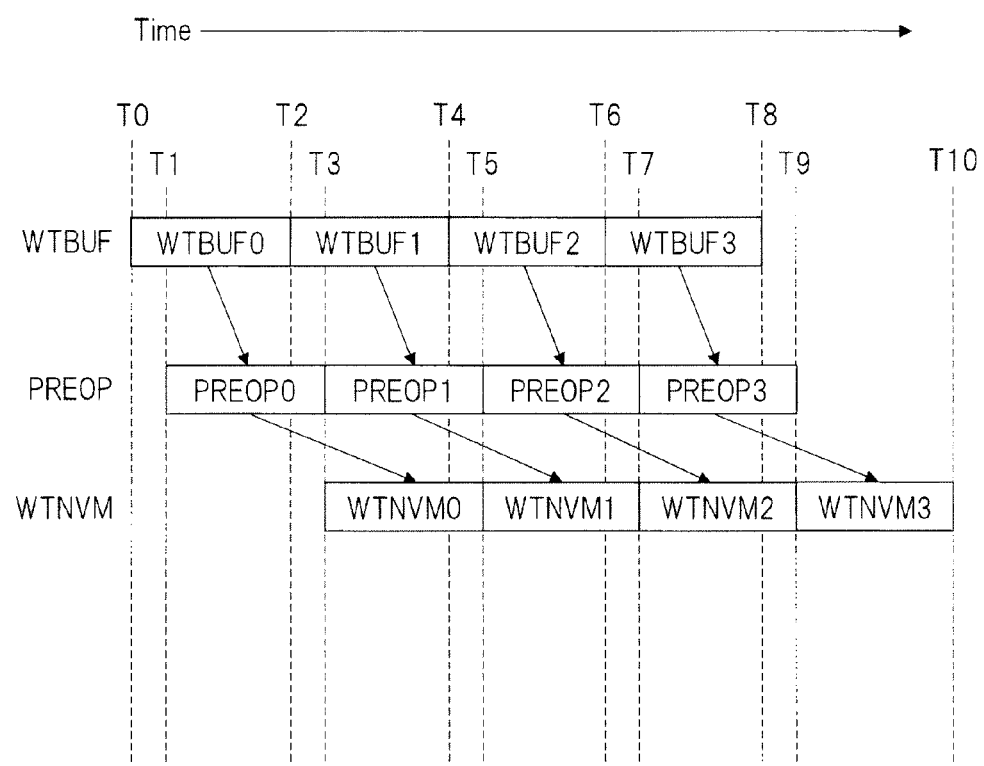
FIG. 28 is a diagram illustrating an example of a data writing operation that is executed in a memory module in a pipeline form, when a write request is continuously generated from the information processor in FIG. 1 to the memory module.

FIG. 28 is a diagram illustrating an example of a data writing operation that is executed in the memory module NVMMD0 in a pipeline form, when a write request is continuously generated from the information processor CPU_CP in FIG. 1 to the memory module NVMMD0. Although not particularly limited, write data of N×512 bytes can be respectively stored in the buffers BUF0 to BUF3 in the control circuit MDLCT0 in FIG. 2.

In buffer transfer operations WTBUF0, WTBUF1, WTBUF2, and WTBUF3 shown in FIG. 28, write request WQ is respectively transferred to the buffers BUF0, BUF1, BUF2, and BUF3. In preparation operations PREOP0, PREOP1, PREOP2, and PREOP3, a preparation operation for writing the write data transferred to the buffers BUF0, BUF1, BUF2, and BUF3 to the nonvolatile memory device NVM is performed. In data write operations WTNVM0, WTNVM1, WTNVM2, and WTNVM3, the write data stored in the buffer BUF0, BUF1, BUF2, and BUF3 is respectively written to the nonvolatile memory device NVM.

The buffer transfer operations WTBUF0, WTBUF1, WTBUF2, and WTBUF3, the preparation operations PREOP0, PREOP1, PREOP2, and PREOP3, and the data write operations WTNVM0, WTNVM1, WTNVM2, and WTNVM3 are executed by a pipelining operation by the control circuit MDLCT0, as shown in FIG. 28. Thus, the writing speed can be enhanced. Specifically, the following pipelining operation is performed.

N write requests (WQ [1] to Wq [N]) generated during the period from time T0 to T2 is first transferred to the buffer BUF0, in the interface circuit HOST_IF (WTBUF0). If the write data cannot be stored in the buffer BUF0, N write requests (WQ [N+1] to WQ [2N]) generated during the period from time T2 to T4 are transferred to the buffer BUF1 (WT-BUF1). If the write data cannot be stored in the buffer BUF1, N write requests (WQ [2N+1] to WQ [3N]) generated during the period from time T4 to T6 are transferred to the buffer BUF2 (WTBUF2). If the write data cannot be stored in the buffer BUF2, N write requests (WQ [3N+1] to WQ [4N]) generated during the period from time T6 to T8 are transferred to the buffer BUF3 (WTBUF3).

The information processing circuit MNGER performs the preposition operation (PREOP0) for writing the write data stored in the buffer BUF0 to the nonvolatile memory device NVM during the period from time T1 to T3. Main operation content of the preparation operation PREOP0 performed by the information processing circuit MNGER will be described hereinafter. The other preparation operations PREOP1, PREOP2, and PREOP3 are the same as the preparation operation PREOP0.

(1) The physical address PAD is read from the address conversion table LPTBL using the value of the logical address LAD included in the write requests (WQ [1] to WQ [N]), and the values of valid flags (CPVLD, PVLD, and DVF) of the physical address PAD are set to 0 as necessary to negate the data.

(2) The address conversion table LPTBL is updated.

(3) The write physical address NXPAD stored in the write physical address table NXPADTBL is read, and the logical address LAD included in the write request (WQ [1] to WQ [N]) is allocated to the write physical address NXPAD.

(4) The physical segment table PSEGTBL is updated.

(5) The physical address table PADTBL is updated.

(6) The write physical address table NXPADTBL is updated for the next writing.

Then, the information processing circuit MNGER writes the write data stored in the buffer BUF0 to the nonvolatile memory device NVM during the period from time T3 to T5 (WTNVM0). Here, the physical address of the nonvolatile memory device NVM to which the data is written is the same as the value of the write physical address NXPAD in (3). The other data write operations WTNVM1, WTNVM2, and WTNVM3 are the same as the data write operation WTNVM0.

<<Conclusion>>

According to the above-description, the representative configurations obtained by the present embodiments are summarized as follows.

(1) A semiconductor device according to an embodiment includes a nonvolatile memory unit that includes a plurality of memory cells, and a control circuit that controls access to the nonvolatile memory unit. The nonvolatile memory unit includes a plurality of memory cell groups disposed at intersections of a plurality of first signal lines and a plurality of second signal lines that intersect the plurality of first signal lines. Each of the plurality of memory cell groups includes first to N-th memory cells. The first to N-th memory cells are connected to third signal lines of first to N-th memory cells. Here, the control circuit writes data to M memory cells (M<N) among the first to N-th memory cells when performing one data writing operation.

(2) In the configuration of (1), the control circuit reads data from M (M<N) memory cells among the first to N-th memory cells when performing one data reading operation.

(3) In the configuration of (1), the control circuit is able to program a value of M.

(4) In the configuration of (1), the first to N-th memory cells are connected in series.

(5) In the configuration of (4), each of the first to N-th memory cells includes a selection transistor and a resistance storage element, and the selection transistor and the resistance storage element are connected in parallel.

(6) In the configuration of (1), the control circuit retains a memory cell selection number having any number from 1 to N for each first address of the nonvolatile memory unit, and during data writing, selects a memory cell designated by the memory cell selection number among the first to N-th memory cells to write data to the selected memory cell.

(7) In the configuration of (1), the control circuit retains a memory cell selection number having any number from 1 to N for each first address of the nonvolatile memory unit, and during data reading, selects a memory cell designated by the memory cell selection number among the first to N-th memory cells to read data from the selected memory cell.

(8) In the configuration of (6), the memory cell selection number retained by the first address of the nonvolatile memory unit is sequentially changed from 1 to N by the control circuit whenever the same first address is allocated corresponding to a second address given from the outside of the control circuit.

(9) Further, a semiconductor device according to an embodiment includes a nonvolatile memory unit that includes a plurality of memory cells, and a control circuit that controls access to the nonvolatile memory unit. The nonvolatile memory unit includes a plurality of memory cell groups disposed at intersections of a plurality of word lines and a plurality of bit lines intersecting the word lines. Each of the plurality of memory cell groups includes first to N-th memory cells that are connected in series. Each of the first to N-th memory cells includes a selection transistor and a resistance storage element. The selection transistor and the resistance storage element are connected in parallel. Gate electrodes of the selection transistors in the first to N-th memory cells are connected to first to N-th gate lines. Here, the control circuit writes data to all the first to N-th memory cells in one data writing operation.

(10) In the configuration of (9), the control circuit reads data from all the first to N-th memory cells in one data reading operation.

(11) In the configuration of (1) or (9), the control circuit reads data of a memory cell in which data is written among the first to N-th memory cells, and verifies whether the data is correctly written.

(12) Further, a semiconductor device according to an embodiment includes a nonvolatile memory unit that includes a plurality of memory cells, and a control circuit that controls access to the nonvolatile memory unit. The nonvolatile memory unit includes a plurality of memory cell groups disposed at intersections of a plurality of word lines and a plurality of bit lines intersecting the word lines. Each of the plurality of memory cell groups includes first to N-th memory cells that are connected in series. Each of the first to N-th memory cells includes a selection transistor and a resistance storage element. The selection transistor and the resistance storage element are connected in parallel. Gate electrodes of the selection transistors in the first to N-th memory cells are connected to first to N-th gate lines. Here, the control circuit can set a first address area and a second address area with respect to the nonvolatile memory unit. The first address area is an area where data can be written to M (M<N) memory cells among the first to N-th memory cells in one data writing operation, and the second address area is an area where data can be written to all the first to N-th memory cells in one data writing operation.

(13) In the configuration of (12), the control circuit is able to program the sizes of the first address area and the second address area.

(14) In the configuration of (1), the control circuit writes "1" data to all the first to N-th memory cells in one data writing operation, and then, writes only "0" data to M (M<N) memory cells among the first to N-th memory cells.

(15) In the configuration of (12), the "1" data sets the resistance storage element to a low resistance, and the "0" data sets the resistance storage element to a high resistance.

(16) In the configuration of (1), the resistance storage element is formed of a chalcogenide material.

(17) A semiconductor device according to an embodiment includes a nonvolatile memory unit that includes a plurality of memory cells, and a control circuit that controls access to the nonvolatile memory unit. Here, the control circuit includes a storage area that stores first area information corresponding to a first address of the nonvolatile memory unit, and first configuration information that includes memory capacity information for the first area information, write memory cell number information, test mode information, minimum erase data size information, minimum write data size information, test area information, error detection correction data size information, and write method selection information.

(18) In the configuration of (17), the first configuration information is programmable.

(19) In the configuration of (17), the control circuit determines an address map for associating the first address of the nonvolatile memory unit with a third address given from the outside of the control circuit, using part of the first configuration information.

(20) In the configuration of (17), the control circuit determines the address map immediately after power is supplied.

(21) In the configuration of (17), the control circuit includes a storage area that stores second area information corresponding to a second address of the nonvolatile memory unit, and second configuration information that includes memory capacity information for the second area information, write memory cell number information, test mode information, minimum erase data size information, minimum write data size information, test area information, error detection correction data size information, and write method selection information.

(22) In the configuration of (21), the control circuit determines a write allowable area with respect to the plurality of memory cells of the nonvolatile memory device respectively corresponding to the first area information and the second area information using part of the first and second configuration information.

Further, main effects obtained by the above-described embodiment are as follows.

First, as described in FIG. 17 or the like, by providing the first area where data is written in j (j<n) memory cells among n memory cells that form the chain memory array of the phase change memory, and dividedly allocating the physical address of the nonvolatile memory device to one input logical address by n/j, it is possible to realize a memory module (semiconductor device) with high reliability and long service life.

Second, as described in FIG. 18 or the like, by providing the second area where data is written in all of n memory cells that form the chain memory array of the phase change memory, and allocating one physical address of the nonvolatile memory device to one input logical address, it is possible to realize a memory module (semiconductor device) with low cost and large capacity.

Third, as described in FIG. 19 or the like, by variably setting the number of memory cells where data is written among n memory cells on the chain memory array of the first area, it is possible to variably set the capacities of the first area and the second area, and thus, it is possible to flexibly satisfy desired specification of the information processing system that uses the nonvolatile memory device.

Fourth, as described in FIGS. 13A, 13B and 13C or the like, since the SSD configuration information (SDCFG) is programmable, it is possible to flexibly build an information processing system with high reliability and long service life according to the desired specification of the information processing system.

Fifth, as described in FIG. 26 or the like, by compressing data using the write method selection information or the like, it is possible to reduce the write data size, to thereby enhance the writing speed.

Sixth, as described in FIG. 28 or the like, by processing the storage of the write request to the buffer, the writing preparation, and the writing operation to the phase change memory in a pipeline form, it is possible to realize an information processing system with high performance.

As described above, the invention made by the inventors is described in detail based on the embodiments, but the invention is not limited to the embodiments, and may be variously modified in a range without departing from the spirit of the invention. For example, the embodiments are described in detail for ease of understanding, but all of the described configurations are not essential. Further, a part of the configurations of any embodiment may be replaced with a configuration of another embodiment, and a configuration of any embodiment may be added to the configurations of another embodiment. Furthermore, a part of the configurations of any embodiment may be combined with another configuration, may be removed, or may be replaced with another configuration.

For example, here, the phase change memory is mainly described as a representative example, but the same effects can be obtained by similarly applying a resistance change-type memory including a resistive RAM (ReRAM) or the like. Further, the various effects obtained by providing the above-described first area (first operation mode) and the second area (second operation mode) are not obtained only by the resistance change-type memory, but can also be obtained to some degree when a NAND-type flash memory or the like is used.

REFERENCE SIGNS LIST

ADCMDIF ADDRESS COMMAND INTERFACE CIRCUIT
ARB ARBITER CIRCUIT
ARY MEMORY ARRAY
BK MEMORY BANK
BL BIT LINE
BSW BIT LINE SELECTION CIRCUIT
BUF BUFFER
CADLT COLUMN ADDRESS LATCH
CH CHAIN CONTROL LINE
CHDEC CAHIN DECODER
CHLT CHAIN SELECTION ADDRESS LATCH
CL PHASE CHANGE MEMORY CELL
COLDEC COLUMN DECODER
CPAD PHYSICAL ADDRESS
CPU_CP INFORMATION PROCESSOR (PROCESSOR)
CPVLD VALID FLAG
CTLOG CONTROL CIRCUIT
CY CHAIN MEMORY ARRAY
D DIODE
DATCTL DATA CONTROL CIRCUIT
DBUF DATA BUFFER
DSW DATA SELECTION CIRCUIT
DT DATA LINE
ENUM ENTRY NUMBER
HDH_IF INTERFACE SIGNAL
HOST_IF INTERFACE CIRCUIT
IOBUF IO BUFFER
LAD LOGICAL ADDRESS
LRNG LOGICAL ADDRESS AREA
LPTBL ADDRESS CONVERSION TABLE
LY MEMORY CELL SELECTION LINE
LYC LAYER COUNT
LYM LAYER MODE NUMBER
LYN LAYER INFORMATION
MAPREG MAP REGISTER
MDLCT CONTROL CIRCUIT
MNERC MINIMUM ERASE COUNT
MNGER INFORMATION PROCESSING CIRCUIT
MNIPAD INVALID PHYSICAL OFFSET ADDRESS

MNVPAD VALID PHYSICAL OFFSET ADDRESS
MXERC MAXIMUM ERASE COUNT
MXIPAD INVALID PHYSICAL OFFSET ADDRESS
MXVPAD VALID PHYSICAL OFFSET ADDRESS
NVCT MEMORY CORTROL CIRCUIT
NVM NONVOLATILE MEMORY DEVICE
NVMMD MEMORY MODULE
NVREG ERASE SIZE DESIGNATION REGISTER
NXLYC LAYER COUNT
NXLYM LAYER MODE NUMBER
NXPAD WRITE PHYSICAL ADDRESS
NXPADTBL WRITE PHYSICAL ADDRESS TABLE
NXPERC ERASE COUNT
NXPTBL WRITE PHYSICAL ADDRESS TABLE
NXPVLD VALID FLAG
PSEGTBL PHYSICAL SEGMENT TABLE
PAD PHYSICAL ADDRESS
PADTBL PHYSICAL ADDRESS TABLE
PERC ERASE COUNT
PPAD PHYSICAL OFFSET ADDRESS
PRNG PHYSICAL ADDRESS AREA
R STORAGE ELEMENT
RADLT ROW ADDRESS LATCH
RAM RANDOM ACCESS MEMORY
RAMC MEMORY CONTROL CIRCUIT
REF_CLK REFERENCE CLOCK SIGNAL
REG REGISTER
ROWDEC ROW DECODER
RSTSIG RESET SIGNAL
SA SENSE AMPLIFIER
SGAD PHYSICAL SEGMENT ADDRESS
SL CHAIN MEMORY ARRAY SELECTION LINE
STREG STATUS REGISTER
SWB READ CONTROL BLOCK
SYMD CLOCK GENERATION CIRCUIT
Tch CAHIN SELECTION TRANSISTOR
Tcl MEMORY CELL SELECTION TRANSISTOR
THMO TEMPERATURE SENSOR
TNIPA INVALID PHYSICAL ADDRESS TOTAL NUMBER
TNVPA VALID PHYSICAL ADDRESS TOTAL NUMBER
WDR WRITE DRIVER
WL WORD LINE
WV WRITE DATA VERIFICATION CIRCUIT

The invention claimed is:

1. A semiconductor device comprising:
a nonvolatile memory unit that includes a plurality of memory cells; and
a control circuit that allocates a physical address to a logical address input from outside to perform access to the physical address of the nonvolatile memory unit,
wherein the nonvolatile memory unit includes
a plurality of first signal lines,
a plurality of second signal lines that intersect the plurality of first signal lines, and
a plurality of memory cell groups disposed at intersections of the plurality of first signal lines and the plurality of the second signal lines,
each of the plurality of memory cell groups includes
first to N-th (N is an integer of 2 or greater) memory cells, and
first to N-th memory cell selection lines that respectively select the first to N-th memory cells, and
the control circuit writes data to a first portion that includes M (M<N) memory cells among the first to N-th memory cells according to a first write command to a first physical address, and writes data to a second portion that includes M memory cells excluding the first portion among the first to N-th memory cells according to a second write command to the first physical address generated after the first write command.

2. The semiconductor device according to claim 1,
wherein the control circuit includes a first operation mode and a second operation mode, performs, in the first operation mode, data writing to the first portion according to the first write command and data writing to the second portion according to the second write command and performs, in the second operation mode, data writing to N memory cells among the first to N-th memory cells according to a third write command to a second physical address and data writing to N memory cells among the first to N-th memory cells according to a fourth write command to the second physical address generated after the third write command.

3. The semiconductor device according to claim 1,
wherein the control circuit includes a first storage unit that retains a certain memory cell selection line among the first to N-th memory cell selection lines for each physical address.

4. The semiconductor device according to claim 1,
wherein the first to N-th memory cells are sequentially stacked and mounted in a vertical direction of a semiconductor substrate and are sequentially connected in series.

5. The semiconductor device according to claim 4,
wherein the control circuit collectively writes a first logical level with respect to N memory cells among the first to N-th memory cells according to the first write command and then writes a second logical level different from the first logical level in a necessary location in the first portion, and writes the second logical level in a necessary location in the second portion according to the second write command.

6. The semiconductor device according to claim 4,
wherein each of the first to N-th memory cells includes a selection transistor and a resistance storage element, and the selection transistor and the resistance storage element are connected in parallel.

7. The semiconductor device according to claim 1,
wherein the value of M is arbitrarily set.

8. A semiconductor device comprising:
a nonvolatile memory unit that includes a plurality of memory cells; and
a control circuit that allocates a physical address to a logical address input from outside to perform access to the physical address of the nonvolatile memory unit,
wherein the nonvolatile memory unit includes
a plurality of word lines,
a plurality of bit lines that intersect the plurality of word lines, and
a plurality of memory cell groups disposed at intersections of the plurality of word lines and the plurality of bit lines,
each of the plurality of memory cell groups includes
first to N-th memory cells that are connected in series, and
first to N-th memory cell selection lines that respectively select the first to N-th memory cells,
each of the first to N-th memory cells includes a selection transistor and a resistance storage element,
the selection transistor and the resistance storage element are connected in parallel,
gate electrodes of the selection transistors in the first to N-th memory cells are respectively connected to the first to N-th memory cell selection lines, the control circuit is able to set a first address area and a second address area with respect to the nonvolatile memory unit, in the first address area, the control circuit writes data to a first portion that includes M (M<N) memory cells among the first to N-th memory cells according to a first write command to a first physical address, and writes data to a second portion that includes M memory cells excluding the first portion among the first to N-th memory cells according to a second write command to the first physical address generated after the first write command, and in the second address area, the control circuit writes data to N memory cells among the first to N-th memory cells according to a third write command to a second physical address, and writes data to N memory cells among the first to N-th memory cells according to a fourth write command to the second physical address generated after the third write command.

9. The semiconductor device according to claim 8, wherein the control circuit collectively writes a first logical level with respect to N memory cells among the first to N-th memory cells according to the first write command and then writes a second logical level different from the first logical level in a necessary location in the first portion, and writes the second logical level in a necessary location in the second portion according to the second write command, and the control circuit collectively writes the first logical level with respect to N memory cells among the first to N-th memory cells according to the third write command and then writes the second logical level in a necessary location in the N memory cells, and collectively writes the first logical level with respect to N memory cells among the first to N-th memory cells according to the fourth write command and then writes the second logical level in a necessary location in the N memory cells.

10. The semiconductor device according to claim 9, wherein the resistance storage element is formed of a chalcogenide material, the first logical level corresponds to a low resistance state, and the second logical level corresponds to a high resistance state.

11. The semiconductor device according to claim 8, wherein the sizes of the first address area and the second address area is arbitrarily set, respectively.

12. A semiconductor device comprising:

a nonvolatile memory unit that includes N-bit memory cells (N is an integer of 2 or greater) that are connected in series; and a control circuit that controls the nonvolatile memory unit, wherein each of the memory cells stores one of a first logical level and a second logical level according to a resistance value of a resistance storage element, and the control circuit performs a control of performing writing with respect to all of the N-bit memory cells at the first logical level, and then, performing writing with respect to only a J-th memory cell among the N-bit memory cells at the second logical level.

13. The semiconductor device according to claim 12, wherein the control circuit includes a first storage unit that retains a value of the J-th memory cell, and performs a control of allocating one physical address and 1 bit data to the N-bit memory cells, renewing the first storage unit while circulating the value of the J-th memory cell in a range of 1 to N whenever a write command with respect to the physical address is input, and performing writing with respect to all of the N-bit memory cells at the first logical level whenever the value of the J-th memory cell is circulated in the range of 1 to N.

14. The semiconductor device according to claim 13, wherein the resistance storage element is formed of a chalcogenide material, the first logical level corresponds to a low resistance state, and the second logical level corresponds to a high resistance state.

15. The semiconductor device according to claim 14, wherein the memory cell includes the resistance storage element and a selection transistor that is connected in parallel to the resistance storage element, and the N-bit memory cells are sequentially stacked and mounted in a vertical direction of a semiconductor substrate.

* * * * *